(12) United States Patent
Liu et al.

(10) Patent No.: US 11,908,410 B2
(45) Date of Patent: Feb. 20, 2024

(54) DISPLAY SUBSTRATE AND PREPARATION METHOD THEREOF, DISPLAY PANEL, AND DISPLAY DEVICE

(71) Applicant: BOE TECHNOLOGY GROUP CO., LTD., Beijing (CN)

(72) Inventors: Libin Liu, Beijing (CN); Mei Li, Beijing (CN); Hongli Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/295,284

(22) Filed: Apr. 4, 2023

(65) Prior Publication Data

US 2023/0237963 A1 Jul. 27, 2023

Related U.S. Application Data

(63) Continuation of application No. 16/958,480, filed as application No. PCT/CN2019/098707 on Jul. 31, 2019, now Pat. No. 11,735,108.

(51) Int. Cl.
*G09G 3/3233* (2016.01)
*H10K 59/131* (2023.01)
(Continued)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ............... G09G 3/2003; G09G 3/3233; G09G 2300/0426; H10K 59/131; H10K 59/1213
See application file for complete search history.

(56) References Cited

U.S. PATENT DOCUMENTS

| 4,491,863 A | 1/1985 | Kurahashi |
| 4,652,912 A | 3/1987 | Masubuchi |

(Continued)

FOREIGN PATENT DOCUMENTS

| AU | 2018408152 A1 | 10/2019 |
| CN | 101192382 A | 6/2008 |

(Continued)

OTHER PUBLICATIONS

Korean Office Action in Korean Application No. 2021-7030323 dated Jan. 25, 2022 with English translation.
(Continued)

*Primary Examiner* — Kevin M Nguyen
(74) *Attorney, Agent, or Firm* — Collard & Roe, P.C.

(57) ABSTRACT

A display substrate, a preparation method thereof, a display panel, and a display device are provided. The display substrate includes a base substrate and a repeating unit, the repeating unit includes a plurality of sub-pixels including a first sub-pixel and a second sub-pixel, a color of light emitted by a light-emitting element of the first sub-pixel is identical to a color of light emitted by a light-emitting element of the second sub-pixel, a shape of a first light-emitting voltage application electrode of the light-emitting element of the first sub-pixel is different from a shape of a first light-emitting voltage application electrode of the light-emitting element of the second sub-pixel.

20 Claims, 16 Drawing Sheets

(51) Int. Cl.
 *H01L 27/12* (2006.01)
 *H10K 59/121* (2023.01)
(52) U.S. Cl.
 CPC .............. *G09G 2300/0443* (2013.01); *G09G 2300/0452* (2013.01); *G09G 2300/0819* (2013.01); *G09G 2300/0852* (2013.01); *G09G 2320/0233* (2013.01); *H01L 27/124* (2013.01); *H10K 59/1213* (2023.02)

(56) References Cited

U.S. PATENT DOCUMENTS

| | | | |
|---|---|---|---|
| 5,113,274 | A | 5/1992 | Takahashi et al. |
| 5,341,153 | A | 8/1994 | Benzschawel et al. |
| 6,681,053 | B1 | 1/2004 | Zhu |
| 6,768,482 | B2 | 7/2004 | Asano et al. |
| 6,950,115 | B2 | 9/2005 | Elliot |
| 7,123,277 | B2 | 10/2006 | Brown Elliott et al. |
| 7,525,526 | B2 | 4/2009 | Brown Elliott et al. |
| 7,663,299 | B2 | 2/2010 | Chao et al. |
| 7,733,359 | B1 | 6/2010 | Hagge et al. |
| 8,159,508 | B2 | 4/2012 | Lee |
| 8,330,352 | B2 | 12/2012 | Sung et al. |
| 8,363,072 | B2 | 1/2013 | Hong et al. |
| 8,446,435 | B2 | 5/2013 | Tomizawa et al. |
| 8,754,913 | B2 | 6/2014 | Hwang et al. |
| 8,994,015 | B2 | 3/2015 | Pyon et al. |
| 9,337,241 | B2 | 5/2016 | Lee et al. |
| 9,343,511 | B1 | 5/2016 | Feng |
| 9,424,771 | B2 | 8/2016 | Gong |
| 9,542,875 | B2 | 1/2017 | Yang et al. |
| 9,570,706 | B2 | 2/2017 | Yim et al. |
| 9,589,492 | B2 | 3/2017 | Feng |
| 9,647,039 | B1 | 5/2017 | Wang et al. |
| 9,691,317 | B2 | 6/2017 | Li |
| 9,704,926 | B2 | 7/2017 | Kim |
| 9,734,753 | B2 | 8/2017 | Li et al. |
| 9,818,803 | B2 | 11/2017 | Lee |
| 9,871,085 | B2 | 1/2018 | Cho et al. |
| 9,905,604 | B2 | 2/2018 | Murata |
| 9,941,334 | B2 | 4/2018 | Hsu et al. |
| 9,946,123 | B2 | 4/2018 | Huangfu et al. |
| 9,972,256 | B2 | 5/2018 | Kang et al. |
| 9,984,624 | B2 | 5/2018 | Takahashi et al. |
| 9,995,952 | B2 | 6/2018 | Chen |
| 10,141,380 | B2 | 11/2018 | Chung et al. |
| 10,147,351 | B2 | 12/2018 | Yang et al. |
| 10,181,499 | B2 | 1/2019 | Jo et al. |
| 10,210,787 | B2 | 2/2019 | Jin |
| 10,224,380 | B2 | 3/2019 | Hsu et al. |
| 10,274,654 | B2 | 4/2019 | Jin et al. |
| 10,283,086 | B1 | 5/2019 | Su et al. |
| 10,373,541 | B2 | 8/2019 | Lee et al. |
| 10,504,419 | B2 | 12/2019 | Xi et al. |
| 10,504,483 | B2 | 12/2019 | Chen et al. |
| 10,565,918 | B2 | 2/2020 | Wu et al. |
| 10,579,173 | B2 | 3/2020 | Xu et al. |
| 10,629,656 | B2 | 4/2020 | Jo et al. |
| 10,672,318 | B2 | 6/2020 | Lee et al. |
| 10,699,642 | B2 | 6/2020 | Ma et al. |
| 10,784,445 | B2 | 9/2020 | Wang et al. |
| 10,811,489 | B2 | 10/2020 | Hong et al. |
| 10,840,307 | B2 | 11/2020 | Gu et al. |
| 10,854,684 | B2 | 12/2020 | Huangfu et al. |
| 10,861,905 | B2 | 12/2020 | Wang |
| 10,867,545 | B2 | 12/2020 | Kirisken |
| 10,902,789 | B2 | 1/2021 | Park |
| 10,903,281 | B2 | 1/2021 | Chung et al. |
| 10,909,901 | B2 | 2/2021 | Wu et al. |
| 10,909,904 | B2 | 2/2021 | Kim |
| 10,923,077 | B2 | 2/2021 | Matsueda |
| 10,943,955 | B2 | 3/2021 | Wang et al. |
| 10,953,191 | B2 | 3/2021 | Mok et al. |
| 10,971,555 | B2 | 4/2021 | Liu et al. |
| 10,991,768 | B2 | 4/2021 | Li et al. |
| 11,004,905 | B2 | 5/2021 | Sun et al. |
| 11,043,539 | B2 | 6/2021 | Jo et al. |
| 11,062,637 | B2 | 7/2021 | Jeong et al. |
| 11,069,286 | B2 | 7/2021 | Tan et al. |
| 11,232,750 | B2 | 1/2022 | Wang et al. |
| 11,233,096 | B2 | 1/2022 | Huangfu et al. |
| 11,238,816 | B2 | 2/2022 | Huangfu et al. |
| 11,264,430 | B2 | 3/2022 | Huangfu et al. |
| 11,462,591 | B2 | 10/2022 | Liu et al. |
| 2005/0018110 | A1 | 1/2005 | Liu |
| 2005/0041188 | A1 | 2/2005 | Yamazaki |
| 2007/0205423 | A1 | 9/2007 | Yamazaki et al. |
| 2007/0290973 | A1 | 12/2007 | Wei |
| 2008/0001525 | A1 | 1/2008 | Chao et al. |
| 2008/0224968 | A1 | 9/2008 | Kashiwabara |
| 2009/0051638 | A1 | 2/2009 | Horiuchi et al. |
| 2009/0079351 | A1 | 3/2009 | Choi et al. |
| 2009/0121983 | A1 | 5/2009 | Sung et al. |
| 2009/0128900 | A1 | 5/2009 | Grasnick |
| 2009/0302331 | A1 | 12/2009 | Smith et al. |
| 2010/0289732 | A1 | 11/2010 | Ina et al. |
| 2011/0025723 | A1 | 2/2011 | Kim |
| 2011/0128262 | A1 | 6/2011 | Chaji et al. |
| 2011/0234550 | A1 | 9/2011 | Hong et al. |
| 2011/0260951 | A1 | 10/2011 | Hwang et al. |
| 2011/0291549 | A1 | 12/2011 | Kim et al. |
| 2011/0291550 | A1 | 12/2011 | Kim et al. |
| 2012/0025182 | A1 | 2/2012 | Umeda et al. |
| 2012/0039034 | A1 | 2/2012 | Jepsen et al. |
| 2012/0092238 | A1 | 4/2012 | Hwang et al. |
| 2012/0313844 | A1 | 12/2012 | Im et al. |
| 2012/0320297 | A1 | 12/2012 | Itsumi et al. |
| 2013/0234917 | A1 | 9/2013 | Lee |
| 2014/0003045 | A1 | 1/2014 | Lee et al. |
| 2014/0071175 | A1 | 3/2014 | Yang et al. |
| 2014/0145586 | A1 | 5/2014 | Choi |
| 2014/0198479 | A1 | 7/2014 | Chao et al. |
| 2014/0220715 | A1 | 8/2014 | Kang |
| 2014/0226323 | A1 | 8/2014 | Huang et al. |
| 2014/0252321 | A1 | 9/2014 | Pyon et al. |
| 2014/0284570 | A1 | 9/2014 | Jinta et al. |
| 2014/0292622 | A1 | 10/2014 | Lee |
| 2014/0346537 | A1 | 11/2014 | Xi |
| 2015/0008820 | A1 | 1/2015 | Lee |
| 2015/0015465 | A1 | 1/2015 | Gong |
| 2015/0015466 | A1 | 1/2015 | Feng |
| 2015/0021637 | A1 | 1/2015 | Ahn et al. |
| 2015/0062140 | A1 | 3/2015 | Levantovsky et al. |
| 2015/0102320 | A1 | 4/2015 | Jung |
| 2015/0162391 | A1 | 6/2015 | Kim |
| 2015/0162394 | A1 | 6/2015 | Tokuda et al. |
| 2015/0200237 | A1 | 7/2015 | Yim et al. |
| 2015/0270317 | A1 | 9/2015 | Lee et al. |
| 2015/0310821 | A1 | 10/2015 | Kim et al. |
| 2015/0311264 | A1 | 10/2015 | Shen et al. |
| 2015/0311265 | A1 | 10/2015 | Matsueda et al. |
| 2015/0364525 | A1 | 12/2015 | Lin et al. |
| 2016/0013251 | A1 | 1/2016 | Yoshida et al. |
| 2016/0019825 | A1 | 1/2016 | Guo et al. |
| 2016/0027360 | A1 | 1/2016 | Li |
| 2016/0049438 | A1 | 2/2016 | Murata |
| 2016/0078807 | A1 | 3/2016 | Sun et al. |
| 2016/0104413 | A1 | 4/2016 | Matsueda et al. |
| 2016/0121073 | A1 | 5/2016 | Mok et al. |
| 2016/0126295 | A1 | 5/2016 | Sato |
| 2016/0126296 | A1 | 5/2016 | Feng |
| 2016/0126298 | A1 | 5/2016 | Chen |
| 2016/0133181 | A1 | 5/2016 | Nakamura |
| 2016/0155781 | A1 | 6/2016 | Chaji |
| 2016/0163247 | A1 | 6/2016 | Lee et al. |
| 2016/0171918 | A1 | 6/2016 | Kim et al. |
| 2016/0190523 | A1 | 6/2016 | Kim et al. |
| 2016/0196776 | A1 | 7/2016 | Yang et al. |
| 2016/0203748 | A1 | 7/2016 | Matsueda et al. |
| 2016/0240593 | A1 | 8/2016 | Gu et al. |
| 2016/0253943 | A1 | 9/2016 | Wang |
| 2016/0254476 | A1 | 9/2016 | Park |
| 2016/0293678 | A1 | 10/2016 | Wang |
| 2016/0321993 | A1 | 11/2016 | Choi et al. |

(56) References Cited

U.S. PATENT DOCUMENTS

| | | |
|---|---|---|
| 2016/0343284 A1 | 11/2016 | Sun |
| 2016/0351119 A1 | 12/2016 | Ono |
| 2016/0357076 A1 | 12/2016 | Huangfu et al. |
| 2016/0358536 A1 | 12/2016 | Li et al. |
| 2016/0358985 A1 | 12/2016 | Bai et al. |
| 2016/0370919 A1 | 12/2016 | Xu et al. |
| 2017/0039924 A1 | 2/2017 | Jin |
| 2017/0110087 A1 | 4/2017 | Chen et al. |
| 2017/0133440 A1 | 5/2017 | Wang et al. |
| 2017/0179389 A1 | 6/2017 | Cho et al. |
| 2017/0193880 A1 | 7/2017 | Lee et al. |
| 2017/0270843 A1 | 9/2017 | Lee et al. |
| 2017/0278905 A1 | 9/2017 | Hsu et al. |
| 2017/0294491 A1 | 10/2017 | Jo et al. |
| 2017/0317150 A1 | 11/2017 | Chung et al. |
| 2017/0352710 A1 | 12/2017 | Hong et al. |
| 2018/0012547 A1 | 1/2018 | Li et al. |
| 2018/0059458 A1 | 3/2018 | Chen |
| 2018/0088260 A1 | 3/2018 | Jin et al. |
| 2018/0090549 A1 | 3/2018 | Hamada et al. |
| 2018/0097043 A1 | 4/2018 | Song |
| 2018/0182828 A1 | 6/2018 | Kim |
| 2018/0247984 A1 | 8/2018 | Wang et al. |
| 2018/0292695 A1 | 10/2018 | You et al. |
| 2018/0308412 A1 | 10/2018 | Wu et al. |
| 2018/0308907 A1 | 10/2018 | Jin et al. |
| 2018/0355466 A1 | 12/2018 | Mu |
| 2019/0004648 A1 | 1/2019 | Xu et al. |
| 2019/0035859 A1 | 1/2019 | Kang et al. |
| 2019/0066564 A1 | 2/2019 | Tan |
| 2019/0073941 A1 | 3/2019 | Xi et al. |
| 2019/0081113 A1 | 3/2019 | Gu et al. |
| 2019/0088726 A1 | 3/2019 | Zhang |
| 2019/0096962 A1 | 3/2019 | Han et al. |
| 2019/0115399 A1 | 4/2019 | Jo et al. |
| 2019/0139513 A1 | 5/2019 | Su et al. |
| 2019/0140030 A1 | 5/2019 | Huangfu et al. |
| 2019/0206341 A1 | 7/2019 | Liao et al. |
| 2019/0237518 A1 | 8/2019 | Sun et al. |
| 2019/0296093 A1 | 9/2019 | Liu et al. |
| 2019/0326365 A1 | 11/2019 | Jin |
| 2019/0340970 A1 | 11/2019 | Kirisken |
| 2019/0385534 A1 | 12/2019 | Park |
| 2020/0013833 A1 | 1/2020 | Wang et al. |
| 2020/0035172 A1 | 1/2020 | Chen |
| 2020/0043990 A1 | 2/2020 | Huangfu et al. |
| 2020/0051485 A1 | 2/2020 | Liu et al. |
| 2020/0058713 A1 | 2/2020 | Zhang |
| 2020/0119107 A1 | 4/2020 | Liu et al. |
| 2020/0176524 A1 | 6/2020 | Jo et al. |
| 2020/0258441 A1 | 8/2020 | Zhang et al. |
| 2020/0312942 A1 | 10/2020 | Yang et al. |
| 2020/0328259 A1 | 10/2020 | Joe |
| 2020/0357325 A1 | 11/2020 | Zhao et al. |
| 2020/0357862 A1 | 11/2020 | Wang et al. |
| 2021/0027679 A1 | 1/2021 | Kwon et al. |
| 2021/0035484 A1 | 2/2021 | Matsueda et al. |
| 2021/0091145 A1 | 3/2021 | Huangfu et al. |
| 2021/0233969 A1 | 7/2021 | Sun et al. |
| 2021/0335297 A1 | 10/2021 | Huangfu et al. |
| 2022/0028348 A1 | 1/2022 | Huangfu et al. |

FOREIGN PATENT DOCUMENTS

| | | |
|---|---|---|
| CN | 101582241 A | 11/2009 |
| CN | 101339729 B | 6/2010 |
| CN | 102201430 A | 9/2011 |
| CN | 101582241 B | 10/2011 |
| CN | 103681754 A | 3/2014 |
| CN | 104037202 A | 9/2014 |
| CN | 104051493 A | 9/2014 |
| CN | 104269411 A | 1/2015 |
| CN | 104282727 A | 1/2015 |
| CN | 104332486 A | 2/2015 |
| CN | 104362170 A | 2/2015 |
| CN | 104597655 A | 5/2015 |
| CN | 104637987 A | 5/2015 |
| CN | 104701341 A | 6/2015 |
| CN | 104795431 A | 7/2015 |
| CN | 104882464 A | 9/2015 |
| CN | 105280139 A | 1/2016 |
| CN | 205231065 U | 5/2016 |
| CN | 205355055 U | 6/2016 |
| CN | 105741774 A | 7/2016 |
| CN | 205608350 U | 9/2016 |
| CN | 106094334 A | 11/2016 |
| CN | 205845956 U | 12/2016 |
| CN | 106293244 A | 1/2017 |
| CN | 106601167 A | 4/2017 |
| CN | 106782307 A | 5/2017 |
| CN | 206163494 U | 5/2017 |
| CN | 104597655 B | 6/2017 |
| CN | 106935618 A | 7/2017 |
| CN | 106935630 A | 7/2017 |
| CN | 106991957 A | 7/2017 |
| CN | 107248378 A | 10/2017 |
| CN | 107248393 B | 10/2017 |
| CN | 107256695 A | 10/2017 |
| CN | 107393468 A | 11/2017 |
| CN | 107481671 A | 12/2017 |
| CN | 107644888 A | 1/2018 |
| CN | 107665684 A | 2/2018 |
| CN | 107817632 A | 3/2018 |
| CN | 107910348 A | 4/2018 |
| CN | 108258013 A | 7/2018 |
| CN | 207781607 U | 8/2018 |
| CN | 207781608 U | 8/2018 |
| CN | 108493221 A | 9/2018 |
| CN | 207883217 U | 9/2018 |
| CN | 108649000 A | 10/2018 |
| CN | 109491158 A | 3/2019 |
| CN | 109559679 A | 4/2019 |
| CN | 109891487 A | 6/2019 |
| CN | 110010021 A | 7/2019 |
| EP | 2 423 911 A2 | 2/2012 |
| EP | 2 680 310 A1 | 1/2014 |
| EP | 2 270 216 A1 | 1/2018 |
| EP | 3 306 598 A1 | 4/2018 |
| IN | 107275359 A | 10/2017 |
| JP | 2002-221917 A | 8/2002 |
| JP | 2005062416 A | 3/2005 |
| JP | 2008-015521 A | 1/2008 |
| JP | 2008225179 A | 9/2008 |
| JP | 2009533810 A | 9/2009 |
| JP | 2010-212814 A | 9/2010 |
| JP | 2014225329 A | 12/2014 |
| JP | 2015138955 A | 7/2015 |
| JP | 2016-090991 A | 5/2016 |
| JP | 2016075868 A | 5/2016 |
| JP | 2016091918 A | 5/2016 |
| JP | 2016130780 A | 7/2016 |
| JP | 2016537688 A | 12/2016 |
| JP | 2018198198 A | 12/2018 |
| KR | 10-2009-0049515 A | 5/2009 |
| KR | 10-2011-0108050 A | 10/2011 |
| KR | 10-1347995 B1 | 1/2014 |
| KR | 10-2015-0006668 A | 1/2015 |
| KR | 10-2016-0051511 A | 5/2016 |
| KR | 10-2017-0116556 A | 10/2017 |
| RU | 2 453 879 C2 | 6/2012 |
| RU | 2 721 902 C1 | 5/2020 |
| WO | 2007/088656 A1 | 8/2007 |
| WO | 2012/166162 A1 | 12/2012 |
| WO | 2014/136149 A1 | 9/2014 |
| WO | 2016/192241 A1 | 12/2016 |
| WO | 2017/140038 A1 | 8/2017 |
| WO | 2018014562 A1 | 1/2018 |
| WO | 2019084932 A1 | 5/2019 |
| WO | 2019134514 A1 | 7/2019 |
| WO | 2019134522 A1 | 7/2019 |
| WO | 2019/153948 A1 | 8/2019 |
| WO | 2019153949 A1 | 8/2019 |

(56) References Cited

FOREIGN PATENT DOCUMENTS

| | | |
|---|---|---|
| WO | 2020/119132 A1 | 6/2020 |
| WO | 2020124693 A1 | 6/2020 |
| WO | 2020/133885 A1 | 7/2020 |

OTHER PUBLICATIONS

U.S. Office Action in U.S. Appl. No. 16/621,904 dated Mar. 15, 2022.
Extended European Search Report in European Patent Application No. 21152119.0 dated May 11, 2021.
Indian Office Action in Indian Application No. 202017026082 dated May 25, 2021 with English translation.
Notice of Allowance in U.S. Appl. No. 16/630,496 dated Mar. 26, 2021.
Notice of Allowance in U.S. Appl. No. 16/600,316 dated Apr. 14, 2021.
Park et al., Luminance Uniformity of Large-Area OLEDs With an Auxiliary Metal Electrode. Journal of Display Technology, pp. 306-311, vol. 5, No. 8, Aug. 2009, National Library of China, Downloaded on Jun. 2, 2021 from IEEE Xplore.
Australian Office Action in Australian application No. 2019279968 dated Dec. 11, 2020.
Korean Office Action in Korean application No. 10-2019-7027773 dated Dec. 25, 2020 with English translation.
Extended European Search Report in European Application No. 18905189.9 dated Oct. 19, 2021.
Extended European Search Report in European Application No. 18903035.6 dated Nov. 8, 2021.
Indian Office Action in Indian Application No. 202027048001 dated Dec. 6, 2021 with English translation.
U.S. Office Action in U.S. Appl. No. 16/622,045 dated Dec. 21, 2021.
Extended European Search Report in European Application No. 19933238.8 dated Oct. 18, 2022.
Extended European Search Report in European Application No. 19832268.7 dated Oct. 25, 2022.
Japanese Office Action in Japanese Application No. 2020-536078 dated Nov. 28, 2022.
Japanese Office Action in Japanese Application No. 2019-549456 dated Nov. 29, 2022.
Japanese Office Action in Japanese Application No. 2019-543028 dated Nov. 29, 2022.
Japanese Office Action in Japanese Application No. 2020535989 dated Jan. 4, 2023.
U.S. Office Action in U.S. Appl. No. 16/621,904 dated Feb. 10, 2023.
Japanese Office Action in Japanese Office Action 2019-569438 dated Mar. 27, 2023.
U.S. Notice of Allowance in U.S. Appl. No. 16/958,480 dated Jan. 9, 2023.
U.S. Corrected Notice of Allowability in U.S. Appl. No. 16/958,480 dated Jan. 9, 2023.
Australian Office Action in Australian Application No. 2021203983 dated May 12, 2022.
Extended European Search Report in European Application No. 19933239.8 dated Oct. 18, 2022.
International Search Report of PCT/CN2019/086875 in Chinese, dated Sep. 25, 2019, with English translation.
Notice of Transmittal of the International Search Report of PCT/CN2019/086875 in Chinese, dated Sep. 25, 2019.
Written Opinion of the International Searching Authority of PCT/CN2019/086875 in Chinese, dated Sep. 25, 2019.
International Search Report of PCT/CN2019/098705 in Chinese, dated May 6, 2020, with English translation.
Notice of Transmittal of the International Search Report of PCT/CN2019/098705 in Chinese, dated May 6, 2020.
Written Opinion of the International Searching Authority of PCT/CN2019/098705 in Chinese, dated May 6, 2020, with English translation.
International Search Report of PCT/CN2019/098707 in Chinese, dated May 9, 2020, with English translation.
Notice of Transmittal of the International Search Report of PCT/CN2019/098707 in Chinese, dated May 9, 2020.
Written Opinion of the International Searching Authority of PCT/CN2019/098707 in Chinese, dated May 9, 2020, with English translation.
International Search Report of PCT/CN2019/097765, dated Oct. 28, 2019.
Written Opinion of the International Searching Authority of PCT/CN2019/097765, dated Oct. 28, 2019.
U.S. Office Action in U.S. Appl. No. 16/621,904 dated Aug. 2, 2021.
Written Decision of Dismissal of Amendment in Korean Application No. 10-2019-7027773 dated Aug. 24, 2021 with English translation.
Extended European Search Report in European Patent Application No. 18905693.0 dated Oct. 1, 2021.
Indian Office Action in Indian Application No. 202017027785 dated Aug. 19, 2021 with English translation.
U.S. Office Action in U.S. Appl. No. 16/483,210 dated Sep. 22, 2021.
Extended European Search Report in European Application No. 19933217.2 dated Jul. 5, 2022.
Notice of Acceptance in Australian Patent Application No. 2021203983 dated Aug. 2, 2022.
U.S. Office Action in U.S. Appl. No. 16/626,559 dated Aug. 30, 2021.
U.S. Office Action in U.S. Appl. No. 17/497,630 dated May 12, 2022.
Chinese Office Action in Chinese Application No. 201680082630.5 dated Apr. 1, 2022.
U.S. Notice of Allowance in U.S. Appl. No. 16/755,970 dated May 6, 2022.
Candice H. Brown Elliot, "Reducing Pixel Count Without Reducing Image Quality", Information display, vol. 1999 (12): 22~25, 1999 (4 pages).
Lu Fang et al., "Subpixel Rendering: From Font Rendering to Image Subsampling", IEEE Signal Processing Magazine, vol. 2013 (5): 177~182 and 189, 2013 (7 pages).
Dean S. Messing, Scott Daly, "Improved Display Resolution of Subsampled Colour Images Using Subpixel Addressing", IEEE ICIP 2002: 1-625~628, 2002 (4 pages).
Huang et al., "RGB to RGBG conversion algorithm based on weighting factors and related FPGA realization", China Academic Journal Electronic Publishing House, vol. 32, No. 7, Jul. 2017, pp. 572-579 (8 pages).
International Search Report of PCT/CN2018/124890 in Chinese, dated Mar. 27, 2019, with English translation.
International Preliminary Report on Patentability of PCT/CN2018/124890, dated Aug. 11, 2020 and English Translation of the Written Opinion of the International Searching Authority of PCT/CN2018/124890, dated Mar. 27, 2019.
International Search Report of PCT/CN2018/124881 in Chinese, dated Mar. 26, 2019, with English translation.
International Preliminary Report on Patentability of PCT/CN2018/124881, dated Aug. 11, 2020 and English Translation of the Written Opinion of the International Searching Authority of PCT/CN2018/124881, dated Mar. 26, 2019.
International Search Report of PCT/CN2018/124884 in Chinese, dated Mar. 27, 2019, with English translation.
International Preliminary Report on Patentability of PCT/CN2018/124884, dated Aug. 11, 2020 and English Translation of the Written Opinion of the International Searching Authority of PCT/CN2018/124884, dated Mar. 27, 2019.
International Search Report of PCT/CN2018/124445 in Chinese, dated Mar. 21, 2019, with English translation.
International Preliminary Report on Patentability of PCT/CN2018/124445, dated Aug. 11, 2020 and English Translation of the Written Opinion of the International Searching Authority of PCT/CN2018/124445, dated Mar. 19, 2019.

(56) References Cited

OTHER PUBLICATIONS

International Search Report of PCT/CN2018/124404 in Chinese, dated Mar. 14, 2019, with English translation.
International Preliminary Report on Patentability of PCT/CN2018/124404, dated Aug. 11, 2020 and English Translation of the Written Opinion of the International Searching Authority of PCT/CN2018/124404, dated Mar. 14, 2019.
International Search Report of PCT/CN2016/081097 in Chinese, dated Nov. 16, 2016, with English translation.
International Preliminary Report on Patentability of PCT/CN2016/081097, dated Aug. 21, 2018 and English Translation of the Written Opinion of the International Searching Authority of PCT/CN2016/081097, dated Nov. 16, 2016.
First Office Action in U.S. Appl. No. 15/536,347 dated Aug. 28, 2018.
International Search Report of PCT/CN2017/075957 in Chinese, dated Jun. 8, 2017.
International Preliminary Report on Patentability of PCT/CN2017/075957, dated Jan. 22, 2019 and Written Opinion of the International Searching Authority of PCT/CN2017/075957, dated Jun. 8, 2017.
Indian Office Action in Indian Application No. 201717038562, dated Oct. 15, 2019.
First Office Action in U.S. Appl. No. 15/578,481 dated Feb. 1, 2019.
Non-Final Office Action in U.S. Appl. No. 15/578,481 dated Jul. 11, 2019.
English translation of Extended European Search Report in EP Application No. 17768339.8 dated Dec. 6, 2019.
Korean Office Action in Korean Application No. 10-2017-7022698, dated May 29, 2019 with English translation.
Korean Notice of Allowance in Korean Application No. 10-2017-7022698, dated Mar. 6, 2020.
Chinese Office Action in Chinese Application No. 201810135947.1, dated Mar. 3, 2020 with English translation.
Russian Notice of Allowance in Russian Application No. 2019130488, dated Mar. 18, 2020 with English Translation.
First Office Action in U.S. Appl. No. 16/492,930 dated Jul. 24, 2020.
Korean Office Action in Korean Application No. 10-2019-7024785, dated Jul. 30, 2020 with English translation.
Notice of Allowance in U.S. Appl. No. 16/234,777 dated Sep. 1, 2020.
First Office Action in U.S. Appl. No. 16/621,918 dated Sep. 29, 2020.
First Office Action in U.S. Appl. No. 16/600,316 dated Oct. 6, 2020.
Japanese Office Action in Japanese Application No. 2017-544608, dated Oct. 12, 2020 with English translation.

DISPLAY SUBSTRATE AND PREPARATION METHOD THEREOF, DISPLAY PANEL, AND DISPLAY DEVICE

CROSS-REFERENCE TO RELATED APPLICATION

This application is a Continuation application of U.S. patent application Ser. No. 16/958,480 filed on Jun. 26, 2020, which is the National Stage of International Application No. PCT/CN2019/098707, filed Jul. 31, 2019. All of the aforementioned patent applications are incorporated herein by reference as part of the present application for all purposes under the U.S. law.

TECHNICAL FIELD

Embodiments of the present disclosure relate to a display substrate, a preparation method thereof, a display panel, and a display device.

BACKGROUND

With the rapid development of active-matrix organic light-emitting diode (AMOLED) in a display field, the demand for display effect is getting higher and higher for people. Due to advantages of high display quality, an application range of high-resolution display devices is becoming wider and wider. In general, a resolution of a display device can be improved by reducing sizes of pixels and reducing a spacing between pixels.

SUMMARY

At least some embodiments of the present disclosure provide a display substrate, the display substrate includes a base substrate and a plurality of repeating units on the base substrate, each of the plurality of repeating units comprises a plurality of sub-pixels, and each of the plurality of sub-pixels comprises a light-emitting element and a pixel circuit for driving the light-emitting element to emit light; the pixel circuit comprises a drive circuit; the light-emitting element comprises a first light-emitting voltage application electrode, a second light-emitting voltage application electrode, and a light-emitting layer between the first light-emitting voltage application electrode and the second light-emitting voltage application electrode; the plurality of sub-pixels comprise a first sub-pixel and a second sub-pixel, a color of light emitted by the light-emitting element of the first sub-pixel is identical to a color of light emitted by the light-emitting element of the second sub-pixel, and a shape of the first light-emitting voltage application electrode of the light-emitting element of the first sub-pixel is different from a shape of the first light-emitting voltage application electrode of the light-emitting element of the second sub-pixel; an orthographic projection of the first light-emitting voltage application electrode of the light-emitting element of the first sub-pixel on the base substrate at least partially overlaps with an orthographic projection of a control terminal of the drive circuit of the pixel circuit of the first sub-pixel on the base substrate; and an orthographic projection of the first light-emitting voltage application electrode of the light-emitting element of the second sub-pixel on the base substrate at least partially overlaps with an orthographic projection of a control terminal of the drive circuit of the pixel circuit of the second sub-pixel on the base substrate.

For example, in the display substrate provided by some embodiments of the present disclosure, an area of the orthographic projection of the first light-emitting voltage application electrode of the light-emitting element of the first sub-pixel on the base substrate is different from an area of the orthographic projection of the first light-emitting voltage application electrode of the light-emitting element of the second sub-pixel on the base substrate.

For example, in the display substrate provided by some embodiments of the present disclosure, an area of an overlapping portion between the orthographic projection of the control terminal of the drive circuit of the pixel circuit of the first sub-pixel on the base substrate and the orthographic projection of the first light-emitting voltage application electrode of the light-emitting element of the first sub-pixel on the base substrate is a first area, and an area of an overlapping portion between the orthographic projection of the control terminal of the drive circuit of the pixel circuit of the second sub-pixel on the base substrate and the orthographic projection of the first light-emitting voltage application electrode of the light-emitting element of the second sub-pixel on the base substrate is a second area; and a ratio of the first area to the second area satisfies a following relation:

$$A\,\mathrm{min} \leq A1/A2 \leq A\,\mathrm{max},$$

where A1 represents the first area, A2 represents the second area, Amin represents a minimum ratio threshold and is 90%, and Amax represents a maximum ratio threshold and is 110%.

For example, in the display substrate provided by some embodiments of the present disclosure, the orthographic projection of the control terminal of the drive circuit of the pixel circuit of the first sub-pixel on the base substrate is within the orthographic projection of the first light-emitting voltage application electrode of the light-emitting element of the first sub-pixel on the base substrate; and the orthographic projection of the control terminal of the drive circuit of the pixel circuit of the second sub-pixel on the base substrate is within the orthographic projection of the first light-emitting voltage application electrode of the light-emitting element of the second sub-pixel on the base substrate.

For example, in the display substrate provided by some embodiments of the present disclosure, an orthographic projection of the light-emitting layer of the light-emitting element of the first sub-pixel on the base substrate is continuous with an orthographic projection of the light-emitting layer of the light-emitting element of the second sub-pixel on the base substrate.

For example, in the display substrate provided by some embodiments of the present disclosure, the pixel circuit further comprises a first light-emitting control circuit and a second light-emitting control circuit, the drive circuit comprises a control terminal, a first terminal, and a second terminal, and the drive circuit is configured to provide a drive current for driving the light-emitting element to emit light; the first light-emitting control circuit is connected to the first terminal of the drive circuit and a first voltage terminal, and the first light-emitting control circuit is configured to turn on or turn off a connection between the drive circuit and the first voltage terminal; and the second light-emitting control circuit is electrically connected to the second terminal of the drive circuit and the first light-emitting voltage application electrode of the light-emitting element, and the second light-emitting control circuit is configured to turn on or turn off a connection between the drive circuit and the light-emitting element.

For example, in the display substrate provided by some embodiments of the present disclosure, the pixel circuit of the first sub-pixel further comprises a first parasitic circuit, and the pixel circuit of the second sub-pixel further comprises a second parasitic circuit; the first parasitic circuit is electrically connected to the control terminal of the drive circuit of the pixel circuit of the first sub-pixel and the first light-emitting voltage application electrode of the light-emitting element of the first sub-pixel, and the first parasitic circuit is configured to control a voltage of the control terminal of the drive circuit of the pixel circuit of the first sub-pixel based on a voltage of the first light-emitting voltage application electrode of the light-emitting element of the first sub-pixel; and the second parasitic circuit is electrically connected to the control terminal of the drive circuit of the pixel circuit of the second sub-pixel and the first light-emitting voltage application electrode of the light-emitting element of the second sub-pixel, and the second parasitic circuit is configured to control a voltage of the control terminal of the drive circuit of the pixel circuit of the second sub-pixel based on a voltage of the first light-emitting voltage application electrode of the light-emitting element of the second sub-pixel.

For example, in the display substrate provided by some embodiments of the present disclosure, the first parasitic circuit comprises a first capacitor, and the first capacitor comprises a first electrode and a second electrode; the first light-emitting voltage application electrode of the light-emitting element of the first sub-pixel comprises an auxiliary electrode block, and an orthographic projection of the auxiliary electrode block on the base substrate at least partially overlaps with the orthographic projection of the control terminal of the drive circuit of the pixel circuit of the first sub-pixel on the base substrate; and the auxiliary electrode block serves as the first electrode of the first capacitor, and the control terminal of the drive circuit of the first sub-pixel is multiplexed as the second electrode of the first capacitor.

For example, in the display substrate provided by some embodiments of the present disclosure, the first light-emitting voltage application electrode of the light-emitting element of the first sub-pixel further comprises a first drive electrode block, and the first drive electrode block is electrically connected to the auxiliary electrode block, and an orthographic projection of the first drive electrode block on the base substrate, the orthographic projection of the light-emitting layer of the light-emitting element of the first sub-pixel on the base substrate, and the orthographic projection of the second light-emitting voltage application electrode of the light-emitting element of the first sub-pixel on the base substrate at least partially overlap.

For example, in the display substrate provided by some embodiments of the present disclosure, the second parasitic circuit comprises a second capacitor, and the second capacitor comprises a first electrode and a second electrode; the first light-emitting voltage application electrode of the light-emitting element of the second sub-pixel comprises a second drive electrode block, and an orthographic projection of the second drive electrode block on the base substrate at least partially overlaps with the orthographic projection of the control terminal of the drive circuit of the pixel circuit of the second sub-pixel on the base substrate; the orthographic projection of the second drive electrode block on the base substrate, an orthographic projection of the light-emitting layer of the light-emitting element of the second sub-pixel on the base substrate, and an orthographic projection of the second light-emitting voltage application electrode of the light-emitting element of the second sub-pixel on the base substrate at least partially overlap; and the second drive electrode block is multiplexed as the first electrode of the second capacitor, and the control terminal of the drive circuit of the second sub-pixel is multiplexed as the second electrode of the second capacitor.

For example, in the display substrate provided by some embodiments of the present disclosure, a shape of the first drive electrode block is identical to a shape of the second drive electrode block, and an area of the orthographic projection of the first drive electrode block on the base substrate is identical to an area of the orthographic projection of the second drive electrode block on the base substrate.

For example, in the display substrate provided by some embodiments of the present disclosure, in each repeating unit, the first sub-pixel and the second sub-pixel are arranged in a first direction, the first direction is parallel to a surface of the base substrate, and in the first direction, the auxiliary electrode block is located on a side of the first drive electrode block away from the light-emitting element of the second sub-pixel.

For example, in the display substrate provided by some embodiments of the present disclosure, the orthographic projection of the auxiliary electrode block on the base substrate does not overlap with an orthographic projection of the light-emitting layer of the light-emitting element of the first sub-pixel on the base substrate.

For example, in the display substrate provided by some embodiments of the present disclosure, the first light-emitting voltage application electrode of the light-emitting element of the first sub-pixel further comprises a first connection electrode block, in the first direction, the first connection electrode block is located on the side of the first drive electrode block away from the light-emitting element of the second sub-pixel, the first connection electrode block is located between the auxiliary electrode block and the first drive electrode block, and is electrically connected to both the auxiliary electrode block and the first drive electrode block.

For example, the display substrate provided by some embodiments of the present disclosure further includes an intermediate layer, in a direction perpendicular to the surface of the base substrate, the pixel circuit is located between the intermediate layer and the base substrate, the light-emitting element is located on a side of the intermediate layer away from the base substrate; and the intermediate layer comprises a first via hole, and the first connection electrode block extends to the first via hole and is electrically connected to the pixel circuit of the first sub-pixel through the first via hole.

For example, in the display substrate provided by some embodiments of the present disclosure, the first light-emitting voltage application electrode of the light-emitting element of the second sub-pixel further comprises a second connection electrode block, and the second connection electrode block is electrically connected to the second drive electrode block, and in the first direction, the second connection electrode block is located on a side of the second drive electrode block away from the light-emitting element of the first sub-pixel.

For example, in the display substrate provided by some embodiments of the present disclosure, the intermediate layer comprises a second via hole, and the second connection electrode block extends to the second via hole and is electrically connected to the pixel circuit of the second sub-pixel through the second via hole.

For example, in the display substrate provided by some embodiments of the present disclosure, the first connection electrode block is electrically connected to the second light-emitting control circuit of the pixel circuit of the first sub-pixel through the first via hole, and the second connection electrode block is electrically connected to the second light-emitting control circuit of the pixel circuit of the second sub-pixel through the second via hole.

For example, in the display substrate provided by some embodiments of the present disclosure, the pixel circuit comprises an active semiconductor layer, a gate electrode metal layer, and a source-drain electrode metal layer, in the direction perpendicular to the base substrate, the active semiconductor layer is located between the base substrate and the gate electrode metal layer, and the gate electrode metal layer is located between the active semiconductor layer and the source-drain electrode metal layer; the first connection electrode block extends to the source-drain electrode metal layer of the pixel circuit through the first via hole; and the second connection electrode block extends to the source-drain electrode metal layer of the pixel circuit through the second via hole.

For example, in the display substrate provided by some embodiments of the present disclosure, the plurality of sub-pixels further comprise a third sub-pixel and a fourth sub-pixel, in each repeating unit, the third sub-pixel and the fourth sub-pixel are arranged along a second direction, and in the second direction, the first sub-pixel and the second sub-pixel are located between the third sub-pixel and the fourth sub-pixel; and the second direction is parallel to the surface of the base substrate, and the first direction is perpendicular to the second direction.

For example, in the display substrate provided by some embodiments of the present disclosure, the first light-emitting voltage application electrode of the light-emitting element of the third sub-pixel comprises a third drive electrode block and a third connection electrode block, the third drive electrode block and the third connection electrode block are electrically connected to each other, and the first light-emitting voltage application electrode of the light-emitting element of the fourth sub-pixel comprises a fourth drive electrode block and a fourth connection electrode block, the fourth drive electrode block and the fourth connection electrode block are electrically connected to each other; and the intermediate layer comprises a third via hole and a fourth via hole, the third connection electrode block extends to the third via hole and is electrically connected to the pixel circuit of the third sub-pixel through the third via hole, and the fourth connection electrode block extends to the fourth via hole and is electrically connected to the pixel circuit of the fourth sub-pixel through the fourth via hole.

For example, in the display substrate provided by some embodiments of the present disclosure, in each repeating unit, in the first direction, the third connection electrode block is located on a side of the third drive electrode block away from the auxiliary electrode block, and in the second direction, the third connection electrode block is located on a side of the third drive electrode block close to the fourth drive electrode block; and in the first direction, the fourth connection electrode block is located on a side of the fourth drive electrode block away from the auxiliary electrode block, and in the second direction, the fourth connection electrode block is located on a side of the fourth drive electrode block close to the third drive electrode block.

For example, in the display substrate provided by some embodiments of the present disclosure, the third connection electrode block is electrically connected to the second light-emitting control circuit of the pixel circuit of the third sub-pixel through the third via hole, and the fourth connection electrode block is electrically connected to the second light-emitting control circuit of the pixel circuit of the fourth sub-pixel through the fourth via hole.

For example, in the display substrate provided by some embodiments of the present disclosure, the plurality of repeating units are arranged in the second direction to form a plurality of repeating unit groups, and the plurality of repeating unit groups are arranged in the first direction; in the first direction, the first connection electrode block, the second connection electrode block, the third connection electrode block, and the fourth connection electrode block are located between two adjacent repeating unit groups; and in the first direction, at least a portion of the auxiliary electrode block is located on a side of the auxiliary electrode block away from the first drive electrode block and located between two adjacent repeating units in a repeating unit group adjacent to the repeating unit group, in which the auxiliary electrode block is located.

For example, in the display substrate provided by some embodiments of the present disclosure, the first sub-pixel and the second sub-pixel are green sub-pixels, the third sub-pixel is a red sub-pixel, and the fourth sub-pixel is a blue sub-pixel.

For example, in the display substrate provided by some embodiments of the present disclosure, the pixel circuit further comprises a data writing circuit, a storage circuit, a threshold compensation circuit, and a reset circuit; the data writing circuit is electrically connected to the first terminal of the drive circuit, and is configured to write a data signal into the storage circuit under control of a scanning signal; the storage circuit is electrically connected to the control terminal of the drive circuit and the first voltage terminal, and is configured to store the data signal; the threshold compensation circuit is electrically connected to the control terminal of the drive circuit and the second terminal of the drive circuit, and is configured to perform threshold compensation on the drive circuit; and the reset circuit is electrically connected to the control terminal of the drive circuit and the first light-emitting voltage application electrode of the light-emitting element, and is configured to reset the control terminal of the drive circuit and the first light-emitting voltage application electrode of the light-emitting element under control of a reset control signal.

For example, in the display substrate provided by some embodiments of the present disclosure, the drive circuit comprises a drive transistor, the control terminal of the drive circuit comprises a gate electrode of the drive transistor, the first terminal of the drive circuit comprises a first electrode of the drive transistor, the second terminal of the drive circuit comprises a second electrode of the drive transistor; the data writing circuit comprises a data writing transistor, the storage circuit comprises a third capacitor, the threshold compensation circuit comprises a threshold compensation transistor, the reset circuit comprises a first reset transistor and a second reset transistor, the first light-emitting control circuit comprises a first light-emitting control transistor, the second light-emitting control circuit comprises a second light-emitting control transistor, the reset control signal comprises a first-sub reset control signal and a second sub-reset control signal; a first electrode of the data writing transistor is electrically connected to the first electrode of the drive transistor, a second electrode of the data writing transistor is configured to receive the data signal, and a gate electrode of the data writing transistor is configured to receive the scanning signal; a first electrode of the third capacitor is electrically connected to the first voltage terminal, and a second electrode of the third capacitor is electrically connected to the gate electrode of the drive transistor; a first electrode of the threshold compensation transistor is electrically connected to the second electrode of the drive transistor, a second electrode of the threshold compensation transistor is electrically connected to the gate electrode of the drive transistor, and a gate electrode of the threshold compensation transistor is configured to receive a compensation control signal; a first electrode of the first reset transistor is configured to receive a first reset signal, a second electrode of the first reset transistor is electrically connected to the gate electrode of the drive transistor, and a gate electrode of the first reset transistor is configured to receive the first sub-reset control signal; a first electrode of the second reset transistor is configured to receive a second reset signal, a second electrode of the second reset transistor is electrically connected to the first light-emitting voltage application electrode of the light-emitting element, and a gate electrode of the second reset transistor is configured to receive the second sub-reset control signal; a first electrode of the first light-emitting control transistor is electrically connected to the first voltage terminal, a second electrode of the first light-emitting control transistor is electrically connected to the first electrode of the drive transistor, a gate electrode of the first light-emitting control transistor is configured to receive a first light-emitting control signal; and a first electrode of the second light-emitting control transistor is electrically connected to the second electrode of the drive transistor, a second electrode of the second light-emitting control transistor is electrically connected to the first light-emitting voltage application electrode of the light-emitting element, and a gate electrode of the second light-emitting control transistor is configured to receive a second light-emitting control signal.

Some embodiments of the present disclosure also provide a display panel including the display substrate according to any one of the embodiments of the present disclosure.

Some embodiments of the present disclosure also provide a display device, and the display device includes the display panel according to any one of the embodiments of the present disclosure.

For example, the display device provided by some embodiments of the present disclosure further includes a drive chip, the drive chip is electrically connected to the display panel, and the drive chip is located on a side of the first sub-pixel in each repeating unit away from the second sub-pixel.

For example, in the display device provided by some embodiments of the present disclosure, in each repeating unit, an area of the orthographic projection of the first light-emitting voltage application electrode of the light-emitting element of the first sub-pixel on the base substrate is greater than an area of the orthographic projection of the first light-emitting voltage application electrode of the light-emitting element of the second sub-pixel on the base substrate.

Some embodiments of the present disclosure also provide a preparation method for preparing the display substrate according to any one of the embodiments of the present disclosure, and the preparation method includes: providing the base substrate; and forming the plurality of repeating units on the base substrate, in which each of the plurality of repeating units comprises the plurality of sub-pixels, each of the plurality of sub-pixels comprises the pixel circuit and the light-emitting element, the light-emitting element comprises the first light-emitting voltage application electrode, the second light-emitting voltage application electrode, and the light-emitting layer between the first light-emitting voltage application electrode and the second light-emitting voltage application electrode, the plurality of sub-pixels comprise the first sub-pixel and the second sub-pixel, the color of light emitted by the light-emitting element of the first sub-pixel is identical to the color of light emitted by the light-emitting element of the second sub-pixel, the shape of the first light-emitting voltage application electrode of the light-emitting element of the first sub-pixel is different from the shape of the first light-emitting voltage application electrode of the light-emitting element of the second sub-pixel, the orthographic projection of the first light-emitting voltage application electrode of the light-emitting element of the first sub-pixel on the base substrate at least partially overlaps with the orthographic projection of the control terminal of the drive circuit of the pixel circuit of the first sub-pixel on the base substrate, and the orthographic projection of the first light-emitting voltage application electrode of the light-emitting element of the second sub-pixel on the base substrate at least partially overlaps with the orthographic projection of the control terminal of the drive circuit of the pixel circuit of the second sub-pixel on the base substrate.

Some embodiments of the present disclosure also provide a display substrate, and the display substrate includes a base substrate and a plurality of repeating units on the base substrate, each of the plurality of repeating units comprises a plurality of sub-pixels, each of the plurality of sub-pixels comprises a light-emitting element and a pixel circuit for driving the light-emitting element to emit light, the pixel circuit comprises a drive circuit, and the light-emitting element comprises a first light-emitting voltage application electrode, a second light-emitting voltage application electrode, and a light-emitting layer between the first light-emitting voltage application electrode and the second light-emitting voltage application electrode; drive circuits of the plurality of sub-pixels are arranged in an array on the base substrate; the plurality of sub-pixels comprise a first sub-pixel and a second sub-pixel, and a color of light emitted by the light-emitting element of the first sub-pixel is identical to a color of light emitted by the light-emitting element of the second sub-pixel; the first light-emitting voltage application electrode of the light-emitting element of the first sub-pixel comprises an auxiliary electrode block, a first drive electrode block, and a first connection electrode block, and the first drive electrode block, the auxiliary electrode block, and the first connection electrode block are electrically connected to each other; the first light-emitting voltage application electrode of the light-emitting element of the second sub-pixel comprises a second drive electrode block and a second connection electrode block, and the second drive electrode block is electrically connected to the second connection electrode block; the auxiliary electrode block is located on a side of a control terminal of the drive circuit of the pixel circuit of the first sub-pixel away from the base substrate; and the second drive electrode block is located on a side of a control terminal of the drive circuit of the pixel circuit of the second sub-pixel away from the base substrate.

For example, in the display substrate provided by some embodiments of the present disclosure, a shape of the first drive electrode block is different from a shape of the auxiliary electrode block, the shape of the first drive electrode block is identical to a shape of the second drive electrode block, and an area of an orthographic projection of the first drive electrode block on the base substrate is identical to an area of an orthographic projection of the second drive electrode block on the base substrate.

For example, in the display substrate provided by some embodiments of the present disclosure, a shape of the first connection electrode block is identical to a shape of the second connection electrode block, and an area of an orthographic projection of the first connection electrode block on the base substrate is identical to an area of an orthographic projection of the second connection electrode block on the base substrate.

For example, in the display substrate provided by some embodiments of the present disclosure, the control terminal of the drive circuit of the pixel circuit of the first sub-pixel and the control terminal of the drive circuit of the pixel circuit of the second sub-pixel are arranged in a first direction, and in the first direction, the first drive electrode block is located on a side of the control terminal of the drive circuit of the pixel circuit of the first sub-pixel close to the control terminal of the drive circuit of the pixel circuit of the second sub-pixel.

For example, in the display substrate provided by some embodiments of the present disclosure, in the first direction, the first drive electrode block is located between the control terminal of the drive circuit of the pixel circuit of the first sub-pixel and the control terminal of the drive circuit of the pixel circuit of the second sub-pixel.

For example, in the display substrate provided by some embodiments of the present disclosure, in the first direction, the first connection electrode block is located on a side of the first drive electrode block away from the control terminal of the drive circuit of the pixel circuit of the second sub-pixel.

For example, in the display substrate provided by some embodiments of the present disclosure, in the first direction, the first connection electrode block is located between the control terminal of the drive circuit of the pixel circuit of the first sub-pixel and the control terminal of the drive circuit of the pixel circuit of the second sub-pixel.

For example, in the display substrate provided by some embodiments of the present disclosure, the first connection electrode block is located between the first drive electrode block and the auxiliary electrode block in the first direction.

For example, in the display substrate provided by some embodiments of the present disclosure, in the first direction, the second connection electrode block is located on a side of the control terminal of the drive circuit of the pixel circuit of the second sub-pixel away from the control terminal of the drive circuit of the pixel circuit of the first sub-pixel, and the second drive electrode block is located between the second connection electrode block and the first drive electrode block.

For example, in the display substrate provided by some embodiments of the present disclosure, a distance between a center of the control terminal of the drive circuit of the pixel circuit of the first sub-pixel and a center of the first drive electrode block is greater than a distance between a center of the control terminal of the drive circuit of the pixel circuit of the second sub-pixel and a center of the second drive electrode block.

Some embodiments of the present disclosure also provide a display substrate, the display substrate includes a base substrate and a plurality of repeating units on the base substrate, each of the plurality of repeating units comprises a plurality of sub-pixels, each of the plurality of sub-pixels comprises a light-emitting element and a pixel circuit for driving the light-emitting element to emit light, the light-emitting element comprises a first light-emitting voltage application electrode, a second light-emitting voltage application electrode, and a light-emitting layer between the first light-emitting voltage application electrode and the second light-emitting voltage application electrode, the pixel circuit comprises a drive circuit, a second light-emitting control circuit, and a reset circuit, the second light-emitting control circuit is electrically connected to a second light-emitting control signal line, a second terminal of the drive circuit, and the first light-emitting voltage application electrode of the light-emitting element, and is configured to, under control of a second light-emitting control signal provided by the second light-emitting control signal line, turn on or off a connection between the drive circuit and the light-emitting element, the reset circuit is electrically connected to a control terminal of the drive circuit and a first reset control signal line, and is configured to reset the control terminal of the drive circuit under control of a first sub-reset control signal provided by the first reset control signal line, the second light-emitting control signal line and the first reset control signal line are arranged along a first direction, the plurality of sub-pixels comprises a first sub-pixel and a second sub-pixel, an orthographic projection of the first light-emitting voltage application electrode of the light-emitting element of the first sub-pixel on the base substrate at least partially overlaps with both an orthographic projection of the first reset control signal line connected to the reset circuit of the pixel circuit of the second sub-pixel on the base substrate and an orthographic projection of the second light-emitting control signal line connected to the second light-emitting control circuit of the pixel circuit of the first sub-pixel on the base substrate, and an orthographic projection of the first light-emitting voltage application electrode of the light-emitting element of the second sub-pixel on the base substrate at least partially overlaps with an orthographic projection of the second light-emitting control signal line connected to the second light-emitting control circuit of the pixel circuit of the second sub-pixel on the base substrate.

For example, in the display substrate provided by some embodiments of the present disclosure, the pixel circuit further comprises a data writing circuit, the data writing circuit is electrically connected to a first terminal of the drive circuit and a first scanning signal line, and is configured to write a data signal to the control terminal of the drive circuit under control of a scanning signal provided by the first scanning signal line, in the first direction, the first scanning signal line is located between the second light-emitting control signal line and the first reset control signal line, the first light-emitting voltage application electrode of the light-emitting element of the first sub-pixel and the first light-emitting voltage application electrode of the light-emitting element of the second sub-pixel are arranged along the first direction, and in the first direction, the first scanning signal line connected to the data writing circuit of the pixel circuit of the second sub-pixel is located between the first light-emitting voltage application electrode of the light-emitting element of the first sub-pixel and the first light-emitting voltage application electrode of the light-emitting element of the second sub-pixel.

For example, in the display substrate provided by some embodiments of the present disclosure, the reset circuit is further electrically connected to a first reset power supply signal line, the reset circuit is configured to reset the control terminal of the drive circuit according to a first reset signal provided by the first reset power supply signal line under control of the first sub-reset control signal provided by the first reset control signal line, in the first direction, the first reset power supply signal line is located on a side of the first reset control signal line away from the second light-emitting control signal line, and the orthographic projection of the first light-emitting voltage application electrode of the light-emitting element of the first sub-pixel on the base substrate further at least partially overlaps with an orthographic projection of the first reset power supply signal line connected to the reset circuit of the pixel circuit of the second sub-pixel on the base substrate.

For example, in the display substrate provided by some embodiments of the present disclosure, all of the second light-emitting control signal line, the first reset control signal line, the first scanning signal line, and the first reset power supply signal line extend in a second direction, and the second direction is perpendicular to the first direction.

For example, in the display substrate provided by some embodiments of the present disclosure, the second light-emitting control signal line, the first reset control signal line, the first scanning signal line, and the first reset power supply signal line are parallel to each other.

For example, in the display substrate provided by some embodiments of the present disclosure, the first light-emitting voltage application electrode of the light-emitting element of the first sub-pixel comprises an auxiliary electrode block, a first drive electrode block, and a first connection electrode block, the first drive electrode block, the auxiliary electrode block, and the first connection electrode block are electrically connected to each other and arranged in the first direction, the first light-emitting voltage application electrode of the light-emitting element of the second sub-pixel comprises a second drive electrode block and a second connection electrode block, the second drive electrode block and the second connection electrode block are electrically connected and arranged in the first direction, in the first direction, the first connection electrode block and the auxiliary electrode block are both located on a side of the first drive electrode block away from the second drive electrode block, the first connection electrode block is located between the auxiliary electrode block and the first drive electrode block, the second connection electrode block is located on a side of the second drive electrode block away from the first drive electrode block, an orthographic projection of the first drive electrode block on the base substrate at least partially overlaps with the orthographic projection of the first reset control signal line connected to the reset circuit of the pixel circuit of the second sub-pixel on the base substrate and the orthographic projection of the first reset power supply signal line connected to the reset circuit of the pixel circuit of the second sub-pixel on the base substrate, an orthographic projection of the first connection electrode block on the base substrate at least partially overlaps with the orthographic projection of the second light-emitting control signal line connected to the second light-emitting control circuit of the pixel circuit of the first sub-pixel on the base substrate, in the first direction, the auxiliary electrode block is located on a side of the second light-emitting control signal line connected to the second light-emitting control circuit of the pixel circuit of the first sub-pixel away from the first light-emitting voltage application electrode of the light-emitting element of the second sub-pixel, an orthographic projection of the second connection electrode block on the base substrate at least partially overlaps with the orthographic projection of the second light-emitting control signal line connected to the second light-emitting control circuit of the pixel circuit of the second sub-pixel on the base substrate, and in the first direction, the second drive electrode block is located between the second light-emitting control signal line connected to the second light-emitting control circuit of the pixel circuit of the second sub-pixel and the first scanning signal line connected to the data writing circuit of the pixel circuit of the second sub-pixel.

For example, in the display substrate provided by some embodiments of the present disclosure, a color of light emitted by the light-emitting element of the first sub-pixel is identical to a color of light emitted by the light-emitting element of the second sub-pixel, and a shape of the first light-emitting voltage application electrode of the light-emitting element of the first sub-pixel is different from a shape of the first light-emitting voltage application electrode of the light-emitting element of the second sub-pixel

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms such as "a," "an," etc., are not intended to limit the amount, but indicate the existence of at least one. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

In order to keep the following description of embodiments of the present disclosure clear and concise, detailed descriptions of some known functions and known components are omitted from the present disclosure.

Figure 1:
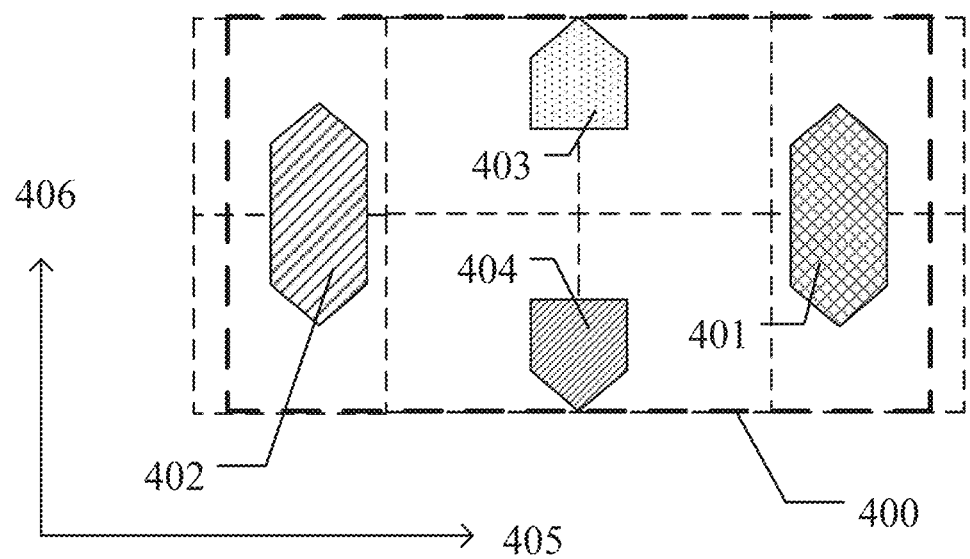
FIG. 1 is a structural schematic diagram of a pixel repeating unit in a pixel arrangement structure.

FIG. 1 is a structural schematic diagram of a pixel repeating unit in a pixel arrangement structure, as shown in FIG. 1, a pixel arrangement structure includes a plurality of pixel repeating units 400, and the plurality of pixel repeating units 400 are arranged in an array along a direction 405 and a direction 406. Each pixel repeating unit 400 includes a red sub-pixel 401, a blue sub-pixel 402, a first green sub-pixel 403, and a second green sub-pixel 404. As shown in FIG. 1, the red sub-pixel 401 and the blue sub-pixel 402 are arranged in the direction 405, the first green sub-pixel 403 and the second green sub-pixel 404 are arranged in the direction 406, and in the direction 405, the first green sub-pixel 403 and the second green sub-pixel 404 are located between the red sub-pixel 401 and the blue sub-pixel 402.

In a process of lighting detection for each sub-pixel in the pixel arrangement structure as shown in FIG. 1, the brightness of the first green sub-pixel 403 and the brightness of the second green sub-pixel 404 are inconsistent, thereby resulting in a problem of missing detection of bright spots, i.e., some green sub-pixels cannot be detected. According to the experimental results, the brightness of the first green sub-pixel 403 is higher than that of the second green sub-pixel 404, thereby resulting in a phenomenon that the brightness of the first green sub-pixel 403 is relatively bright while the brightness of the second green sub-pixel 404 is relatively dark.

In each sub-pixel, there is a parasitic capacitance between an anode of a light-emitting element and a gate electrode of a drive transistor, and the parasitic capacitance will affect a light-emitting brightness of the light-emitting element, and the larger the parasitic capacitance, the weaker the light-emitting brightness. The smaller the parasitic capacitance, the stronger the light-emitting brightness. According to the analysis of the pixel arrangement structure, in this pixel arrangement structure, a gate electrode of a drive transistor in a pixel circuit for driving the first green sub-pixel 403 is not blocked by an anode of a light-emitting element of the first green sub-pixel 403, while a gate electrode of a drive transistor in a pixel circuit for driving the second green sub-pixel 404 is blocked by an anode in a light-emitting element of the second green sub-pixel 404. Thus, there is no parasitic capacitance between the gate electrode of the drive transistor of the first green sub-pixel 403 and the light-emitting element of the first green sub-pixel 403, or a parasitic capacitance between the gate electrode of the drive transistor of the first green sub-pixel 403 and the light-emitting element of the first green sub-pixel 403 is smaller than a parasitic capacitance between the gate electrode of the drive transistor of the second green sub-pixel 404 and the light-emitting element of the second green sub-pixel 404, that is, the parasitic capacitance between the gate electrode of the drive transistor of the first green sub-pixel 403 and the light-emitting element of the first green sub-pixel is greatly different from the parasitic capacitance between the gate electrode of the drive transistor of the second green sub-pixel 404 and the light-emitting element of the second green sub-pixel 404, thereby resulting in the brightness difference between the first green sub-pixel 403 and the second green sub-pixel 404 in each repeating unit, which seriously affects the display effect.

At least some embodiment of the present disclosure provide a display substrate and a preparation method thereof, a display panel, and a display device. In the display substrate, a light-emitting element of a first sub-pixel covers a gate electrode of a drive transistor of the first sub-pixel, and a light-emitting element of a second sub-pixel also covers a gate electrode of a drive transistor of the second sub-pixel, so as to reduce the difference between a parasitic capacitance between the light-emitting element of the first sub-pixel and a gate electrode of the drive transistor of the first sub-pixel and a parasitic capacitance between the light-emitting element of the second sub-pixel and a gate electrode of the drive transistor of the second sub-pixel, and make the pixel brightness of the first sub-pixel and the pixel brightness of the second sub-pixel reach the same, thereby improving the display uniformity and the display effect and solving the problem of the pixel brightness difference of the display panel. In addition, the display substrate has a simple structure, is easy to design and manufacture, and has a low cost.

Several embodiments of the present disclosure will be described in detail below with reference to the accompanying drawings, but the present disclosure is not limited to these specific embodiments.

Figure 2:
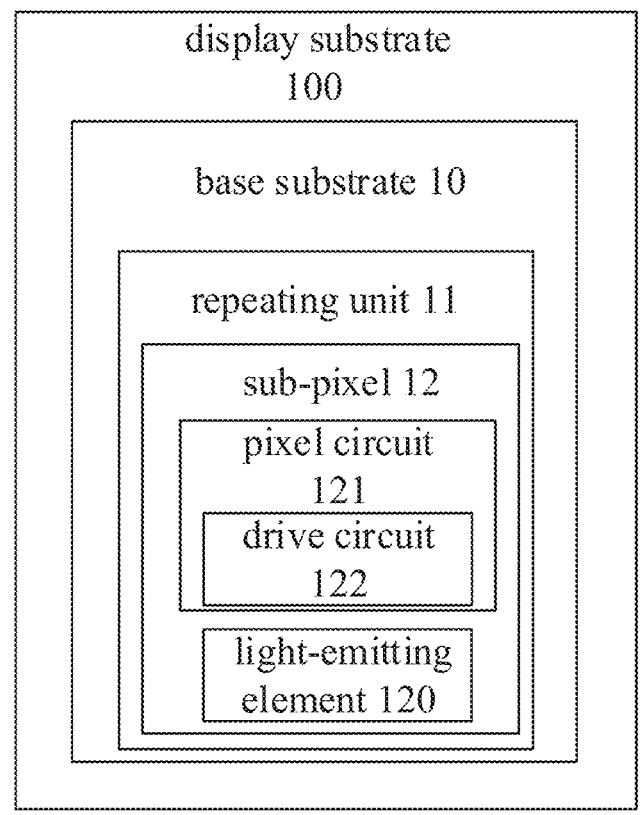
FIG. 2 is a schematic block diagram of a display substrate provided by some embodiments of the present disclosure.
Figure 3A:
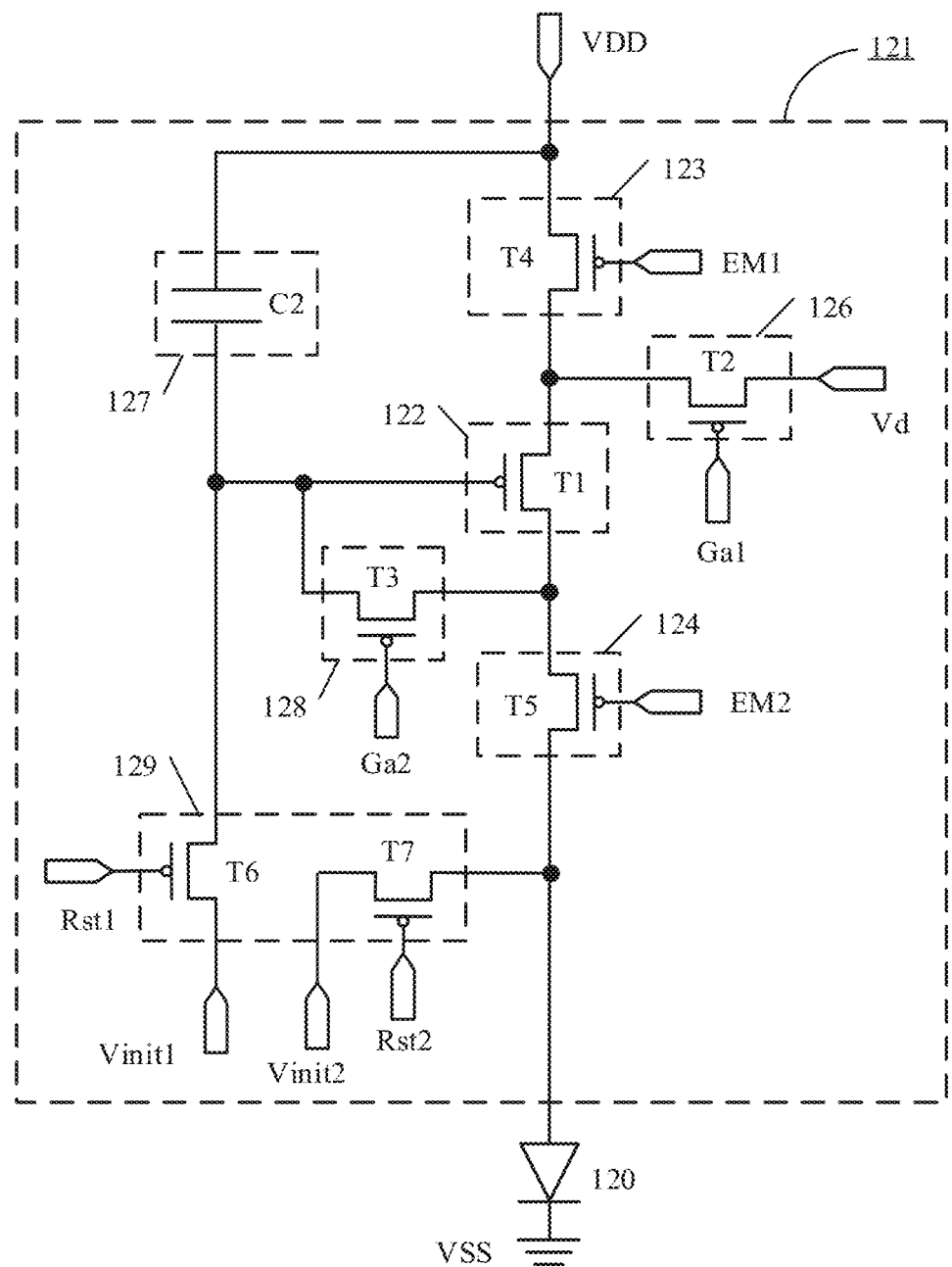
FIG. 3A is a structural schematic diagram of a pixel circuit provided by some embodiments of the present disclosure.
Figure 3B:
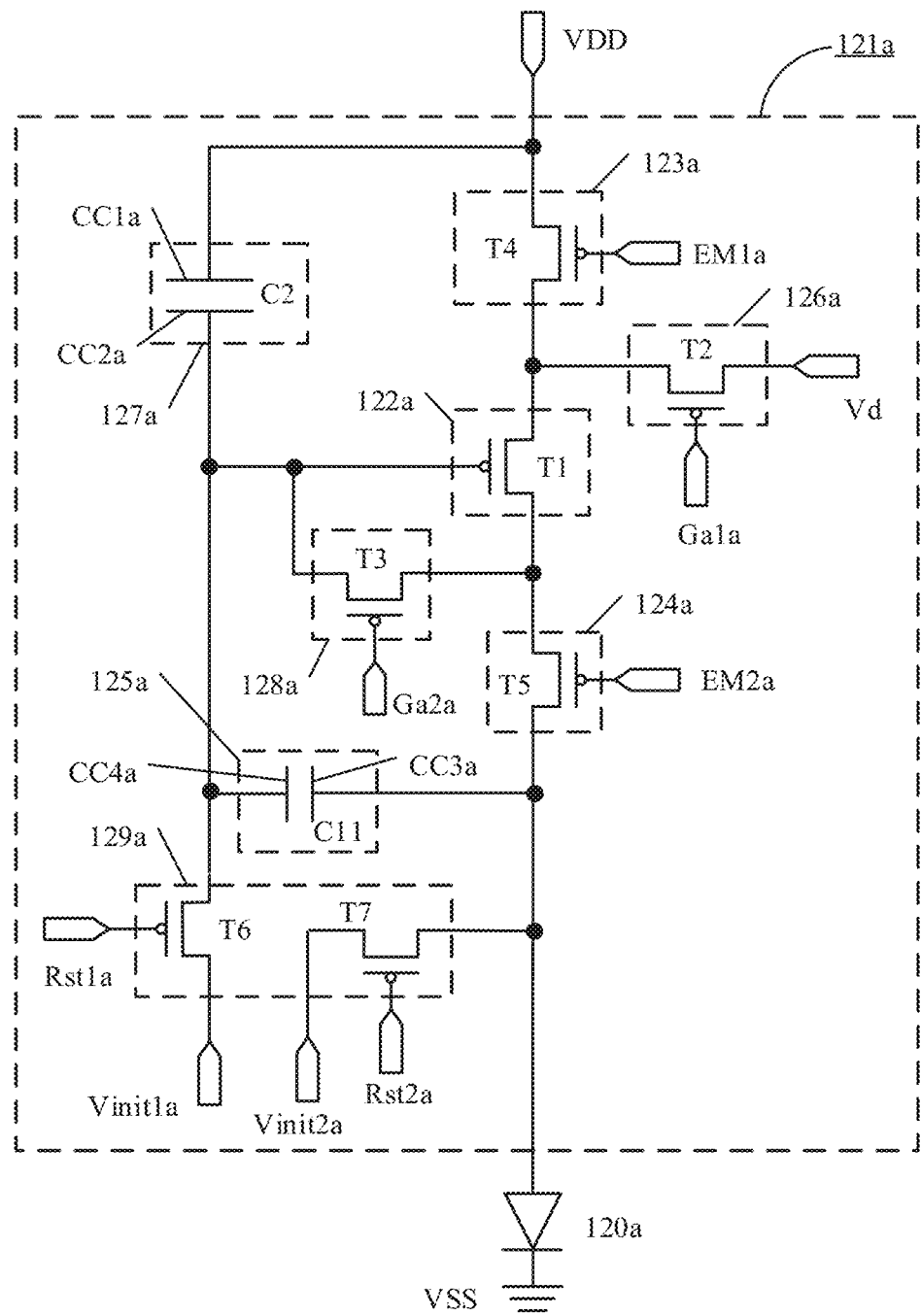
FIG. 3B is a structural schematic diagram of a pixel circuit of a first sub-pixel provided by some embodiments of the present disclosure.
Figure 3C:
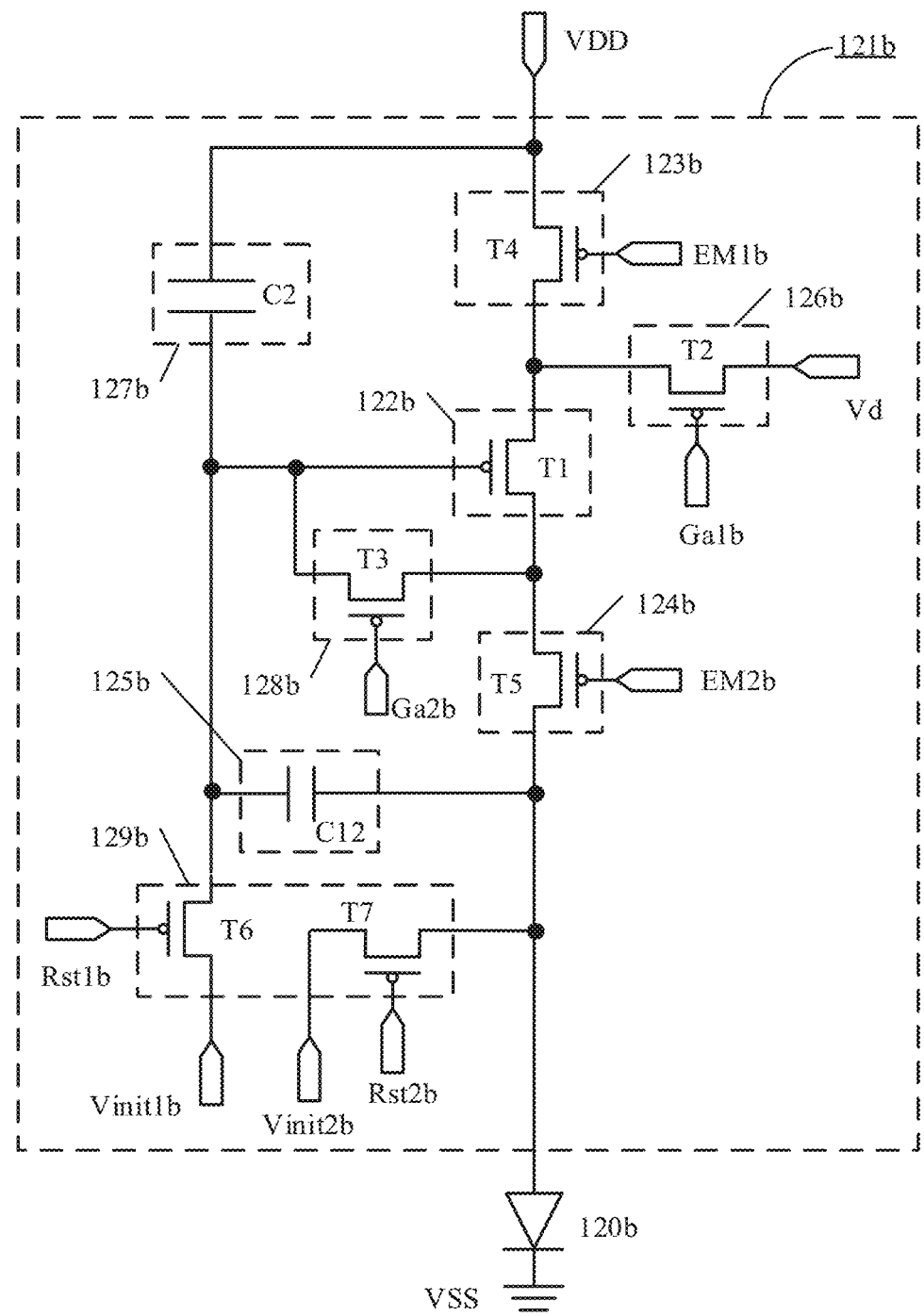
FIG. 3C is a structural schematic diagram of a pixel circuit of a second sub-pixel provided by some embodiments of the present disclosure.

FIG. 2 is a schematic block diagram of a display substrate provided by some embodiments of the present disclosure, FIG. 3A is a plane schematic diagram of a display substrate provided by some embodiments of the present disclosure, FIG. 3A is a structural schematic diagram of a pixel circuit provided by some embodiments of the present disclosure, FIG. 3B is a structural schematic diagram of a pixel circuit of a first sub-pixel provided by some embodiments of the present disclosure, and FIG. 3C is a structural schematic diagram of a pixel circuit of a second sub-pixel provided by some embodiments of the present disclosure.

For example, as shown in FIG. 2, the display substrate 100 provided by the embodiment of the present disclosure includes a base substrate 10 and a plurality of repeating units 11 on the base substrate 10, each repeating unit 11 includes a plurality of sub-pixels 12. Each sub-pixel 12 includes a light-emitting element 120 and a pixel circuit 121, the pixel circuit 121 is used for driving the light-emitting element 120 to emit light, and the pixel circuit 121 includes a drive circuit 122.

For example, the display substrate 100 may be applied to a display panel, such as an active matrix organic light-emitting diode (AMOLED) display panel or the like. The display substrate 100 may be an array substrate.

For example, the base substrate 10 may be a suitable substrate such as a glass substrate, a quartz substrate, and a plastic substrate, etc.

For example, the light-emitting element 120 of each sub-pixel 12 includes a first light-emitting voltage application electrode, a second light-emitting voltage application electrode, and a light-emitting layer between the first light-emitting voltage application electrode and the second light-emitting voltage application electrode.

For example, the plurality of sub-pixels 12 include a first sub-pixel G1 and a second sub-pixel G2.

For example, as shown in FIG. 3A, the pixel circuit 121 further includes a first light-emitting control circuit 123 and a second light-emitting control circuit 124. The drive circuit 122 includes a control terminal, a first terminal, and a second terminal, and is configured to provide a drive current for driving the light-emitting element 120 to emit light. For example, the first light-emitting control circuit 123 is connected to the first terminal of the drive circuit 122 and a first voltage terminal VDD, and is configured to turn on or turn off a connection between the drive circuit 122 and the first voltage terminal VDD, and the second light-emitting control circuit 124 is electrically connected to the second terminal of the drive circuit 122 and the first light-emitting voltage application electrode of the light-emitting element 120, and is configured to turn on or turn off a connection between the drive circuit 122 and the light-emitting element 120.

For example, as shown in FIGS. 3B and 3C, a pixel circuit 121a of the first sub-pixel G1 further includes a first parasitic circuit 125a, and a pixel circuit 121b of the second sub-pixel G2 further includes a second parasitic circuit 125b. For example, the first parasitic circuit 125a is electrically connected to a control terminal of a drive circuit 122a of the pixel circuit 121a of the first sub-pixel G1 and a first light-emitting voltage application electrode of a light-emitting element 120a of the first sub-pixel G1, and is configured to control a voltage of the control terminal of the drive circuit 122a of the pixel circuit 121a of the first sub-pixel G1 based on a voltage of the first light-emitting voltage application electrode of the light-emitting element 120a of the first sub-pixel G1. The second parasitic circuit 125b is electrically connected to a control terminal of a drive circuit of a pixel circuit 121b of the second sub-pixel G2 and a first light-emitting voltage application electrode of a light-emitting element 120b of the second sub-pixel G2, and is configured to control a voltage of the control terminal of the drive circuit 122b of the pixel circuit 121b of the second sub-pixel G2 based on a voltage of the first light-emitting voltage application electrode of the light-emitting element 120b of the second sub-pixel G2.

It should be noted that the pixel circuit 121 may further include a parasitic circuit, and the parasitic circuit is not shown in FIG. 3A, for example, a first parasitic circuit in the pixel circuit of the first sub-pixel G1 and a second parasitic circuit in the pixel circuit of the second sub-pixel G2 are not shown in FIG. 3A.

For example, as shown in FIG. 3A, the pixel circuit 121 further includes a data writing circuit 126, a storage circuit 127, a threshold compensation circuit 128, and a reset circuit 129. The data writing circuit 126 is electrically connected to the first terminal of the drive circuit 122 and is configured to write a data signal into the storage circuit 127 under control of a scanning signal; the storage circuit 127 is electrically connected to the control terminal of the drive circuit 122 and the first voltage terminal VDD, and is configured to store the data signal; the threshold compensation circuit 128 is electrically connected to the control terminal of the drive circuit 122 and the second terminal of the drive circuit 122, and is configured to perform threshold compensation on the drive circuit 122; and the reset circuit 129 is electrically connected to the control terminal of the drive circuit 122 and the first light-emitting voltage application electrode of the light-emitting element 120, and is configured to reset the control terminal of the drive circuit 122 and the first light-emitting voltage application electrode of the light-emitting element 120 under control of a reset control signal.

For example, as shown in FIG. 3A, the drive circuit 122 includes a drive transistor T1, the control terminal of the drive circuit 122 includes a gate electrode of the drive transistor T1, the first terminal of the drive circuit 122 includes a first electrode of the drive transistor T1, and the second terminal of the drive circuit 122 includes a second electrode of the drive transistor T1.

For example, as shown in FIG. 3A, the data writing circuit 126 includes a data writing transistor T2, the storage circuit 127 includes a third capacitor C2, the threshold compensation circuit 128 includes a threshold compensation transistor T3, the first light-emitting control circuit 123 includes a first light-emitting control transistor T4, the second light-emitting control circuit 124 includes a second light-emitting control transistor T5, the reset circuit 129 includes a first reset transistor T6 and a second reset transistor T7, and the reset control signal may include a first sub-reset control signal and a second sub-reset control signal.

For example, as shown in FIG. 3A, a first electrode of the data writing transistor T2 is electrically connected to the first electrode of the drive transistor T1, a second electrode of the data writing transistor T2 is configured to be electrically connected to a data line Vd to receive the data signal, and a gate electrode of the data writing transistor T2 is configured to be electrically connected to a first scanning signal line Ga1 to receive the scanning signal; a first electrode of the third capacitor C2 is electrically connected to the first voltage terminal VDD, and a second electrode of the third capacitor C2 is electrically connected to the gate electrode of the drive transistor T1; a first electrode of the threshold compensation transistor T3 is electrically connected to the second electrode of the drive transistor T1, a second electrode of the threshold compensation transistor T3 is electrically connected to the gate electrode of the drive transistor T1, and a gate electrode of the threshold compensation transistor T3 is configured to be electrically connected to a second scanning signal line Ga2 to receive a compensation control signal; a first electrode of the first reset transistor T6 is configured to be electrically connected to a first reset power supply terminal Vinit1 to receive a first reset signal, a second electrode of the first reset transistor T6 is electrically connected to the gate electrode of the drive transistor T1, and a gate electrode of the first reset transistor T6 is configured to be electrically connected to a first reset control signal line Rst1 to receive the first sub-reset control signal; a first electrode of the second reset transistor T7 is configured to be electrically connected to a second reset power supply terminal Vinit2 to receive a second reset signal, a second electrode of the second reset transistor T7 is electrically connected to the first light-emitting voltage application electrode of the light-emitting element 120, and a gate electrode of the second reset transistor T7 is configured to be electrically connected to a second reset control signal line Rst2 to receive the second sub-reset control signal; a first electrode of the first light-emitting control transistor T4 is electrically connected to the first voltage terminal VDD, a second electrode of the first light-emitting control transistor T4 is electrically connected to the first electrode of the drive transistor T1, and a gate electrode of the first light-emitting control transistor T4 is configured to be electrically connected to a first light-emitting control signal line EM1 to receive a first light-emitting control signal; a first electrode of the second light-emitting control transistor T5 is electrically connected to the second electrode of the drive transistor T1, a second electrode of the second light-emitting control transistor T5 is electrically connected to the first light-emitting voltage application electrode of the light-emitting element 120, and a gate electrode of the second light-emitting control transistor T5 is configured to be electrically connected to a second light-emitting control signal line EM2 to receive a second light-emitting control signal; and the second light-emitting voltage application electrode of the light-emitting element 120 is electrically connected to a second voltage terminal VSS.

For example, as shown in FIG. 3B, for the first sub-pixel G1, the first parasitic circuit 125*a* includes a first capacitor C11, and the first capacitor C11 includes a first electrode CC3*a* and a second electrode CC4*a*. The first electrode CC3*a* of the first capacitor C11 is electrically connected to the first light-emitting voltage application electrode of the light-emitting element 120*a* of the first sub-pixel G1, and the second electrode CC4*a* of the first capacitor C11 is electrically connected to the gate electrode of the drive transistor T1 of the pixel circuit 121*a* of the first sub-pixel G1.

For example, as shown in FIG. 3C, for the second sub-pixel G2, the second parasitic circuit 125*b* includes a second capacitor C12, and the second capacitor C12 includes a first electrode and a second electrode. The first electrode of the second capacitor C12 is electrically connected to the first light-emitting voltage application electrode of the light-emitting element 120*b* of the second sub-pixel G2, and the second electrode of the second capacitor C12 is electrically connected to the gate electrode of the drive transistor T1 of the pixel circuit 121*b* of the second sub-pixel G2.

For example, a capacitance value of the first capacitor C11 may be the same as a capacitance value of the second capacitor C12, so that a pixel brightness of the first sub-pixel G1 can be consistent with a pixel brightness of the second sub-pixel G2, and the display uniformity and the display effect can be improved.

For example, one of the first voltage terminal VDD and the second voltage terminal VSS is a high voltage terminal and the other of the first voltage terminal VDD and the second voltage terminal VSS is a low voltage terminal. For example, in the embodiment as shown in FIG. 3A, the first voltage terminal VDD is a voltage source to output a constant first voltage, and the first voltage is a positive voltage; and the second voltage terminal VSS may be a voltage source to output a constant second voltage, the second voltage is a negative voltage or the like. For example, in some examples, the second voltage terminal VSS may be grounded.

For example, for the first sub-pixel G1, as shown in FIG. 3B, the pixel circuit 121*a* of the first sub-pixel G1 further includes a data writing circuit 126*a*, a storage circuit 127*a*, a threshold compensation circuit 128*a*, and a reset circuit 129*a*; and for the second sub-pixel G2, as shown in FIG. 3C, the pixel circuit 121*b* of the second sub-pixel G2 further includes a data writing circuit 126*b*, a storage circuit 127*b*, a threshold compensation circuit 128*b*, and a reset circuit 129*b*. The connection relationship and function of each element in each circuit of the pixel circuit 121*a* of the first sub-pixel G1 and the pixel circuit 121*b* of the second sub-pixel G2 are similar to the example described above with respect to FIG. 3A, and the repetition is not repeated here again.

For example, as shown in FIG. 3A, the scanning signal may be the same as the compensation control signal, that is, the gate electrode of the data writing transistor T2 and the gate electrode of the threshold compensation transistor T3 may be electrically connected to a same signal line, such as the first scanning signal line Ga1, to receive the same signal (e.g., scanning signal), at this time, the display substrate 100 may not be provided with the second scanning signal line Ga2, thereby reducing the number of signal lines. For another example, the gate electrode of the data writing transistor T2 and the gate electrode of the threshold compensation transistor T3 may be electrically connected to different signal lines, i.e., the gate electrode of the data writing transistor T2 is electrically connected to the first scanning signal line Ga1, the gate electrode of the threshold compensation transistor T3 is electrically connected to the second scanning signal line Ga2, and a signal transmitted by the first scanning signal line Ga1 is identical to a signal transmitted by the second scanning signal line Ga2.

It should be noted that the scanning signal and the compensation control signal may also be different, so that the gate electrode of the data writing transistor T2 and the threshold compensation transistor T3 can be separately and independently controlled, thereby increasing the flexibility of controlling the pixel circuit.

For example, as shown in FIGS. 3A-3B, the first light-emitting control signal may be identical to the second light-emitting control signal, that is, the gate electrode of the first light-emitting control transistor T4 and the gate electrode of the second light-emitting control transistor T5 may be electrically connected to a same signal line, such as the first light-emitting control signal line EM1, to receive the same signal (e.g., the first light-emitting control signal), and at this time, the display substrate 100 may not be provided with the second light-emitting control signal line EM2, thereby reducing the number of signal lines. For another example, the gate electrode of the first light-emitting control transistor T4 and the gate electrode of the second light-emitting control transistor T5 may also be electrically connected to different signal lines, i.e., the gate electrode of the first light-emitting control transistor T4 is electrically connected to the first light-emitting control signal line EM1, the gate electrode of the second light-emitting control transistor T5 is electrically connected to the second light-emitting control signal line EM2, and a signal transmitted by the first light-emitting control signal line EM1 is identical to a signal transmitted by the second light-emitting control signal line EM2.

It should be noted that in a case where the first light-emitting control transistor T4 and the second light-emitting control transistor T5 are different types of transistors, for example, in a case where the first light-emitting control transistor T4 is a P-type transistor and the second light-emitting control transistor T5 is an N-type transistor, the first light-emitting control signal and the second light-emitting control signal may also be different, and the embodiment of the present disclosure is not limited to this case.

For example, the first sub-reset control signal may be identical to the second sub-reset control signal, that is, the gate electrode of the first reset transistor T6 and the gate electrode of the second reset transistor T7 may be electrically connected to a same signal line, such as the first reset control signal line Rst1, to receive the same signal (e.g., the first sub-reset control signal). At this time, the display substrate 100 may not be provided with the second reset control signal line Rst2, thereby reducing the number of signal lines. For another example, the gate electrode of the first reset transistor T6 and the gate electrode of the second reset transistor T7 may be electrically connected to different signal lines, i.e., the gate electrode of the first reset transistor T6 is electrically connected to the first reset control signal line Rst1, the gate electrode of the second reset transistor T7 is electrically connected to the second reset control signal line Rst2, and a signal transmitted by the first reset control signal line Rst1 is identical to a signal transmitted by the second reset control signal line Rst2. It should be noted that the first sub-reset control signal and the second sub-reset control signal may also be different.

For example, in some examples, the second sub-reset control signal may be the same as the scanning signal, that is, the gate electrode of the second reset transistor T7 may be electrically connected to the first scanning signal line Ga1 to receive the scanning signal as the second sub-reset control signal.

For example, the first reset power supply terminal Vinit1 and the second reset power supply terminal Vinit2 may be DC reference voltage terminals to output constant DC reference voltages. The first reset power supply terminal Vinit1 and the second reset power supply terminal Vinit2 may be high voltage terminals or low voltage terminals, as long as the first reset power supply terminal Vinit1 and the second reset power supply terminal Vinit2 can provide the first reset signal and the second reset signal to reset the gate electrode of the drive transistor T1 and the first light-emitting voltage application electrode of the light-emitting element 120, and the present disclosure is not limited thereto.

It should be noted that the drive circuit 122, the data writing circuit 126, the storage circuit 127, the threshold compensation circuit 128, and the reset circuit 129 in the pixel circuit as shown in FIGS. 3A-3B are only schematic. The specific structures of the drive circuit 122, the data writing circuit 126, the storage circuit 127, the threshold compensation circuit 128, and the reset circuit 129 can be set according to actual application requirements, and the embodiment of the present disclosure is not specifically limited to this case.

For example, according to the characteristics of transistors, transistors can be divided into N-type transistors and P-type transistors. For the sake of clarity, the embodiments of the present disclosure elaborate the technical scheme of the present disclosure by taking a case that transistors are P-type transistors (e.g., P-type MOS transistors) as an example, that is, in the description of the present disclosure, the drive transistor T1, the data writing transistor T2, the threshold compensation transistor T3, the first light-emitting control transistor T4, the second light-emitting control transistor T5, the first reset transistor T6, the second reset transistor T7, etc. can be P-type transistors. However, the transistors of the embodiments of the present disclosure are not limited to P-type transistors, and those skilled in the art can also use N-type transistors (e.g., N-type MOS transistors) to achieve the functions of one or more transistors in the embodiments of the present disclosure according to actual needs.

It should be noted that the transistors used in the embodiments of the present disclosure may be thin film transistors or field effect transistors or other switching devices with the same characteristics, and the thin film transistors may include oxide semiconductor thin film transistors, amorphous silicon thin film transistors, or polysilicon thin film transistors, etc. A source electrode and a drain electrode of a transistor can be symmetrical in structure, so the source electrode and the drain electrode of the transistor can be indistinguishable in physical structure. In the embodiments of the present disclosure, in order to distinguish two electrodes of transistors, except for a gate electrode serving as a control electrode, one of the two electrodes is directly described as a first electrode, and the other of the two electrodes is described as a second electrode, so the first electrodes and the second electrodes of all or part of the transistors in the embodiment of the present disclosure are interchangeable as required.

It should be noted that, in addition to setting positions, the connection relations, structures, and types, etc. of respective circuits (e.g., the drive circuit 122a, the first light-emitting control circuit 123a, the second light-emitting control circuit 124a, the data writing circuit 126a, the storage circuit 127a, the threshold compensation circuit 128a, and the reset circuit 129a, etc.) in the pixel circuit 121a of the first sub-pixel G1 are the same as the connection relations, structures, and types, etc. of corresponding respective circuits (e.g., the drive circuit 122b, the first light-emitting control circuit 123b, the second light-emitting control circuit 124b, the data writing circuit 126b, the storage circuit 127b, the threshold compensation circuit 128b, and the reset circuit 129b, etc.) in the pixel circuit 121b of the second sub-pixel G2, that is, for example, the structure and type of the drive circuit 122a in the pixel circuit 121a of the first sub-pixel G1 are the same as the structure and type of the drive circuit 122b in the pixel circuit 121b of the second sub-pixel G2. Moreover, the respective circuits in the pixel circuit 121a of the first sub-pixel G1 and the corresponding respective circuits in the pixel circuit 121b of the second sub-pixel G2 can be prepared simultaneously using the same process, for example, the drive circuit 122a in the pixel circuit 121a of the first sub-pixel G1 and the drive circuit 122b in the pixel circuit 121b of the second sub-pixel G2 can be prepared simultaneously using the same patterning process.

It is worth noting that, as shown in FIG. 3B, respective signal lines electrically connected to the respective circuits in the pixel circuit 121a of the first sub-pixel G1 is a first scanning signal line Ga1a, a second scanning signal line Ga2a, a first reset control signal line Rst1a, a second reset control signal line Rst2a, a first reset power supply terminal Vinit1a, a second reset power supply terminal Vinit2a, a first light-emitting control signal line EM1a, a second light-emitting control signal line EM2a, and the data line Vd, respectively. As shown in FIG. 3C, respective signal lines electrically connected to the respective circuits in the pixel circuit 121b of the second sub-pixel G2 is a first scanning signal line Ga1b, a second scanning signal line Ga2b, a first reset control signal line Rst1b, a second reset control signal line Rst2b, a first reset power supply terminal Vinit1b, a second reset power supply terminal Vinit2b, a first light-emitting control signal line EM1b, a second light-emitting control signal line EM2b, and the data line Vd, respectively.

It should be noted that in the embodiments of the present disclosure, in addition to the 7T2C structure as shown in FIG. 3A (i.e., including seven transistors, one capacitor, and one parasitic capacitor), the pixel circuit of the sub-pixel may also have a structure including other numbers of transistors, such as a 6T2C structure or a 9T2C structure, the embodiment of the present disclosure is not limited to this case.

FIGS. 4A-4E are schematic diagrams of various layers of a pixel circuit provided by some embodiments of the present disclosure. The positional relationship of the respective circuits in the pixel circuit on a backplane will be described below with reference to FIGS. 4A-4E. Examples as shown in FIGS. 4A-4E takes the pixel circuit 121a of the first sub-pixel G1 as an example. As shown in FIG. 3B, the pixel circuit 121a of the first sub-pixel G1 includes the drive transistor T1, the data writing transistor T2, the threshold compensation transistor T3, the first light-emitting control transistor T4, the second light-emitting control transistor T5, the first reset transistor T6, and the second reset transistor T7, the first capacitor C11, and the third capacitor C2. FIGS. 4A-4E also show the first scanning signal line Ga1a, the second scanning signal line Ga2a, the first reset control signal line Rst1a, the second reset control signal line Rst2a, a first reset power supply signal line Init1a of the first reset power supply terminal Vinit1a, a second reset power supply signal line Init2a of the second reset power supply terminal Vinit2a, the first light-emitting control signal line EM1a, the second light-emitting control signal line EM2a, the data line Vd, a first power supply signal line VDD1 and a second power supply signal line VDD2 of the first voltage terminal VDD, which are connected to the pixel circuit 121a of the first sub-pixel G1, and the first power supply signal line VDD1 and the second power supply signal line VDD2 are electrically connected to each other. It should be noted that, in the examples as shown in FIGS. 4A to 4E, the first scanning signal line Ga1a and the second scanning signal line Ga2a are the same signal line, the first reset power supply signal line Init1a and the second reset power supply signal line Init2a are the same signal line, the first reset control signal line Rst1a and the second reset control signal line Rst2a are the same signal line, and the first light-emitting control signal line EM1a and the second light-emitting control signal line EM2a are the same signal line.

Figure 4A:
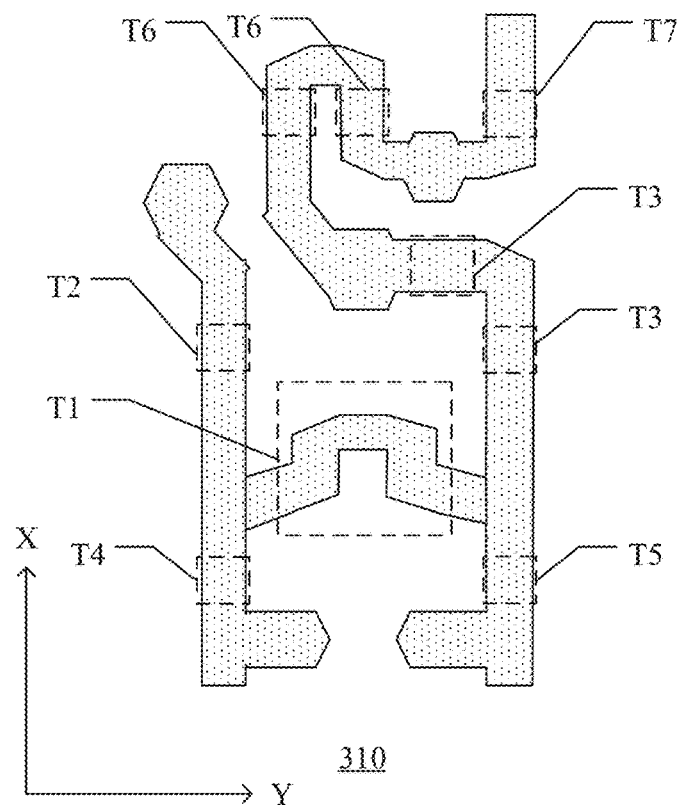
FIGS. 4A-4E are schematic diagrams of various layers of a pixel circuit provided by some embodiments of the present disclosure.

For example, FIG. 4A shows an active semiconductor layer 310 of the pixel circuit 121a. The active semiconductor layer 310 may be patterned using a semiconductor material. The active semiconductor layer 310 may be used to fabricate active layers of the above-mentioned drive transistor T1, the data writing transistor T2, the threshold compensation transistor T3, the first light-emitting control transistor T4, the second light-emitting control transistor T5, the first reset transistor T6, and the second reset transistor T7, and each of the active layers may include a source region, a drain region, and a channel region between the source region and the drain region. For example, the active layers of the respective transistors are integrally provided.

For example, the active semiconductor layer 310 may be prepared by amorphous silicon, polysilicon, oxide semiconductor material, or the like. It should be noted that the above-mentioned source region and drain region may be regions doped with n-type impurities or p-type impurities.

Figure 4B:
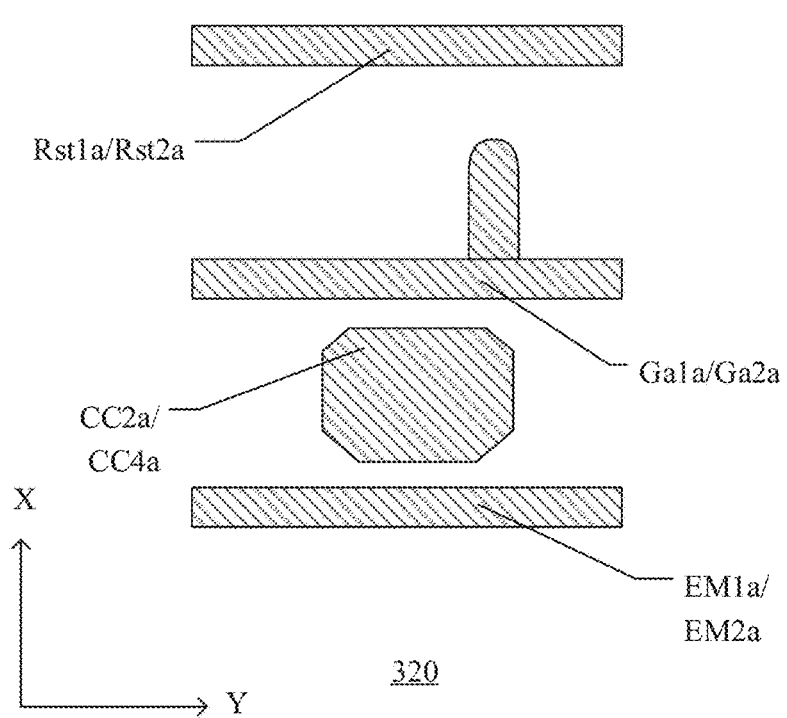

For example, a gate electrode metal layer of the pixel circuit 121a may include a first conductive layer and a second conductive layer. A gate insulation layer (not shown) is formed on the active semiconductor layer 310 to protect the active semiconductor layer 310. FIG. 4B shows a first conductive layer 320 of the pixel circuit 121a, the first conductive layer 320 is disposed on the gate insulation layer so as to be insulated from the active semiconductor layer 310. The first conductive layer 320 may include a second electrode CC2a of the third capacitor C2, the first scanning signal line Ga1a, the second scanning signal line Ga2a, the first reset control signal line Rst1a, the second reset control signal line Rst2a, the first light-emitting control signal line EM1a, the second light-emitting control signal line EM2a, and gate electrodes of the drive transistor T1, the data writing transistor T2, the threshold compensation transistor T3, the first light-emitting control transistor T4, the second light-emitting control transistor T5, the first reset transistor T6, and the second reset transistor T7.

For example, as shown in FIG. 4B, the gate electrode of the data writing transistor T2 may be a portion where the first scanning signal line Ga1a overlaps the active semiconductor layer 310, the gate electrode of the first light-emitting control transistor T4 may be a first portion where the first light-emitting control signal line EM1a/the second light-emitting control signal line EM2a overlaps the active semiconductor layer 310, the gate electrode of the second light-emitting control transistor T5 may be a second portion where the first light-emitting control signal line EM1a/the second light-emitting control signal line EM2a overlaps the active semiconductor layer 310, the gate electrode of the first reset transistor T6 may be a first portion where the first reset control signal line RS1a/the second reset control signal line Rst2a overlaps the active semiconductor layer 310, the gate electrode of the second reset transistor T7 is a second portion where the first reset control signal line Rst1a/the second reset control signal line Rst2a overlaps the active semiconductor layer 310, the threshold compensation transistor T3 may be a thin film transistor with a double gate structure, a first gate electrode of the threshold compensation transistor T3 may be a portion where the second scanning signal line Ga2a overlaps the active semiconductor layer 310, and a second gate electrode of the threshold compensation transistor T3 may be a portion where a protrusion portion protruding from the second scanning signal line Ga2a overlaps the active semiconductor layer 310. As shown in FIGS. 3B and 4B, the gate electrode of the drive transistor T1 may be the second electrode CC4a of the first capacitor C11 and the second electrode CC2a of the third capacitor C2.

It should be noted that respective dashed rectangular frames in FIG. 4A shows respective portions where the first conductive layer 320 overlaps the active semiconductor layer 310.

For example, as shown in FIG. 4B, the first scanning signal line Ga1a/the second scanning signal line Ga2a, the first reset control signal line Rst1a/the second reset control signal line Rst2a, and the first light-emitting control signal line EM1a/the second light-emitting control signal line EM2a are arranged along a first direction X. The first scanning signal line Ga1a/the second scanning signal line Ga2a is located between the first reset control signal line Rst1a/the second reset control signal line Rst2a and the first light-emitting control signal line EM1a/second light-emitting control signal line EM2a.

For example, in the first direction X, the second electrode CC4a of the first capacitor C11 (i.e., the second electrode CC2a of the third capacitor C2) is located between the first scanning signal line Ga1a/the second scanning signal line Ga2a and the first light-emitting control signal line EM1/the second light-emitting control signal line EM2a. The protrusion portion protruding from the second scanning signal line Ga2a is located on a side of the second scanning signal line Ga2a away from the first light-emitting control signal line EM1a/the second light-emitting control signal line EM2a.

For example, as shown in FIG. 4A, in the first direction X, the gate electrode of the data writing transistor T2, the gate electrode of the threshold compensation transistor T3, the gate electrode of the first reset transistor T6, and the gate electrode of the second reset transistor T7 are all located on a first side of the gate electrode of the drive transistor T1, the gate electrode of the first light-emitting control transistor T4 and the gate electrode of the second light-emitting control transistor T5 are both located on a second side of the gate electrode of the drive transistor T1, and for example, in the example as shown in FIGS. 6A-6E, the first side and the second side of the gate electrode of the drive transistor T1 of the pixel circuit 121a of the first sub-pixel G1 are opposite sides of the gate electrode of the drive transistor T1 in the first direction X. For example, as shown in FIGS. 4A-4E, the first side of the gate electrode of the drive transistor T1 of the pixel circuit 121a of the first sub-pixel G1 may be an upper side of the gate electrode of the drive transistor T1, and the second side of the gate electrode of the drive transistor T1 of the pixel circuit 121a of the first sub-pixel G1 may be a lower side of the gate electrode of the drive transistor T1.

For example, in some embodiments, as shown in FIGS. 4A-4E, in a second direction Y, the gate electrode of the data writing transistor T2 and the gate electrode of the first light-emitting control transistor T4 are both located on a third side of the gate electrode of the drive transistor T1, the first gate electrode of the threshold compensation transistor T3, the gate electrode of the second light-emitting control transistor T5, and the gate electrode of the second reset transistor T7 are all located on a fourth side of the gate electrode of the drive transistor T1, for example, in the example shown in FIGS. 4A-4E, the third side and the fourth side of the gate electrode of the drive transistor T1 of the pixel circuit 121a of the first sub-pixel G1 are opposite sides of the gate electrode of the drive transistor T1 in the second direction Y, for example, as shown in FIGS. 4A-4E, the third side of the gate electrode of the drive transistor T1 of the pixel circuit 121a of the first sub-pixel G1 may be a right side of the gate electrode of the drive transistor T1 of the pixel circuit 121a of the first sub-pixel G1, and the fourth side of the gate electrode of the drive transistor T1 of the pixel circuit 121a of the first sub-pixel G1 may be a left side of the gate electrode of the drive transistor T1 of the pixel circuit 121a of the first sub-pixel G1.

Figure 4C:
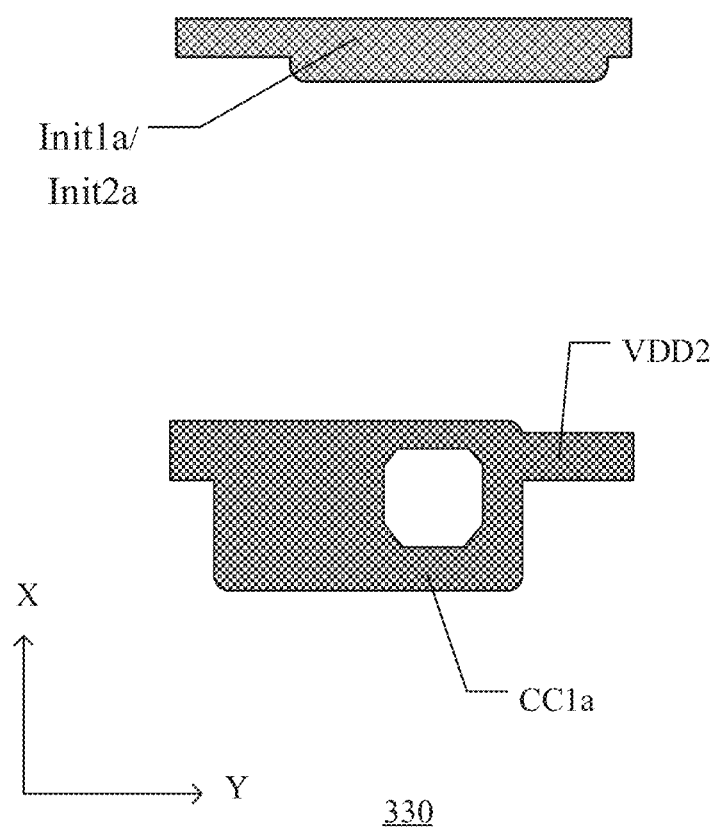

For example, a first insulation layer (not shown) is formed on the first conductive layer 320 to protect the first conductive layer 320. FIG. 4C shows a second conductive layer 330 of the pixel circuit 121a. The second conductive layer 330 includes a first electrode CC1a of the third capacitor C2, the first reset power supply signal line Init1a, the second reset power supply signal line Init2a, and the second power supply signal line VDD2. The second power supply signal line VDD2 is formed integrally with the first electrode CC1a of the third capacitor C2. The first electrode CC1a of the third capacitor C2 and the second electrode CC2a of the third capacitor C2 at least partially overlap to form the third capacitor C2.

Figure 4D:
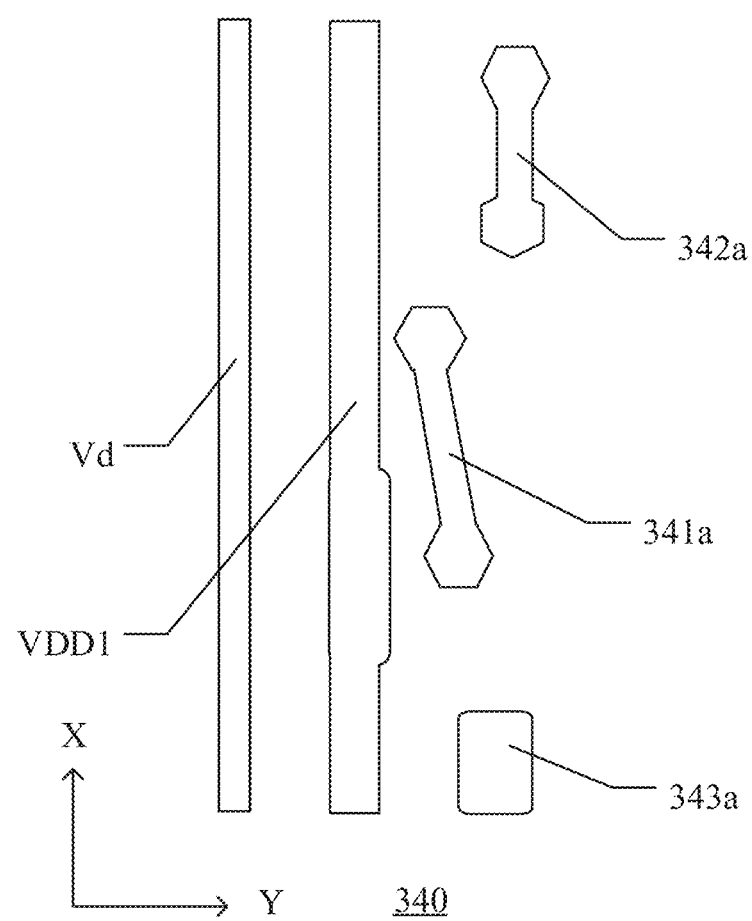

For example, a second insulation layer (not shown) is formed on the second conductive layer 330 to protect the second conductive layer 330. FIG. 4D shows a source-drain electrode metal layer 340 of the pixel circuit 121a, the source-drain electrode metal layer 340 includes the data line Vd and the first power supply signal line VDD1.

Figure 4E:
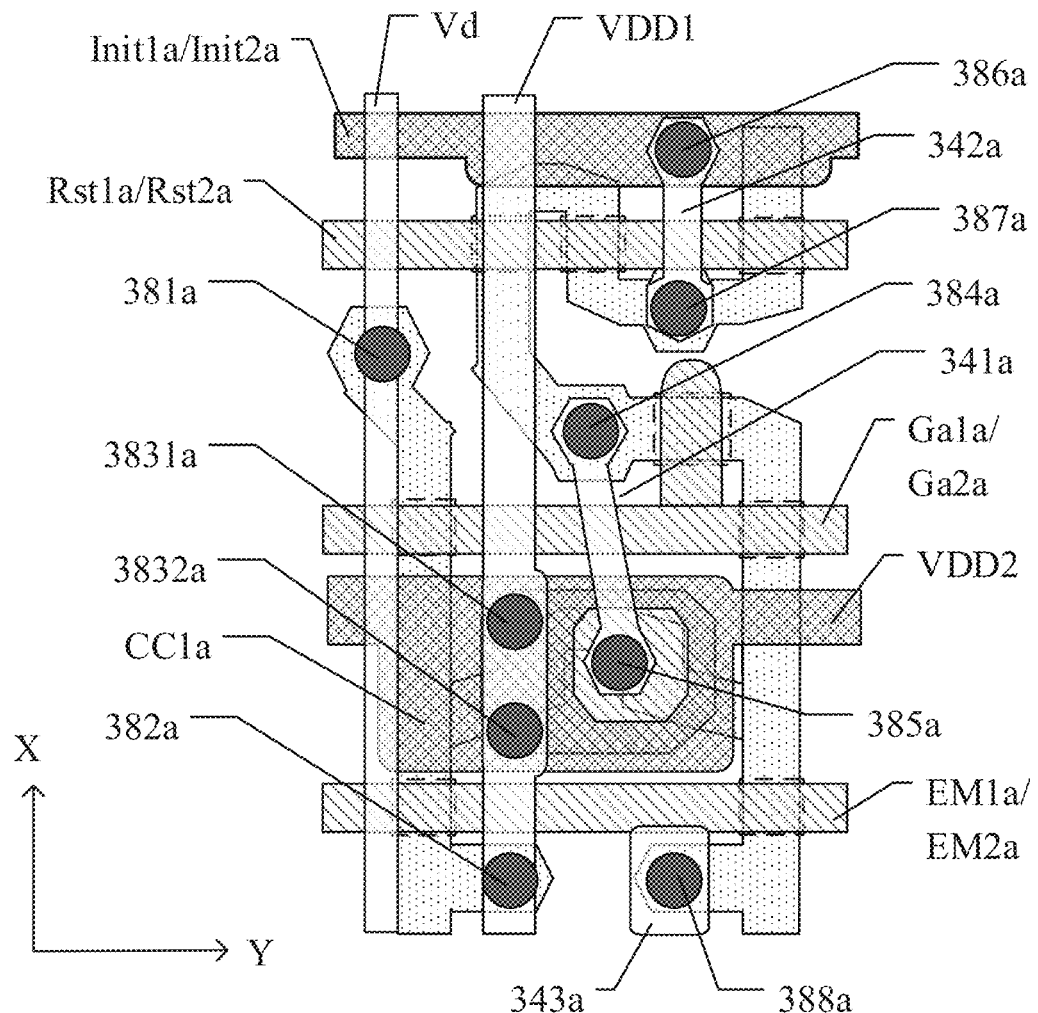

FIG. 4E is a schematic diagram of a stacked positional relationship of the above-mentioned active semiconductor layer 310, the first conductive layer 320, the second conductive layer 330, and the source-drain electrode metal layer 340. As shown in FIGS. 4D and 4E, the data line Vd is connected to the source region of the data writing transistor T2 in the active semiconductor layer 310 through at least one via hole (e.g., via hole 381a) in the gate insulation layer, the first insulation layer, and the second insulation layer. The first power supply signal line VDD1 is connected to the source region of the corresponding first light-emitting control transistor T4 in the active semiconductor layer 310 through at least one via hole (e.g., via hole 382a) in the gate insulation layer, the first insulation layer, and the second insulation layer. The first power supply signal line VDD1 is connected to the first electrode CC1a of the third capacitor C2 in the second conductive layer 330 through at least one via hole (e.g., via hole 3832a) in the second insulation layer. The first power supply signal line VDD1 is also connected to the second power supply signal line VDD2 in the second conductive layer 330 through at least one via hole (e.g., via hole 3831a) in the second insulation layer.

For example, as shown in FIGS. 4D and 4E, the source-drain electrode metal layer 340 further includes a first connection portion 341a, a second connection portion 342a, and a third connection portion 343a. One terminal of the first connection portion 341a is connected to the drain region of the corresponding threshold compensation transistor T3 in the active semiconductor layer 310 through at least one via hole (e.g., via hole 384a) in the gate insulation layer, the first insulation layer, and the second insulation layer, and the other terminal of the first connection portion 341a is connected to the gate electrode of the drive transistor T1 (i.e., the second electrode CC2a of the third capacitor C2) in the first conductive layer 320 through at least one via hole (e.g., via hole 385a) in the first insulation layer and the second insulation layer. One terminal of the second connection portion 342a is connected to the first reset power supply signal line Init1a/the second reset power supply signal line Init2a through one via hole (e.g., via hole 386a) in the second insulation layer, and the other terminal of the second connection portion 342a is connected to the drain region of the second reset transistor T7 in the active semiconductor layer 310 through at least one via hole (e.g., via hole 387a) in the gate insulation layer, the first insulation layer, and the second insulation layer. The third connection portion 343a is connected to the drain region of the second light-emitting control transistor T5 in the active semiconductor layer 310 through at least one via hole (e.g., via hole 388a) in the gate insulation layer, the first insulation layer, and the second insulation layer.

For example, an intermediate layer (not shown) is formed on the above-mentioned source-drain electrode metal layer 340 to protect the source-drain electrode metal layer 340. The first light-emitting voltage application electrode of the light-emitting element of each sub-pixel may be on a side of the intermediate layer away from the base substrate.

For example, as shown in FIGS. 4A-4E, in the first direction X, the first scanning signal line Ga1a, the second scanning signal line Ga2a, the first reset control signal line Rst1a, the second reset control signal line Rst2a, and the first reset p power supply signal line Init1a, and the second reset power supply signal line Init2a are all located on the first side of the gate electrode of the drive transistor T1 of the pixel circuit 121a of the first sub-pixel G1, and the first light-emitting control signal line EM1a and the second light-emitting control signal line EM2a are both located on the second side of the drive transistor T1 of the pixel circuit 121a of the first sub-pixel G1.

For example, the first scanning signal line Ga1a, the second scanning signal line Ga2a, the first reset control signal line Rst1a, the second reset control signal line Rst2a, the first light-emitting control signal line EM1a, the second light-emitting control signal line EM2a, the first reset power supply signal line Init1a, and the second reset power supply signal line Init2a all extend in the second direction Y, and the data line Vd extends in the first direction X.

For example, the first power supply signal line VDD1 extends in the first direction X and the second power supply signal line VDD2 extends in the second direction Y. The signal lines of the first voltage terminal VDD are gridded on the display substrate, that is, the first power supply signal line VDD1 and the second power supply signal line VDD2 are arranged in a grid pattern on the entire display substrate, so that a resistance of the signal lines of the first voltage terminal VDD is small and a voltage drop of the signal lines of the first voltage terminal VDD is low, and further the stability of the power supply voltage provided by the first voltage terminal VDD can be improved.

For example, the first scanning signal line Ga1a, the second scanning signal line Ga2a, the first reset control signal line Rst1a, the second reset control signal line Rst2a, the first light-emitting control signal line EM1a, and the second light-emitting control signal line EM2a are located on the same layer, and the first reset power supply signal line Init1a, the second reset power supply signal line Init2a, and the second power supply signal line VDD2 are located on the same layer. The first power supply signal line VDD1 and the data line Vd are located on the same layer.

It should be noted that the positional arrangement relationship of the drive circuit, the first light-emitting control circuit, the second light-emitting control circuit, the data writing circuit, the storage circuit, the threshold compensation circuit, and the reset circuit, etc. in each pixel circuit is not limited to the examples as shown in FIGS. 4A-4E, and according to actual application requirements, positions of the drive circuit, the first light-emitting control circuit, the second light-emitting control circuit, the data writing circuit, the storage circuit, the threshold compensation circuit, and the reset circuit may be specifically set.

Figure 5A:
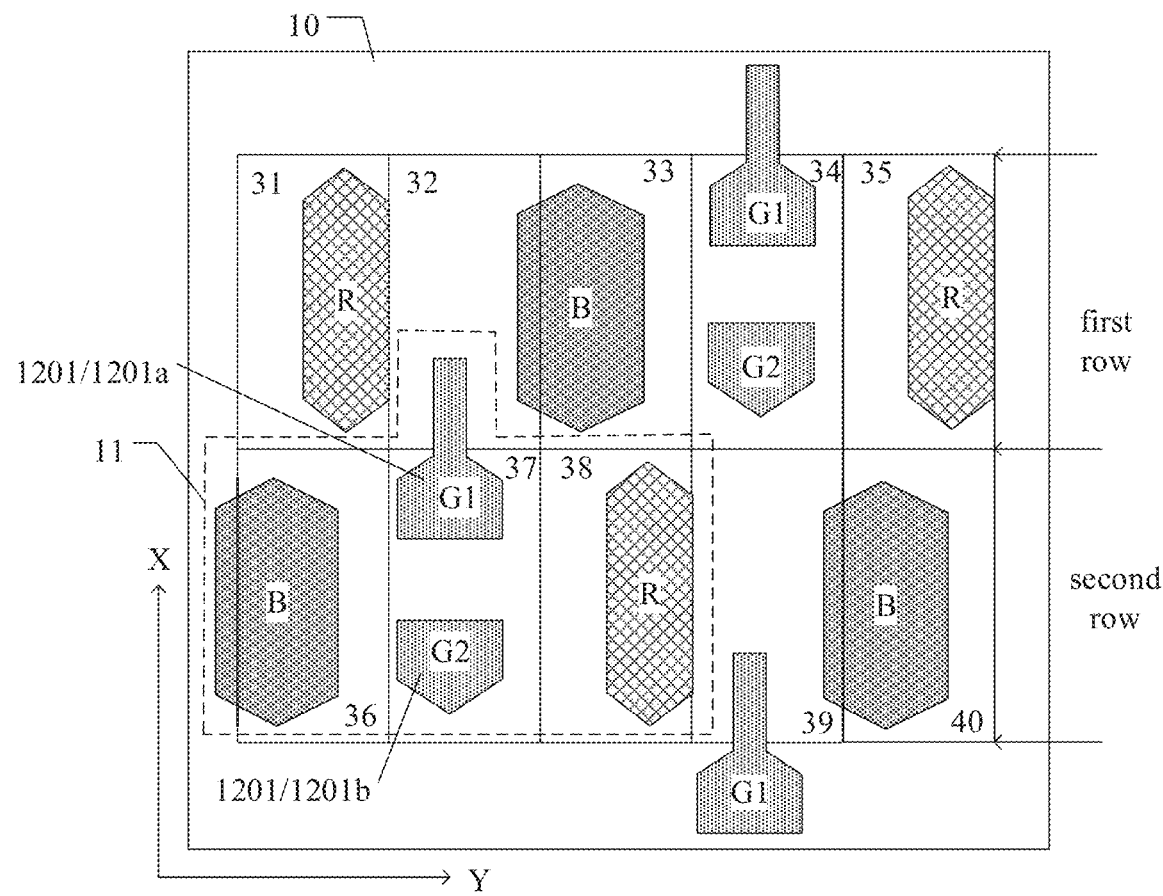
FIG. 5A is a plane schematic diagram of a display substrate provided by some embodiments of the present disclosure.
Figure 5B:
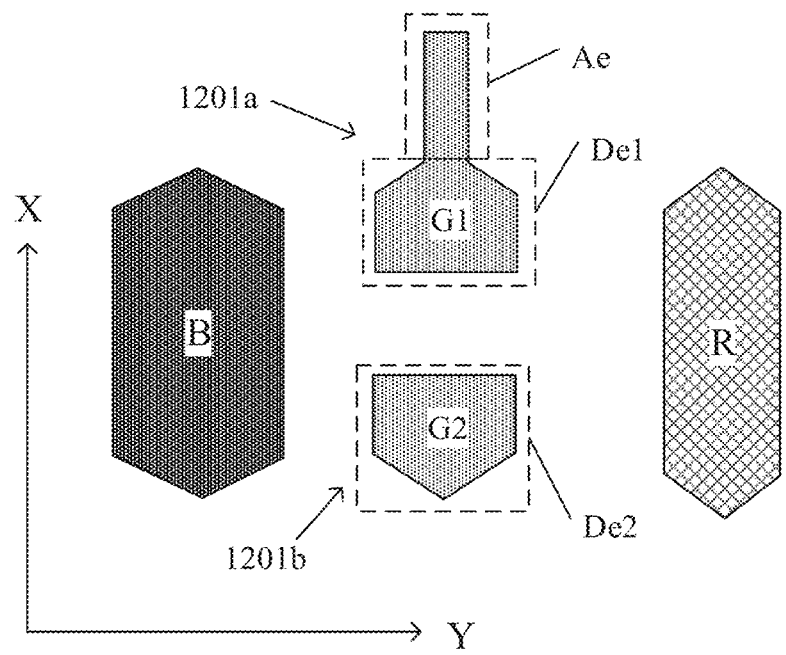
FIG. 5B is a plane schematic diagram of a repeating unit provided by some embodiments of the present disclosure.
Figure 6A:
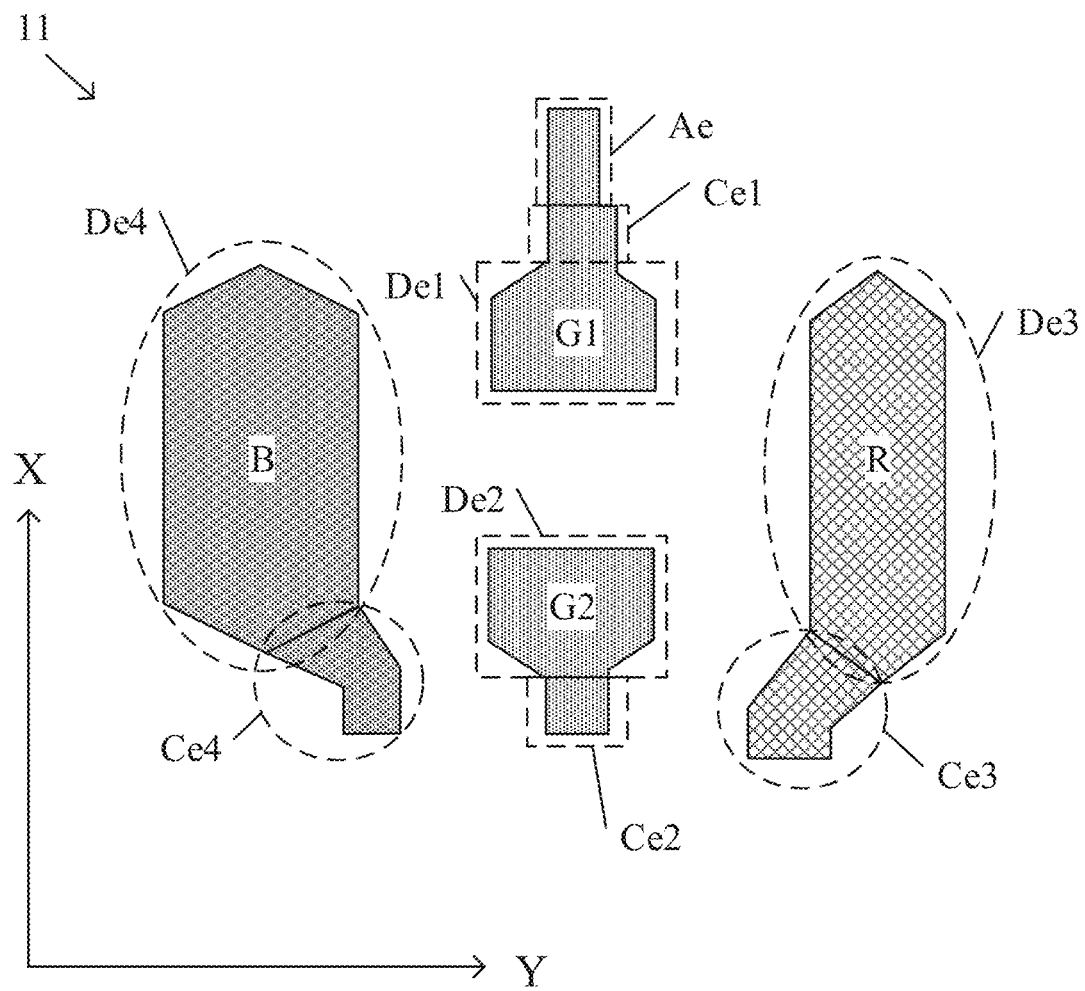
FIG. 6A is a plane schematic diagram of another repeating unit provided by some embodiments of the present disclosure.
Figure 6B:
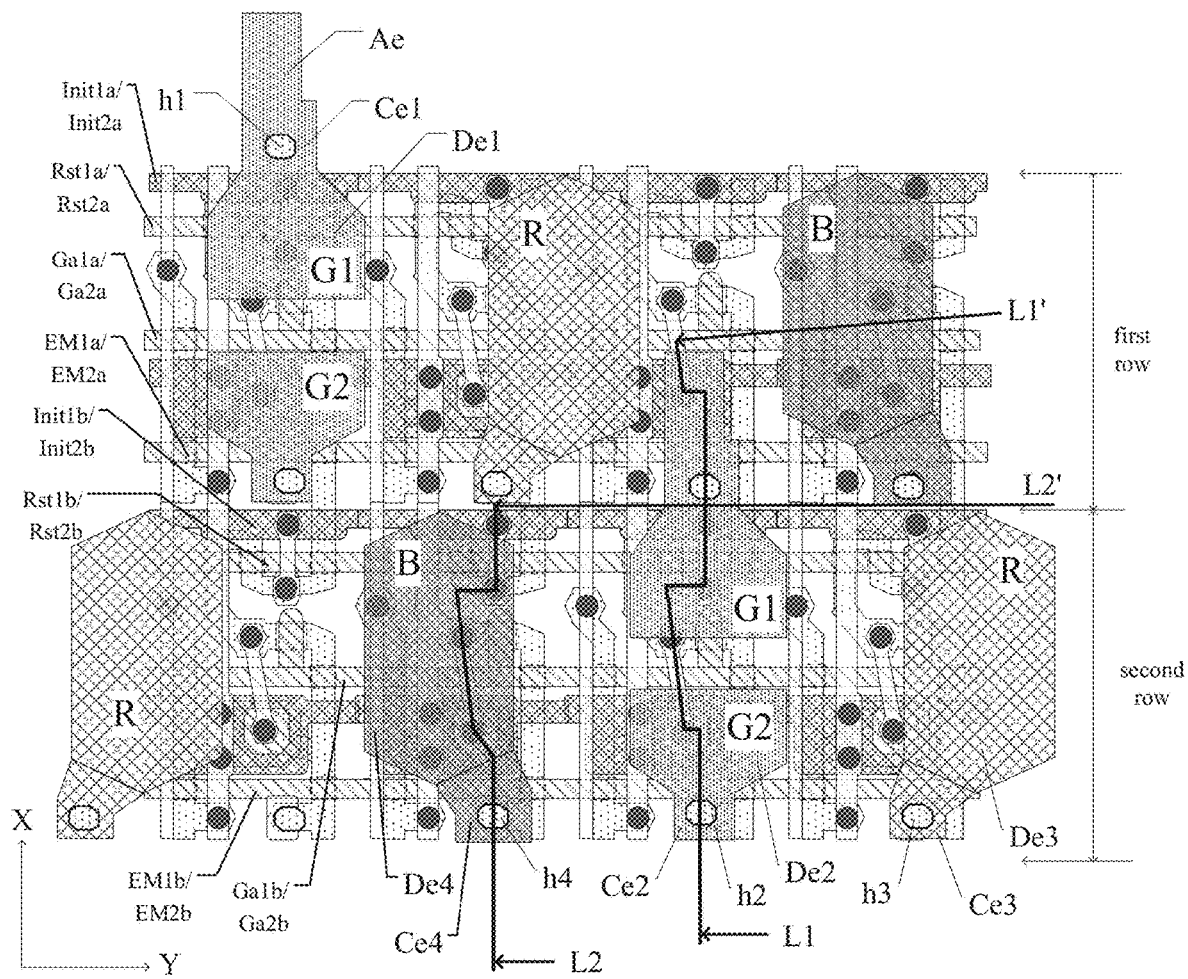
FIG. 6B is a layout diagram of a display substrate provided by some embodiments of the present disclosure.
Figure 6C:
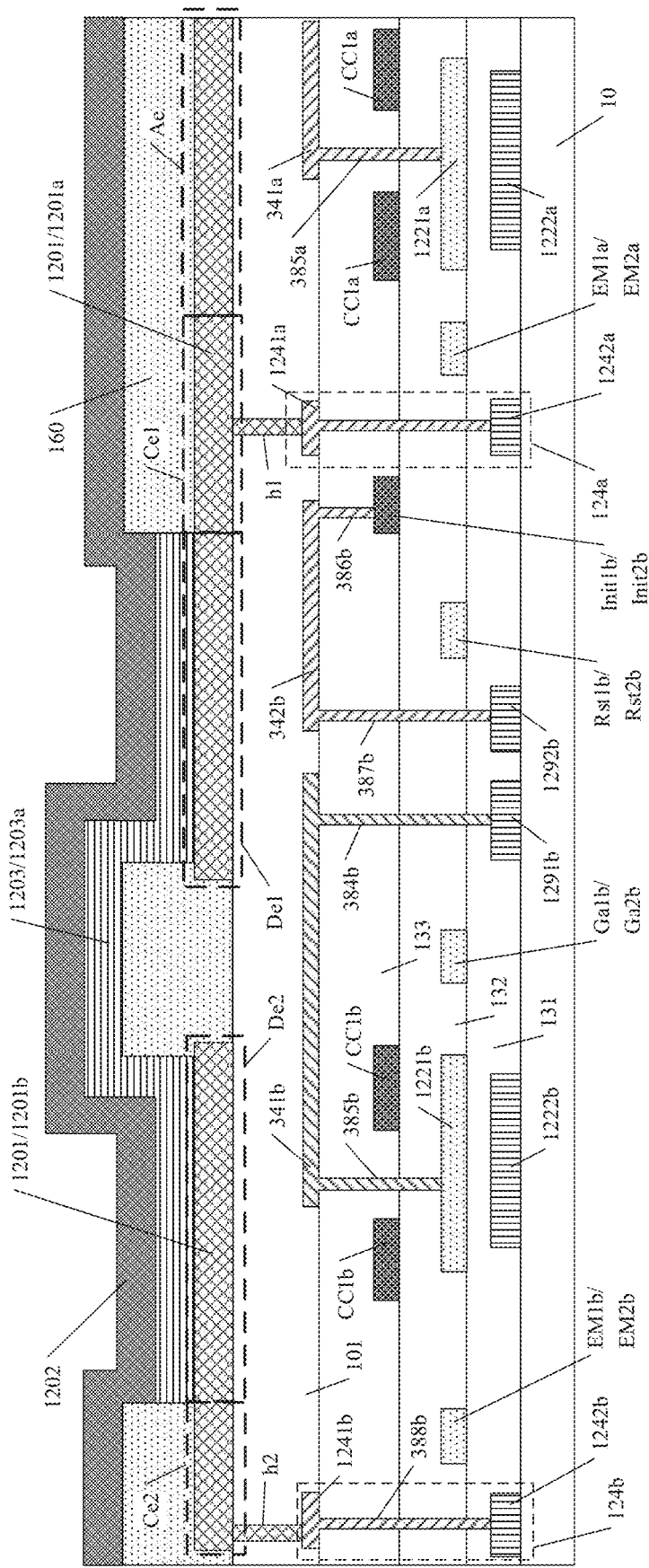
FIG. 6C is a cross-sectional structural schematic diagram of a line L1-L1' in FIG. 6B.
Figure 6D:
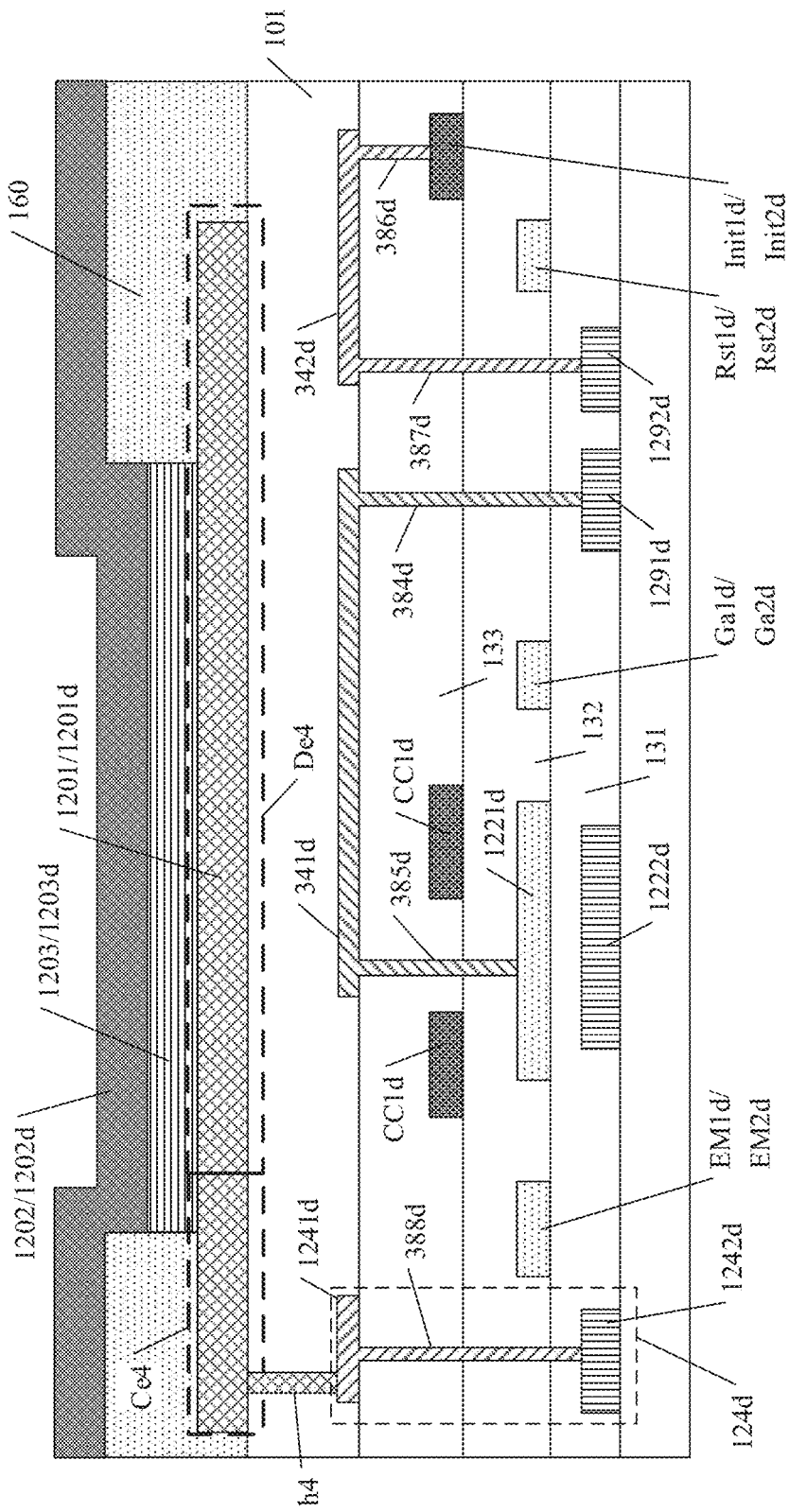
FIG. 6D is a cross-sectional structural schematic diagram of a line L2-L2' in FIG. 6B.
Figure 6E:
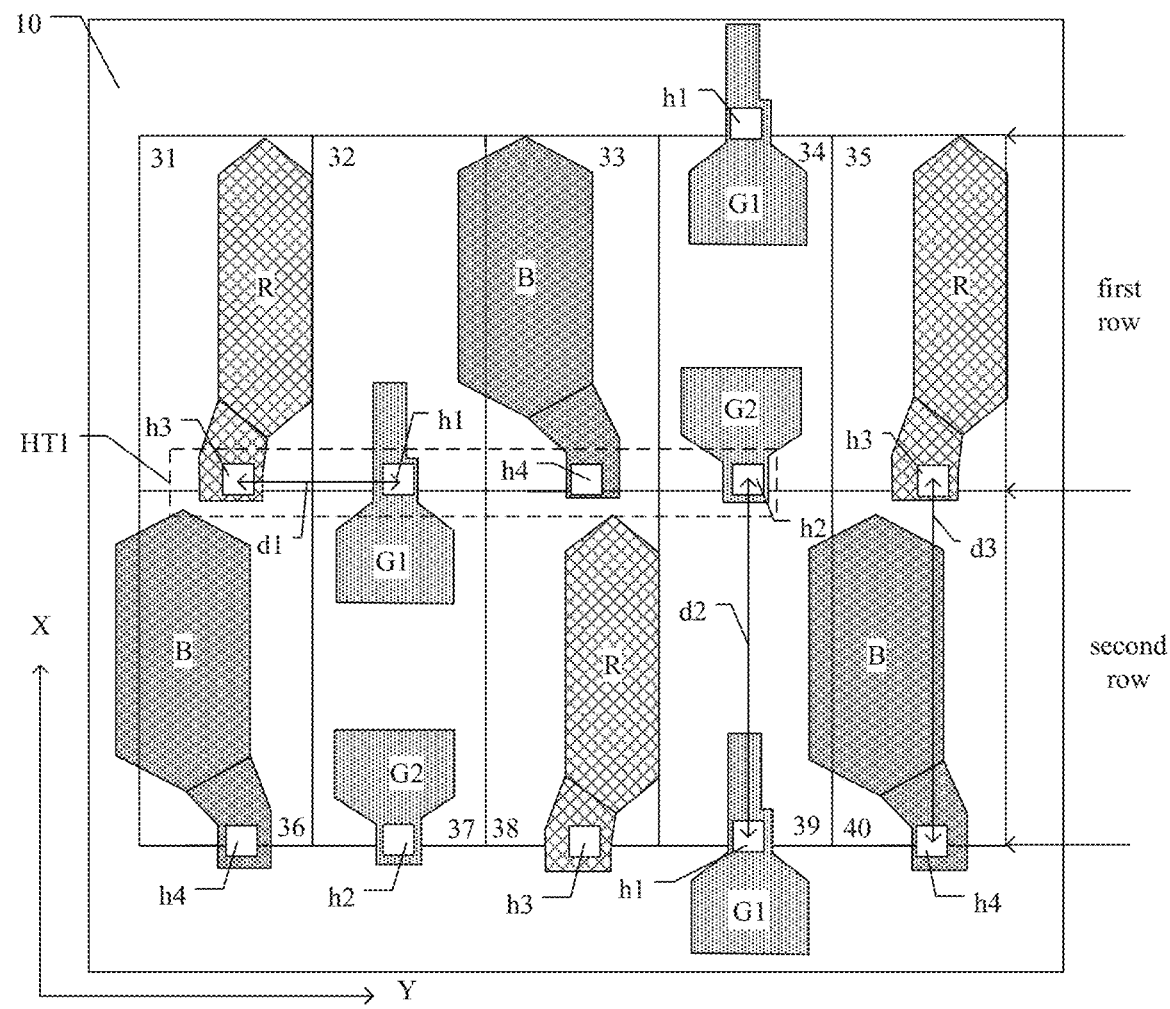
FIG. 6E is a plane schematic diagram of another display substrate provided by some embodiments of the present disclosure.

FIG. 5A is a plane schematic diagram of a display substrate according to some embodiments of the present disclosure; FIG. 5B is a plane schematic diagram of a repeating unit provided by some embodiments of the present disclosure; FIG. 6A is a plane schematic diagram of another repeating unit provided by some embodiments of the present disclosure;

FIG. 6B is a layout diagram of a display substrate provided by some embodiments of the present disclosure; FIG. 6C is a cross-sectional structural schematic diagram of a line L1-L1' in FIG. 6B; FIG. 6D is a cross-sectional structural schematic diagram of a line L2-L2' in FIG. 6B; and FIG. 6E is a plane schematic diagram of another display substrate provided by some embodiments of the present disclosure.

For example, as shown in FIG. 5A, in some embodiments of the present disclosure, the pixel arrangement structure in the display substrate 10 may be a GGRB pixel arrangement structure to increase the PPI (pixel per inch) of the display panel including the display substrate 10, thereby increasing a visual resolution of the display panel under the same display resolution. For example, each repeating unit 11 includes four sub-pixels, the four sub-pixels are the first sub-pixel G1, the second sub-pixel G2, a third sub-pixel R, and a fourth sub-pixel B, respectively, and the four sub-pixels can adopt GGRB arrangement. It should be noted that only two complete repeating units 11 are shown in FIG. 5A, but the present disclosure is not limited thereto. The display substrate 10 includes a plurality of repeating units 11, and the plurality of repeating units 11 are arranged in an array along the first direction X and the second direction Y.

For example, as shown in FIG. 5A, regions 31 to 40 may be regions where pixel circuits of respective sub-pixels on the base substrate 10 are located, for example, regions 31 to 35 are located in a first row and regions 36 to 40 are located in a second row; regions 31 and 36 are in a first column, regions 32 and 37 are in a second column, regions 33 and 38 are in a third column, regions 34 and 39 are in a fourth column, and regions 35 and 40 are in a fifth column. For example, in the example as shown in FIG. 5A, in the repeating unit 11 circled by dotted lines, the pixel circuit of the first sub-pixel G1 is located in the region 32, the pixel circuit of the second sub-pixel G2 is located in the region 37, the pixel circuit of the third sub-pixel R is located in the region 38, and the pixel circuit of the fourth sub-pixel B is located in the region 36.

It should be noted that in the present disclosure, "row" may represent a row corresponding to areas where respective pixel circuits are located, and "column" may represent a column corresponding to areas where respective pixel circuits are located.

For example, the light-emitting element 120 is configured to receive a light-emitting signal (e.g., may be a current signal) during operation and emit light of an intensity corresponding to the light-emitting signal. The light-emitting element 120 may be a light-emitting diode, and the light-emitting diode may be, for example, an organic light-emitting diode (OLED), a quantum dot light-emitting diode (QLED), or the like, but embodiments of the present disclosure are not limited thereto.

For example, as shown in FIG. 6C, the light-emitting element 120 includes a first light-emitting voltage application electrode 1201, a second light-emitting voltage application electrode 1202, and a light-emitting layer 1203 between the first light-emitting voltage application electrode 1201 and the second light-emitting voltage application electrode 1202. For example, as shown in FIG. 6C, the light-emitting element of the first sub-pixel G1 includes a first light-emitting voltage application electrode 1201a, the second light-emitting voltage application electrode 1202, and a light-emitting layer 1203a, and the light-emitting element of the second sub-pixel G2 includes a first light-emitting voltage application electrode 1201b, the second light-emitting voltage application electrode 1202, and a light-emitting layer 1203a.

For example, as shown in FIG. 6C, an orthographic projection of the first light-emitting voltage application electrode 1201a of the light-emitting element of the first sub-pixel G1 on the base substrate 10 at least partially overlaps with an orthographic projection of a control terminal 1221a of the drive circuit of the pixel circuit of the first sub-pixel G1 on the base substrate 10, and an orthographic projection of the first light-emitting voltage application electrode 1201b of the light-emitting element of the second sub-pixel G2 on the base substrate 10 at least partially overlaps with an orthographic projection of a control terminal 1221b of the drive circuit of the pixel circuit of the second sub-pixel G2 on the base substrate 10.

For example, the first light-emitting voltage application electrode 1201a of the light-emitting element of the first sub-pixel G1 and the first light-emitting voltage application electrode 1201b of the light-emitting element of the second sub-pixel G2 may be located on the same layer, and the second light-emitting voltage application electrode 1202 of the light-emitting element of the first sub-pixel G1 and the second light-emitting voltage application electrode 1202 of the light-emitting element of the second sub-pixel G2 may be integrally provided.

For example, an orthographic projection of the light-emitting layer 1203a of the light-emitting element of the first sub-pixel G1 on the base substrate 10 is continuous with an orthographic projection of the light-emitting layer 1203a of the light-emitting element of the second sub-pixel G2 on the base substrate 10, that is, the light-emitting layer 1203a of the light-emitting element of the first sub-pixel G1 and the light-emitting layer 1203a of the light-emitting element of the second sub-pixel G2 can be prepared by an opening hole in a high-precision metal mask (FMM) plate, which can effectively reduce the process difficulty of FMM. For example, the light-emitting layer 1203a of the light-emitting element of the first sub-pixel G1 and the light-emitting layer 1203a of the light-emitting element of the second sub-pixel G2 are integrated.

For example, materials of the light-emitting layers 1203 of respective sub-pixels may be selected according to different colors of light emitted by the light-emitting elements 120 of respective sub-pixels. A material of the light-emitting layer 1203 of each sub-pixel includes a fluorescent light-emitting material, a phosphorescent light-emitting material, or the like. For example, in some embodiments, the first light-emitting voltage application electrode 1201 is an anode, the second light-emitting voltage application electrode 1202 is a cathode, and both the first light-emitting voltage application electrode 1201 and the second light-emitting voltage application electrode 1202 are prepared by conductive materials. It should be noted that in some examples, a first organic layer is disposed between the first light-emitting voltage application electrode 1201 and the light-emitting layer 1203, and a second organic layer is disposed between the second light-emitting voltage application electrode 1202 and the light-emitting layer 1203. The first organic layer and the second organic layer are used for planarization and may be omitted.

For example, in each repeating unit 11, a color of light emitted by the light-emitting element 120a of the first sub-pixel G1 is the same as a color of light emitted by the light-emitting element 120b of the second sub-pixel G2, that is, the first sub-pixel G1 and the second sub-pixel G2 are sub-pixels of the same color. For example, the first sub-pixel G1 and the second sub-pixel G2 are sensitive color sub-pixels. In a case where the display substrate 100 adopts a red green blue (RGB) display mode, the above sensitive color is green, that is, the first sub-pixel G1 and the second sub-pixel G2 are both green sub-pixels. For example, the third sub-pixel R may be a red sub-pixel and the fourth sub-pixel B may be a blue sub-pixel.

For example, four sub-pixels in each repeating unit 11 may form two virtual pixels, and the third sub-pixel R and the fourth sub-pixel B in the repeating unit 11 are respectively shared by the two virtual pixels. The sub-pixels in the plurality of repeating units 11 form a pixel array. In a row direction of the pixel array, the density of sub-pixels is 1.5 times the density of virtual pixels, and in a column direction of the pixel array, the density of sub-pixels is 1.5 times the density of virtual pixels.

For example, the first sub-pixel G1 and the second sub-pixel G2 belong to two virtual pixels respectively.

It should be noted that, first, because the third sub-pixel R and the fourth sub-pixel B are shared by two adjacent virtual pixels, a boundary of each virtual pixel is also very blurred, and therefore, the embodiment of the present disclosure does not limit shapes of respective virtual pixels. Second, the division of virtual pixels is related to the driving mode, and the specific division mode of virtual pixels can be determined according to the actual driving mode, which is not specifically limited by the present disclosure.

For example, as shown in FIG. 6C, the orthographic projection of the control terminal 1221a of the drive circuit of the pixel circuit of the first sub-pixel G1 on the base substrate 10 is located within the orthographic projection of the first light-emitting voltage application electrode 1201a of the light-emitting element 120a of the first sub-pixel G1 on the base substrate 10. The orthographic projection of the control terminal 1221b of the drive circuit of the pixel circuit of the second sub-pixel G2 on the base substrate 10 is located within the orthographic projection of the first light-emitting voltage application electrode 1201b of the light-emitting element 120b of the second sub-pixel G2 on the base substrate 10. That is, the orthographic projection of the first light-emitting voltage application electrode 1201a of the light-emitting element 120a of the first sub-pixel G1 on the base substrate 10 completely covers the orthographic projection of the control terminal 1221a of the drive circuit of the pixel circuit of the first sub-pixel G1 on the base substrate 10, the orthographic projection of the first light-emitting voltage application electrode 1201b of the light-emitting element 120b of the second sub-pixel G2 on the base substrate 10 completely covers the orthographic projection of the control terminal 1221b of the drive circuit of the pixel circuit of the second sub-pixel G2 on the base substrate 10, for example, an area of the orthographic projection of the first light-emitting voltage application electrode 1201a of the light-emitting element 120a of the first sub-pixel G1 on the base substrate 10 may be larger than an area of the orthographic projection of the control terminal 1221a of the drive circuit of the pixel circuit of the first sub-pixel G1 on the base substrate 10, and an area of the orthographic projection of the first light-emitting voltage application electrode 1201b of the light-emitting element 120b of the second sub-pixel G2 on the base substrate 10 may be larger than an area of the orthographic projection of the control terminal 1221b of the drive circuit of the pixel circuit of the second sub-pixel G2 on the base substrate 10.

For example, as shown in FIG. 3B, in a case where the drive circuit 122a of the pixel circuit of the first sub-pixel G1 includes the drive transistor T1, the control terminal 1221a of the drive circuit 122a of the pixel circuit of the first sub-pixel G1 is the gate electrode of the drive transistor T1 of the pixel circuit of the first sub-pixel G1, then the orthographic projection of the first light-emitting voltage application electrode of the light-emitting element 120a of the first sub-pixel G1 on the base substrate 10 at least partially overlaps with an orthographic projection of the gate electrode of the drive transistor T1 of the first sub-pixel G1 on the base substrate 10; and as shown in FIG. 3C, in a case where the drive circuit 122b of the pixel circuit of the second sub-pixel G2 includes the drive transistor T1, the control terminal 1221b of the drive circuit 122b of the pixel circuit of the second sub-pixel G2 is the gate electrode of the drive transistor T1 of the pixel circuit of the second sub-pixel G2, and the orthographic projection of the first light-emitting voltage application electrode of the light-emitting element 120b of the second sub-pixel G2 on the base substrate 10 at least partially overlaps with an orthographic projection of the gate electrode of the drive transistor T1 of the second sub-pixel G2 on the base substrate 10.

For example, the orthographic projection of the gate electrode of the drive transistor T1 of the first sub-pixel G1 on the base substrate 10 is located within the orthographic projection of the first light-emitting voltage application electrode of the light-emitting element 120a of the first sub-pixel G1 on the base substrate 10; and the orthographic projection of the gate electrode of the drive transistor T1 of the second sub-pixel G2 on the base substrate 10 is located within the orthographic projection of the first light-emitting voltage application electrode of the light-emitting element 120b of the second sub-pixel G2 on the base substrate 10.

For example, as shown in FIG. 6C, an area of an overlapping portion between the orthographic projection of the control terminal 1221a of the drive circuit of the pixel circuit of the first sub-pixel G1 on the base substrate 10 and the orthographic projection of the first light-emitting voltage application electrode 1201a of the light-emitting element of the first sub-pixel G1 on the base substrate 10 is a first area A1. An area of an overlapping portion between the orthographic projection of the control terminal 1221b of the drive circuit of the pixel circuit of the second sub-pixel G2 on the base substrate 10 and the orthographic projection of the first light-emitting voltage application electrode 1201b of the light-emitting element of the second sub-pixel G2 on the base substrate 10 is a second area A2, and a ratio of the first area A1 to the second area A2 satisfies a following relation:

$$A\min \leq A1/A2 \leq A\max,$$

where A1 represents the first area, A2 represents the second area, Amin represents a minimum ratio threshold and is 90%, and Amax represents a maximum ratio threshold and is 110%.

For example, in some examples, the first area A1 may be greater than or equal to the second area A2, in this case, the minimum ratio threshold Amin may be 90%, and the maximum ratio threshold Amax may also be 100%; and in other examples, the first area A1 may be smaller than the second area A2, in this case, the minimum ratio threshold Amin may be 95% and the maximum ratio threshold Amax may be 105%. The embodiment of the present disclosure is not specifically limited to specific values of the minimum ratio threshold and the maximum ratio threshold, as long as the difference between the first area A1 and the second area A2 is ensured to be small (e.g., less than 10%), and furthermore, the difference between the parasitic capacitance between the first light-emitting voltage application electrode 1201a of the light-emitting element of the first sub-pixel G1 and the control terminal 1221a of the drive circuit of the first sub-pixel G1 (i.e., the first capacitor C11 as shown in FIG. 3B) and the parasitic capacitance between the first light-emitting voltage application electrode 1201b of the light-emitting element of the second sub-pixel G2 and the control terminal 1221b of the drive circuit of the second sub-pixel G2 (i.e., the second capacitor C12 as shown in FIG. 3C) can be ensured to be small (e.g., less than 10%), thereby improving the display effect of the display panel including the display substrate 100. For example, in a case where the ratio of the first area A1 and the second area A2 is between the above-mentioned minimum ratio threshold and the maximum ratio threshold, even in a low gray scale (e.g., 64 gray scales), that is, in a case where the human eye recognition capability is high, the user may not be able to see the brightness difference between the first sub-pixel G1 and the second sub-pixel G2, thereby effectively improving the display effect of the display panel and enhancing the user experience.

For example, as shown in FIGS. 5A and 5B, a shape of the first light-emitting voltage application electrode 1201a of the light-emitting element 120a of the first sub-pixel G1 is different from a shape of the first light-emitting voltage application electrode 1201b of the light-emitting element of the second sub-pixel G2. For example, in some examples, the shape of the first light-emitting voltage application electrode 1201a of the light-emitting element of the first sub-pixel G1 may be an octagon, and the shape of the first light-emitting voltage application electrode 1201b of the light-emitting element of the second sub-pixel G2 may be pentagonal.

For example, in each repeating unit 11, the area of the orthographic projection of the first light-emitting voltage application electrode 1201a of the light-emitting element of the first sub-pixel G1 on the base substrate 10 is different from the area of the orthographic projection of the first light-emitting voltage application electrode 1201b of the light-emitting element of the second sub-pixel G2 on the base substrate 10, and the area of the orthographic projection of the first light-emitting voltage application electrode 1201a of the light-emitting element of the first sub-pixel G1 on the base substrate 10 is larger than the area of the orthographic projection of the first light-emitting voltage application electrode 1201b of the light-emitting element of the second sub-pixel G2 on the base substrate 10.

For example, as shown in FIG. 5B, the first light-emitting voltage application electrode 1201a of the light-emitting element 120a of the first sub-pixel G1 includes an auxiliary electrode block Ae, an orthographic projection of the auxiliary electrode block Ae on the base substrate 10 at least partially overlaps with the orthographic projection of the control terminal 1221a of the drive circuit of the pixel circuit of the first sub-pixel G1 on the base substrate 10. For example, in some examples, the orthographic projection of the control terminal 1221a of the drive circuit of the pixel circuit of the first sub-pixel G1 on the base substrate 10 is located within the orthographic projection of the auxiliary electrode block Ae on the base substrate 10.

For example, the orthographic projection of the gate electrode of the drive transistor T1 of the first sub-pixel G1 on the base substrate 10 is located within the orthographic projection of the auxiliary electrode block Ae of the first light-emitting voltage application electrode of the light-emitting element 120a of the first sub-pixel G1 on the base substrate 10.

For example, the auxiliary electrode block Ae severs as the first electrode CC3 of the first capacitor C11, the control terminal 1221a of the drive circuit 122a of the first sub-pixel G1 is multiplexed as the second electrode CC4 of the first capacitor C11, that is, the auxiliary electrode block Ae is the first electrode CC3 of the first capacitor C11, and the control terminal 1221a of the drive circuit 122a of the first sub-pixel G1 (i.e., the gate electrode of the drive transistor T1 of the first sub-pixel G1) is the second electrode CC4 of the first capacitor C11.

For example, as shown in FIG. 5B, a shape of the auxiliary electrode block Ae may be rectangular, and a shape of the orthographic projection of the auxiliary electrode block Ae on the base substrate 10 is the same as the shape of the auxiliary electrode block Ae, that is, rectangular. However, the present disclosure is not limited thereto, and the shape of the auxiliary electrode block Ae may be pentagonal, hexagonal, elliptical, or the like.

For example, as shown in FIG. 5B, the first light-emitting voltage application electrode 1201a of the light-emitting element 120a of the first sub-pixel G1 further includes a first drive electrode block De1, and the first drive electrode block De1 is electrically connected to the auxiliary electrode block Ae.

For example, as shown in FIG. 5B, a shape of the first drive electrode block De1 may be a pentagon, and a shape of the orthographic projection of the first drive electrode block De1 on the base substrate 10 is identical to the shape of the first drive electrode block De1, that is, a pentagon. Pentagon may consist of a triangle and a rectangle.

For example, in the example as shown in 5B, the first drive electrode block De1 and the auxiliary electrode block Ae are integrally provided, and thus, the shape of the first light-emitting voltage application electrode 1201a may be an octagon, and the octagon may consist of a pentagon and a rectangle.

It should be noted that in other examples, the first drive electrode block De1 and the auxiliary electrode block Ae may be separately provided, as long as the first drive electrode block De1 and the auxiliary electrode block Ae can be electrically connected to each other.

For example, the first drive electrode block De1 and the auxiliary electrode block Ae may be simultaneously formed by the same patterning process.

For example, as shown in FIG. 6C, the first drive electrode block De1 and the auxiliary electrode block Ae are located on the same layer.

For example, as shown in FIG. 6C, the orthographic projection of the first drive electrode block De1 on the base substrate 10, the orthographic projection of the light-emitting layer 1203a of the light-emitting element of the first sub-pixel G1 on the base substrate 10, and the orthographic projection of the second light-emitting voltage application electrode 1202 of the light-emitting element of the first sub-pixel G1 on the base substrate 10 at least partially overlap.

For example, in some embodiments, second light-emitting voltage application electrodes of light-emitting elements of all sub-pixels on the display substrate are provided integrally, that is, the second light-emitting voltage application electrode 1202 covers the entire base substrate 10, that is, the second light-emitting voltage application electrode 1202 may be a plane-shaped electrode. For example, as shown in FIG. 6C, for the first sub-pixel G1 and the second sub-pixel G2, a portion where the plane-shaped second light-emitting voltage application electrode 1202 overlaps with the first light-emitting voltage application electrode 1201a of the light-emitting element of the first sub-pixel G1 may be represented as the second light-emitting voltage application electrode 1202 of the light-emitting element of the first sub-pixel G1, and a portion where the plane-shaped second light-emitting voltage application electrode overlaps with the first light-emitting voltage application electrode 1201b of the light-emitting element of the second sub-pixel G2 may be represented as the second light-emitting voltage application electrode 1202 of the light-emitting element of the second sub-pixel G2. The second light-emitting voltage application electrode 1202 of the light-emitting element of the first sub-pixel G1 and the second light-emitting voltage application electrode 1202 of the light-emitting element of the second sub-pixel G2 are integrally provided.

For example, as shown in FIG. 6C, the light-emitting layer of the light-emitting element of the first sub-pixel G1 and the light-emitting layer of the light-emitting element of the second sub-pixel G2 are integrally provided. For the first sub-pixel G1 and the second sub-pixel G2, a portion where the light-emitting layer 1203a overlaps with the first light-emitting voltage application electrode 1201a of the light-emitting element of the first sub-pixel G1 may be represented as the light-emitting layer of the light-emitting element of the first sub-pixel G1, and a portion where the light-emitting layer 1203a overlaps with the first light-emitting voltage application electrode 1201b of the light-emitting element of the second sub-pixel G2 may be represented as the light-emitting layer of the light-emitting element of the second sub-pixel G2.

For example, as shown in FIG. 6C, the display substrate 100 further includes a pixel definition layer 160, the pixel definition layer 160 is located on a side of the first light-emitting voltage application electrode of the light-emitting element of each sub-pixel away from the base substrate 10 and includes a first opening, the first opening exposes the first light-emitting voltage application electrode 1201a of the light-emitting element of the first sub-pixel G1 and the first light-emitting voltage application electrode 1201b of the light-emitting element of the second sub-pixel G2, at least part of the light-emitting layer 1203a of the light-emitting element of the first sub-pixel G1 and at least part of the light-emitting layer 1203a of the light-emitting element of the second sub-pixel G2 are located in the first opening and cover an exposed portion of the first light-emitting voltage application electrode 1201a and an exposed portion of the first light-emitting voltage application electrode 1201b, a part area where the first opening overlaps with the first light-emitting voltage application electrode 1201a is an effective light-emitting area of the first sub-pixel G1, and a part area where the first opening overlaps with the first light-emitting voltage application electrode 1201b is an effective light-emitting area of the second sub-pixel G2.

It should be noted that in the embodiment of the present disclosure, the light-emitting layer of each light-emitting element may include an electroluminescent layer itself and other common layers located on both sides of the electroluminescent layer, for example, other common layers comprise a hole injection layer, a hole transport layer, an electron injection layer, an electron transport layer, and the like, but in the drawings of the present disclosure, only the electroluminescent layer in the light-emitting layer is shown, and other common layers are not shown.

For example, in some examples, the orthographic projection of the first drive electrode block De1 on the base substrate 10 may not completely overlap with the orthographic projection of the second light-emitting voltage application electrode 1202 of the light-emitting element of the first sub-pixel G1 on the base substrate 10, for example, the orthographic projection of the first drive electrode block De1 on the base substrate 10 is located within the orthographic projection of the second light-emitting voltage application electrode 1202 of the light-emitting element of the first sub-pixel G1 on the base substrate 10, and the orthographic projection of the light-emitting layer 1203a of the light-emitting element of the first sub-pixel G1 on the base substrate 10 may also be located within the orthographic projection of the second light-emitting voltage application electrode 1202 of the light-emitting element of the first sub-pixel G1 on the base substrate 10.

It should be noted that in a region where the orthographic projection of the first drive electrode block De1 on the base substrate 10, the orthographic projection of the light-emitting layer 1203a of the light-emitting element of the first sub-pixel G1 on the base substrate 10, and the orthographic projection of the second light-emitting voltage application electrode 1202 of the light-emitting element of the first sub-pixel G1 on the base substrate 10 overlap, for the first sub-pixel G1, a portion of the light-emitting layer of the light-emitting element of the first sub-pixel G1 corresponding to the first opening of the pixel definition layer 160 is used for emitting light.

For example, as shown in FIG. 5B, the first light-emitting voltage application electrode 1201b of the light-emitting element 120b of the second sub-pixel G2 includes a second drive electrode block De2. An orthographic projection of the second drive electrode block De2 on the base substrate 10 at least partially overlaps with the orthographic projection of the control terminal 1221b of the drive circuit of the pixel circuit of the second sub-pixel G2 on the base substrate 10. For example, in some examples, the orthographic projection of the control terminal 1221b of the drive circuit of the pixel circuit of the second sub-pixel G2 on the base substrate 10 may be located within the orthographic projection of the second drive electrode block De2 on the base substrate 10. For example, the orthographic projection of the gate electrode of the drive transistor T1 of the second sub-pixel G2 on the base substrate 10 is located within the orthographic projection of the second drive electrode block De2 of the first light-emitting voltage application electrode of the light-emitting element 120b of the second sub-pixel G2 on the base substrate 10.

For example, the second drive electrode block De2 may be multiplexed as the first electrode of the second capacitor C12, the control terminal 1221b of the drive circuit 122b of the second sub-pixel G2 may be multiplexed as the second electrode of the second capacitor C12, that is, the second drive electrode block De2 is the first electrode of the second capacitor C12, and the control terminal 1221b of the drive circuit 122b of the second sub-pixel G2 (i.e., the gate electrode of the drive transistor T1 of the second sub-pixel G2) is the second electrode of the second capacitor C12.

For example, as shown in FIG. 5B, the shape of the first drive electrode block De1 may be identical to a shape of the second drive electrode block De2, that is, the shape of the second drive electrode block De2 may also be a pentagon. A shape of the orthographic projection of the second drive electrode block De2 on the base substrate 10 is identical to the shape of the second drive electrode block De2, that is, a pentagon.

For example, the area of the orthographic projection of the first drive electrode block De1 on the base substrate 10 is identical to an area of the orthographic projection of the second drive electrode block De2 on the base substrate 10.

It should be noted that in some embodiments, the shape of the first drive electrode block De1 and the shape of the second drive electrode block De2 may be rectangles, rhombuses, or the like. The shape of the first drive electrode block De1 and the shape of the second drive electrode block De2 may be different, and the present disclosure is not limited thereto.

For example, as shown in FIG. 6C, the orthographic projection of the second drive electrode block De2 on the base substrate 10, the orthographic projection of the light-emitting layer 1203a of the light-emitting element of the second sub-pixel G2 on the base substrate 10, and the orthographic projection of the second light-emitting voltage application electrode 1202 of the light-emitting element of the second sub-pixel G2 on the base substrate 10 all at least partially overlap.

For example, in some examples, the orthographic projection of the second drive electrode block De2 on the base substrate 10 may not completely overlap with the orthographic projection of the second light-emitting voltage application electrode 1202 of the light-emitting element of the second sub-pixel G2 on the base substrate 10, for example, the orthographic projection of the second drive electrode block De2 on the base substrate 10 is located within the orthographic projection of the second light-emitting voltage application electrode 1202 of the light-emitting element of the second sub-pixel G2 on the base substrate 10.

It should be noted that in a region where the orthographic projection of the second drive electrode block De2 on the base substrate 10, the orthographic projection of the light-emitting layer 1203a of the light-emitting element of the second sub-pixel G2 on the base substrate 10, and the orthographic projection of the second light-emitting voltage application electrode 1202 of the light-emitting element of the second sub-pixel G2 on the base substrate 10 overlap, for the second sub-pixel G2, a portion of the light-emitting layer of the light-emitting element of the second sub-pixel G2 corresponding to the first opening of the pixel definition layer 160 is used for emitting light.

For example, as shown in FIGS. 5A and 5B, in each repeating unit 11, the first sub-pixel G1 and the second sub-pixel G2 are arranged along the first direction X, and the first direction X is parallel to a surface of the base substrate 10. For example, in the first direction X, the auxiliary electrode block Ae is located on a side of the first drive electrode block De1 away from the light-emitting element of the second sub-pixel G2, that is, as shown in FIG. 5B, in the first direction X, the first drive electrode block De1 is located between the auxiliary electrode block Ae and the second drive electrode block De2.

For example, as shown in FIG. 6C, the orthographic projection of the auxiliary electrode block Ae on the base substrate 10 does not overlap with the orthographic projection of the light-emitting layer 1203a of the light-emitting element of the first sub-pixel G1 on the base substrate 10. For example, in some examples, the orthographic projection of the auxiliary electrode block Ae on the base substrate 10 does not completely overlap with the orthographic projection of the light-emitting layer 1203a of the light-emitting element of the first sub-pixel G1 on the base substrate 10.

For example, as shown in FIGS. 6A and 6B, the first light-emitting voltage application electrode of the light-emitting element of the first sub-pixel G1 further includes a first connection electrode block Ce1, in the first direction X, the first connection electrode block Ce1 is located on a side of the first drive electrode block De1 away from the light-emitting element of the second sub-pixel G2, the first connection electrode block Ce1 is located between the auxiliary electrode block Ae and the first drive electrode block De1, and is electrically connected to both the auxiliary electrode block Ae and the first drive electrode block De1.

For example, in some embodiments, the first connection electrode block Ce1, the auxiliary electrode block Ae, and the first drive electrode block De1 are all provided integrally. It should be noted that in other examples, the first connection electrode block Ce1, the auxiliary electrode block Ae, and the first drive electrode block De1 may be separately provided, as long as the first connection electrode block Ce1, the auxiliary electrode block Ae, and the first drive electrode block De1 can be electrically connected to each other.

For example, the first connection electrode block Ce1 is used to connect the first drive electrode block De1 and the pixel circuit of the first sub-pixel G1.

For example, as shown in FIG. 6C, the first connection electrode block Ce1, the auxiliary electrode block Ae, and the first drive electrode block De1 are located on the same layer. The first connection electrode block Ce1, the auxiliary electrode block Ae, and the first drive electrode block De1 may be simultaneously formed by the same patterning process.

For example, a shape of the first connection electrode block Ce1 may be a regular shape, for example, a rectangle, a diamond, or the like; and the shape of the first connection electrode block Ce1 also may be an irregular shape.

For example, as shown in FIGS. 6A and 6B, in some examples, the shape of the auxiliary electrode block Ae and the shape of the first connection electrode block Ce1 are both rectangles, and in the second direction Y, a width of the auxiliary electrode block Ae is smaller than a width of the first connection electrode block Ce1, i.e., the auxiliary electrode block Ae and the first connection electrode block Ce1 form a stepped shape. In the second direction Y, the width of the first connection electrode block Ce1 is smaller than a maximum width of the first drive electrode block De1.

For example, the first drive electrode block De1 has five internal angles, and the five internal angles may include two right angles, two obtuse angles, and an acute angle, and the first connection electrode block Ce1 extends from a side, where the acute angle of the first drive electrode block De1 is located, in a direction of the first drive electrode block De1 away from the light-emitting element of the second sub-pixel G2.

For example, in some embodiments, the orthographic projection of the first connection electrode block Ce1 on the base substrate 10 does not overlap with the orthographic projection of the light-emitting layer 1203a of the light-emitting element of the first sub-pixel G1 on the base substrate 10, and the orthographic projection of the first connection electrode block Ce1 on the base substrate 10 does not overlap with the orthographic projection of the control terminal 1221a of the drive circuit of the pixel circuit of the first sub-pixel G1 on the base substrate 10. However, the present disclosure is not limited to this case, the orthographic projection of the first connection electrode block Ce1 on the base substrate 10 may partially overlap with the orthographic projection of the control terminal 1221a of the drive circuit of the pixel circuit of the first sub-pixel G1 on the base substrate 10. It should be noted that in a case where the orthographic projection of the first connection electrode block Ce1 on the base substrate 10 overlaps with the orthographic projection of the control terminal 1221a of the drive circuit of the pixel circuit of the first sub-pixel G1 on the base substrate 10, an area of an overlapping portion between the orthographic projection of the first connection electrode block Ce1 on the base substrate 10 and the orthographic projection of the control terminal 1221a of the drive circuit of the pixel circuit of the first sub-pixel G1 on the base substrate 10 is smaller than an area of an overlapping portion between the orthographic projection of the auxiliary electrode block Ae on the base substrate 10 and the orthographic projection of the control terminal 1221a of the drive circuit of the pixel circuit of the first sub-pixel G1 on the base substrate 10.

For example, as shown in FIGS. 6C and 6D, the display substrate 100 further includes an intermediate layer 101. In a direction perpendicular to the surface of the base substrate 10, the pixel circuit 121 of each sub-pixel is located between the intermediate layer 101 and the base substrate 10, and the light-emitting element 120 is located on a side of the intermediate layer 101 away from the base substrate 10, that is, the intermediate layer 101 is located between the light-emitting element 120 and the base substrate 10.

For example, in some embodiments, layers where light-emitting elements of all sub-pixels are located constitute a first functional layer group, layers where pixel circuits of all sub-pixels are located constitute a second functional layer group, that is, in a direction perpendicular to the surface of the base substrate 10, the first functional layer group is located on the side of the intermediate layer 101 away from the base substrate 10, the second functional layer group is located on a side of the intermediate layer 101 close to the base substrate 10, that is, the second functional layer group is located between the intermediate layer 101 and the base substrate 10, and the intermediate layer 101 is located between the first functional layer group and the second functional layer group. The intermediate layer 101 is located between the first functional layer group and the second functional layer group. For example, the drive circuit 122, the data writing circuit 126, the storage circuit 127, the threshold compensation circuit 128, and the reset circuit 129 as shown in FIG. 3A are all located in the second functional layer group. For example, the first parasitic circuit 125a in the pixel circuit 121a of the first sub-pixel G1 and the second parasitic circuit 125b in the pixel circuit 121b of the second sub-pixel G2 are also located in the second functional layer group.

It should be noted that in the embodiment of the present disclosure, the first functional layer group may include a plurality of sub-layers, for example, the first functional layer group may include a sub-layer where the first light-emitting voltage application electrode 1201a of the light-emitting element of the first sub-pixel G1 is located, a sub-layer where the second light-emitting voltage application electrode 1202 of the light-emitting element of the first sub-pixel G1 is located, and a sub-layer where the light-emitting layer 1203a of the light-emitting element of the first sub-pixel G1 is located. Similarly, the second functional layer group may also include a plurality of sub-layers. For example, the second functional layer group may include sub-layers where respective elements in the pixel circuit of the first sub-pixel G2 are located. In a case where the pixel circuit includes a transistor, the second functional layer group may include a sub-layer where the gate electrode of the transistor is located, a sub-layer where the source electrode and the drain electrode of the transistor are located, a sub-layer where the active layer is located, and a sub-layer where the gate insulation layer is located, etc.

For example, the intermediate layer 101 may be a flat layer. For example, as shown in FIGS. 6C and 6D, in a direction perpendicular to the surface of the base substrate 10, the first light-emitting voltage application electrode 1201a of the light-emitting element of the first sub-pixel G1 is on a side of the light-emitting layer 1203a of the light-emitting element of the first sub-pixel G1 close to the intermediate layer 101, and the second light-emitting voltage application electrode 1202 of the light-emitting element of the first sub-pixel G1 is on a side of the light-emitting layer 1203a of the light-emitting element of the first sub-pixel G1 away from the intermediate layer 101.

For example, as shown in FIG. 6C, the intermediate layer 101 includes a first via hole h1, and the first connection electrode block Ce1 extends to the first via hole h1 and is electrically connected to the pixel circuit of the first sub-pixel G1 through the first via hole h1, for example, the first connection electrode block Ce1 is electrically connected to the second light-emitting control circuit 124a of the pixel circuit of the first sub-pixel G1 through the first via hole h1. For example, the first connection electrode block Ce1 may cover and fill the first via hole h1.

For example, in the first sub-pixel G1, the first connection electrode block Ce1 is electrically connected to the second electrode of the second light-emitting control transistor T5 of the pixel circuit of the first sub-pixel G1 through the first via hole h1.

For example, as shown in FIGS. 4A-4E, the pixel circuit 121 may include the active semiconductor layer 310, the gate electrode metal layer (including the first conductive layer 320 and the second conductive layer 330), and the source-drain electrode metal layer 340. In the direction perpendicular to the base substrate 10, the active semiconductor layer 310 is located between the base substrate 10 and the gate electrode metal layer, and the gate electrode metal layer is located between the active semiconductor layer 310 and the source-drain electrode metal layer 340. For example, the first conductive layer 320 of the gate electrode metal layer is located between the active semiconductor layer 310 and the second conductive layer 330 of the gate electrode metal layer, and the second conductive layer 330 of the gate electrode metal layer is located between the first conductive layer 320 of the gate electrode metal layer and the source-drain electrode metal layer 340.

For example, in the present disclosure, active layers of respective transistors (e.g., the drive transistor T1, the data writing transistor T2, the threshold compensation transistor T3, the first light-emitting control transistor T4, the second light-emitting control transistor T5, the first reset transistor T6, and the second reset transistor T7, etc.) in the pixel circuit 121 of each sub-pixel are located in the active semiconductor layer 310, gate electrodes of respective transistors in the pixel circuit 121 are located in the first conductive layer 320 of the gate electrode metal layer, and source electrodes and drain electrodes of respective transistors in the pixel circuit 121 are located in the source-drain electrode metal layer 340.

For example, the first connection electrode block Ce1 extends to the source-drain electrode metal layer of the pixel circuit through the first via hole h1.

For example, the first light-emitting voltage application electrode of the light-emitting element of the second sub-pixel G2 further includes a second connection electrode block Ce2, and the second connection electrode block Ce2 is electrically connected to the second drive electrode block De2. For example, in some embodiments, the second connection electrode block Ce2 is integrally provided with the second drive electrode block De2. It should be noted that in other examples, the second connection electrode block Ce2 and the second drive electrode block De2 may be separately provided, as long as the second connection electrode block Ce2 and the second drive electrode block De2 can be electrically connected to each other.

For example, the second connection electrode block Ce2 is used to connect the second drive electrode block De2 and the pixel circuit of the second sub-pixel G2.

For example, as shown in FIGS. 6A and 6B, in the first direction X, the second connection electrode block Ce2 is located on a side of the second drive electrode block De2 away from the light-emitting element of the first sub-pixel G1, that is, as shown in FIGS. 6A and 6B, the second drive electrode block De2 is located between the second connection electrode block Ce2 and the first drive electrode block De1 in the first direction X.

For example, as shown in FIG. 6C, the second connection electrode block Ce2 and the second drive electrode block De2 are located on the same layer. The second connection electrode block Ce2 and the second drive electrode block De2 may be formed simultaneously by the same patterning process.

For example, a shape of the second connection electrode block Ce2 may be a regular shape, for example, a rectangle, and a diamond, etc. The shape of the second connection electrode block Ce2 may be an irregular shape.

For example, in some examples, in the second direction Y, a width of the second connection electrode block Ce2 is smaller than a maximum width of the second drive electrode block De2. For example, the second drive electrode block De2 includes five internal angles, the five internal angles may include two right angles, two obtuse angles, and an acute angle, and the second connection electrode block Ce2 extends from a side, where the acute angle of the second drive electrode block De2 is located, in a direction of the second drive electrode block De2 away from the light-emitting element of the first sub-pixel G1.

For example, in some examples, the shape of the first connection electrode block Ce1 may be identical to the shape of the second connection electrode block Ce2.

For example, in some embodiments, the orthographic projection of the second connection electrode block Ce2 on the base substrate 10 does not overlap with the orthographic projection of the light-emitting layer 1203a of the light-emitting element of the second sub-pixel G2 on the base substrate 10, and the orthographic projection of the second connection electrode block Ce2 on the base substrate 10 does not overlap with the orthographic projection of the control terminal 1221b of the drive circuit of the pixel circuit of the second sub-pixel G2 on the base substrate 10. However, the present disclosure is not limited to this case, and the orthographic projection of the second connection electrode block Ce2 on the base substrate 10 may partially overlap with the orthographic projection of the control terminal 1221b of the drive circuit of the pixel circuit of the second sub-pixel G2 on the base substrate 10. It should be noted that in a case where the orthographic projection of the second connection electrode block Ce2 on the base substrate 10 overlaps with the orthographic projection of the control terminal 1221b of the drive circuit of the pixel circuit of the second sub-pixel G2 on the base substrate 10, an area of an overlapping portion between the orthographic projection of the second connection electrode block Ce2 on the base substrate 10 and the orthographic projection of the control terminal 1221b of the drive circuit of the pixel circuit of the second sub-pixel G2 on the base substrate 10 is smaller than an area of an overlapping portion between the orthographic projection of the second drive electrode block De2 on the base substrate 10 and the orthographic projection of the control terminal 1221b of the drive circuit of the pixel circuit of the second sub-pixel G2 on the base substrate 10.

For example, similar to the first sub-pixel G1, in the direction perpendicular to the surface of the base substrate 10, the first light-emitting voltage application electrode 1201b of the light-emitting element of the second sub-pixel G2 is on a side of the light-emitting layer 1203a of the light-emitting element of the second sub-pixel G2 close to the intermediate layer 101, and the second light-emitting voltage application electrode 1202 of the light-emitting element of the second sub-pixel G2 is on a side of the light-emitting layer 1203a of the light-emitting element of the second sub-pixel G2 away from the intermediate layer 101.

For example, as shown in FIG. 6C, the intermediate layer 101 includes a second via hole h2, and the second connection electrode block Ce2 extends to the second via hole h2 and is electrically connected to the pixel circuit of the second sub-pixel G2 through the second via hole h2, for example, the second connection electrode block Ce2 is electrically connected to the second light-emitting control circuit 124*b* of the pixel circuit of the second sub-pixel G2 through the second via hole h2. For example, the second connection electrode block Ce2 may cover and fill the second via hole h2.

For example, in the second sub-pixel G2, the second connection electrode block Ce2 is electrically connected to the second electrode of the second light-emitting control transistor T5 of the pixel circuit 121*b* of the second sub-pixel G2 through the second via hole h2.

For example, the second connection electrode block Ce2 extends to the source-drain electrode metal layer of the pixel circuit through the second via hole h2.

For example, as shown in FIG. 5A, in each repeating unit 11, the third sub-pixel R and the fourth sub-pixel B are arranged along the second direction Y, and in the second direction Y, the first sub-pixel G1 and the second sub-pixel G2 are located between the third sub-pixel R and the fourth sub-pixel B, the second direction Y is parallel to the surface of the base substrate 10, and the first direction X and the second direction Y are perpendicular to each other.

For example, in each repeating unit 11, a line connecting a center of the first sub-pixel G1 and a center of the second sub-pixel G2 is a first center line, and a line connecting a center of the third sub-pixel R and a center of the fourth sub-pixel B is a second center line. A length of the first center line is shorter than a length of the second center line. For example, the first center line and the second center line are vertically bisected with each other, and the first center line is substantially parallel to the first direction X and the second center line is substantially parallel to the second direction Y.

For example, the light-emitting element of the third sub-pixel R includes a first light-emitting voltage application electrode, a second light-emitting voltage application electrode, and a light-emitting layer. As shown in FIG. 6D, the light-emitting element of the fourth sub-pixel B includes a first light-emitting voltage application electrode 1201*d*, a second light-emitting voltage application electrode 1202*d*, and a light-emitting layer 1203*d*. It should be noted that for the third sub-pixel R, a portion, where the plane-shaped second light-emitting voltage application electrode 1202 overlaps with the first light-emitting voltage application electrode of the light-emitting element of the third sub-pixel R, may be represented as the second light-emitting voltage application electrode of the light-emitting element of the third sub-pixel R; and for the fourth sub-pixel B, a portion, where the plane-shaped second light-emitting voltage application electrode overlaps with the first light-emitting voltage application electrode of the light-emitting element of the fourth sub-pixel B, may be represented as the second light-emitting voltage application electrode of the light-emitting element of the fourth sub-pixel B. That is, the second light-emitting voltage application electrode of the light-emitting element of the first sub-pixel G1, the second light-emitting voltage application electrode of the light-emitting element of the second sub-pixel G2, the second light-emitting voltage application electrode of the light-emitting element of the third sub-pixel R, and the second light-emitting voltage application electrode of the light-emitting element of the fourth sub-pixel B are integrated.

For example, the orthographic projection of the first light-emitting voltage application electrode of the light-emitting element of the third sub-pixel R on the base substrate 10 may at least partially overlap with the orthographic projection of the control terminal of the drive circuit of the pixel circuit of the third sub-pixel R on the base substrate 10.

For example, the orthographic projection of the first light-emitting voltage application electrode 1201*d* of the light-emitting element of the fourth sub-pixel B on the base substrate 10 may also at least partially overlap with the orthographic projection of the control terminal of the drive circuit of the pixel circuit of the fourth sub-pixel B on the base substrate 10. For example, as shown in FIG. 6D, the orthographic projection of the control terminal 1221*d* of the drive circuit of the pixel circuit of the fourth sub-pixel B on the base substrate 10 is located within the orthographic projection of the first light-emitting voltage application electrode 1201*d* of the light-emitting element of the fourth sub-pixel B on the base substrate 10.

For example, as shown in FIGS. 6A and 6B, the first light-emitting voltage application electrode of the light-emitting element of the third sub-pixel R includes a third drive electrode block De3 and a third connection electrode block Ce3, and the third drive electrode block De3 and the third connection electrode block Ce3 are electrically connected to each other, and the first light-emitting voltage application electrode 1201*d* of the light-emitting element of the fourth sub-pixel B includes a fourth drive electrode block De4 and a fourth connection electrode block Ce4, and the fourth drive electrode block De4 and the fourth connection electrode block Ce4 are electrically connected to each other. For example, the orthographic projection of the control terminal 1221*c* of the drive circuit of the pixel circuit of the third sub-pixel R on the base substrate 10 at least partially overlaps with the orthographic projection of the third drive electrode block De3 on the base substrate 10; and as shown in FIG. 6D, the orthographic projection of the control terminal 1221*d* of the drive circuit of the pixel circuit of the fourth sub-pixel B on the base substrate 10 at least partially overlaps with the orthographic projection of the fourth drive electrode block De4 on the base substrate 10, for example, the orthographic projection of the control terminal 1221*d* of the drive circuit of the pixel circuit of the fourth sub-pixel B on the base substrate 10 is located within the orthographic projection of the fourth drive electrode block De4 on the base substrate 10.

For example, the third connection electrode block Ce3 is used to connect the third drive electrode block De3 and the pixel circuit of the third sub-pixel R; and the fourth connection electrode block Ce4 is used to connect the fourth drive electrode block De4 and the pixel circuit of the fourth sub-pixel B.

For example, the pixel circuit of the third sub-pixel R further includes a third parasitic circuit, and the pixel circuit of the fourth sub-pixel B further includes a fourth parasitic circuit. The third parasitic circuit includes a fourth capacitor, and the fourth parasitic circuit includes a fifth capacitor. The third drive electrode block De3 is multiplexed as a first electrode of the fourth capacitor, and the control terminal of the drive circuit of the third sub-pixel R is multiplexed as a second electrode of the fourth capacitor. The fourth drive electrode block De4 is multiplexed as a first electrode of the fifth capacitor, and the control terminal of the drive circuit of the fourth sub-pixel B is multiplexed as a second electrode of the fifth capacitor.

For example, a shape of the third drive electrode block De3 may be a regular hexagon, and a shape of the fourth drive electrode block De4 may also be a regular hexagon. The shape of the third connection electrode block Ce3 may also be an irregular hexagon, and the shape of the fourth connection electrode block Ce4 may also be an irregular hexagon.

It should be noted that in some embodiments, the shape of the third drive electrode block De3 and the shape of the fourth drive electrode block De4 may be rectangles, long ellipses, etc. The present disclosure does not specifically limit the shape of the third drive electrode block De3, the shape of the third connection electrode block Ce3, the shape of the fourth drive electrode block De4, and the shape of the fourth connection electrode block Ce4.

For example, the third connection electrode block Ce3 may be a portion protruding outward from one side (e.g., a lower right side of the hexagon) of the hexagonal third drive electrode block De3; and the fourth connection electrode block Ce4 may be a portion protruding outward from one side (e.g., a lower left side of the hexagonal) of the hexagonal fourth drive electrode block De4.

It should be noted that the area of the drive electrode block of each sub-pixel can be specifically set according to the luminous efficiency of a luminescent material. For example, if the luminous efficiency of the luminescent material is higher, the area of the drive electrode block of the sub-pixel can be smaller; and while the luminous efficiency of the luminescent material is lower, the area of the drive electrode block of the sub-pixel can be larger. For example, in some embodiments, an area of the third drive electrode block De3 is smaller than an area of the fourth drive electrode block De4. The area of the third drive electrode block De3 is larger than an area of the first drive electrode block De1, and the area of the third drive electrode block De3 is larger than an area of the second drive electrode block De2.

For example, in some embodiments, the third drive electrode block De3 and the third connection electrode block Ce3 are integrally provided, and the fourth drive electrode block De4 and the fourth connection electrode block Ce4 are also integrally provided. It should be noted that in other examples, the third drive electrode block De3 and the third connection electrode block Ce3 may be separately provided, as long as the third drive electrode block De3 and the third connection electrode block Ce3 can be electrically connected to each other. Similarly, the fourth drive electrode block De4 and the fourth connection electrode block Ce4 may be separately provided, as long as the fourth drive electrode block De4 and the fourth connection electrode block Ce4 can be electrically connected to each other.

For example, the third drive electrode block De3 and the third connection electrode block Ce3 are located on the same layer. As shown in FIG. 6D, the fourth drive electrode block De4 and the fourth connection electrode block Ce4 are located on the same layer.

For example, similar to the first sub-pixel G1 and the second sub-pixel G2, in the direction perpendicular to the surface of the base substrate 10, the first light-emitting voltage application electrode of the light-emitting element of the third sub-pixel R is on a side of the light-emitting layer of the light-emitting element of the third sub-pixel R close to the intermediate layer 101, and the second light-emitting voltage application electrode of the light-emitting element of the third sub-pixel R is on a side of the light-emitting layer of the light-emitting element of the third sub-pixel R away from the intermediate layer 101; and as shown in FIG. 6D, in the direction perpendicular to the surface of the base substrate 10, the first light-emitting voltage application electrode 1201d of the light-emitting element of the fourth sub-pixel B is on a side of the light-emitting layer 1203d of the light-emitting element of the fourth sub-pixel B close to the intermediate layer 101, and the second light-emitting voltage application electrode 1202d of the light-emitting element of the fourth sub-pixel B is on a side of the light-emitting layer 1203d of the light-emitting element of the fourth sub-pixel B away from the intermediate layer 101.

For example, as shown in FIG. 6B, the intermediate layer 101 includes a third via hole h3, and the third connection electrode block Ce3 extends to the third via hole h3 and is electrically connected to the pixel circuit of the third sub-pixel R through the third via hole h3. For example, the third connection electrode block Ce3 may cover and fill the third via hole h3.

For example, as shown in FIG. 6D, the intermediate layer 101 includes a fourth via hole h4, and the fourth connection electrode block Ce4 extends to the fourth via hole h4 and is electrically connected to the pixel circuit of the fourth sub-pixel B through the fourth via hole h4. For example, the fourth connection electrode block Ce4 may cover and fill the fourth via hole h4.

For example, the third connection electrode block Ce3 extends to the source-drain electrode metal layer of the pixel circuit through the third via hole h3; and the fourth connection electrode block Ce4 extends to the source-drain electrode metal layer of the pixel circuit through the fourth via hole h4.

For example, the third connection electrode block Ce3 extends to the source-drain electrode metal layer of the pixel circuit through the third via hole h3, so as to be electrically connected to the second electrode of the second light-emitting control transistor of the third sub-pixel R located on the source-drain electrode metal layer of the pixel circuit. For example, the fourth connection electrode block Ce4 extends to the source-drain electrode metal layer of the pixel circuit through the fourth via hole h4, so as to be electrically connected to the second electrode of the second light-emitting control transistor of the fourth sub-pixel B located on the source-drain electrode metal layer of the pixel circuit.

For example, as shown in FIGS. 6A and 6B, in each repeating unit 11, the third connection electrode block Ce3 is located on a side of the third drive electrode block De3 away from the auxiliary electrode block Ae of the first sub-pixel G1 in the first direction X, and the third connection electrode block Ce3 is located on a side of the third drive electrode block De3 close to the fourth drive electrode block De4 in the second direction Y, that is, in the example as shown in FIGS. 6A and 6B, the third connection electrode block Ce3 is located on the lower right side of the third drive electrode block De3, that is, the shape of the first light-emitting voltage application electrode 1201c of the light-emitting element of the third sub-pixel R may be a Q-shaped mirror symmetric shape.

For example, as shown in FIGS. 6A and 6B, in each repeating unit 11, the fourth connection electrode block Ce4 is located on a side of the fourth drive electrode block De4 away from the auxiliary electrode block Ae of the first sub-pixel G1 in the first direction X, and the fourth connection electrode block Ce4 is located on a side of the fourth drive electrode block De4 close to the third drive electrode block De3 in the second direction Y, that is, in the example as shown in FIGS. 6A and 6B, the fourth connection electrode block Ce4 is located on the lower left side of the fourth drive electrode block De4, that is, a shape of the first light-emitting voltage application electrode 1201d of the light-emitting element of the fourth sub-pixel B may be a Q-shape.

For example, the third connection electrode block Ce3 is electrically connected to the second light-emitting control circuit 124c of the pixel circuit of the third sub-pixel R through the third via hole h3, and for example, the third connection electrode block Ce3 is electrically connected to the second electrode of the second light-emitting control transistor of the pixel circuit of the third sub-pixel R through the third via hole h3.

For example, as shown in FIG. 6D, the fourth connection electrode block Ce4 is electrically connected to the second light-emitting control circuit 124d of the pixel circuit of the fourth sub-pixel B through the fourth via hole h4, for example, the fourth connection electrode block Ce4 is electrically connected to the second electrode of the second light-emitting control transistor of the pixel circuit of the fourth sub-pixel B through the fourth via hole h4.

For example, as shown in FIG. 6B, an intermediate layer (not shown) is formed on the source-drain electrode metal layer 340 as shown in FIG. 6D, and the first light-emitting voltage application electrode of the light-emitting element of each sub-pixel is provided on the intermediate layer. The first connection electrode block Ce1, the first drive electrode block De1 and the auxiliary electrode block Ae of the first light-emitting voltage application electrode of the light-emitting element of the first sub-pixel G1, the second connection electrode block Ce2 and the second drive electrode block De2 of the first light-emitting voltage application electrode of the light-emitting element of the second sub-pixel G2, the third connection electrode block Ce3 and the third drive electrode block De3 of the first light-emitting voltage application electrode of the light-emitting element of the third sub-pixel R, and the fourth connection electrode block Ce4 and the fourth drive electrode block De4 of the first light-emitting voltage application electrode of the light-emitting element of the fourth sub-pixel B are all disposed on the intermediate layer, the first connection electrode block Ce1 of the first sub-pixel G1 is connected to the second light-emitting control transistor T5 in the pixel circuit 121a of the first sub-pixel G1 through the first via hole h1, the second connection electrode block Ce2 of the second sub-pixel G2 is connected to the second light-emitting control transistor T5 in the pixel circuit 121b of the second sub-pixel G2 through the second via hole h2, the third connection electrode block Ce3 of the third sub-pixel R is connected to the second light-emitting control transistor T5 in the pixel circuit of the third sub-pixel R through the third via hole h3, and the fourth connection electrode block Ce4 of the fourth sub-pixel B is connected to the second light-emitting control transistor T5 in the pixel circuit of the fourth sub-pixel B through the fourth via hole h4.

For example, the orthographic projection of the auxiliary electrode block Ae of the first sub-pixel G1 on the base substrate at least partially overlaps with the orthographic projection of the gate electrode of the drive transistor in the pixel circuit 121a of the first sub-pixel G1 on the base substrate, the orthographic projection of the second drive electrode block De2 of the second sub-pixel G2 on the base substrate at least partially overlaps with the orthographic projection of the gate electrode of the drive transistor in the pixel circuit 121b of the second sub-pixel G2 on the base substrate, the orthographic projection of the third drive electrode block De3 of the third sub-pixel R on the base substrate at least partially overlaps with the orthographic projection of the gate electrode of the drive transistor in the pixel circuit of the third sub-pixel R on the base substrate, and the orthographic projection of the fourth drive electrode block De4 of the fourth sub-pixel B on the base substrate at least partially overlaps with the orthographic projection of the gate electrode of the drive transistor in the pixel circuit of the fourth sub-pixel B on the base substrate.

It should be noted that FIG. 6E shows drive electrode blocks of respective sub-pixels, auxiliary electrode blocks of respective first sub-pixels, and connection electrode blocks of respective sub-pixels, and FIG. 6E also shows via holes corresponding to respective connection electrode blocks. It should be noted that the connection electrode block of each sub-pixel may cover and fill the corresponding via hole. For example, the first connection electrode block covers and fills the first via hole h1, the second connection electrode block covers and fills the second via hole h2, the third connection electrode block covers and fills the third via hole h3, and the fourth connection electrode block covers and fills the fourth via hole h4. However, in order to show positions of respective via holes, the respective via holes are located above the corresponding connection electrode blocks in FIG. 6E.

For example, as shown in FIG. 6E, in the second direction Y, respective via holes are arranged as a plurality of rows of via holes, and respective via holes in each row are arranged in an order of the third via hole h3, the first via hole h1, the fourth via hole h4, and the second via hole h2, i.e., the third via hole h3, the first via hole h1, the fourth via hole h4, and the second via hole h2 are one arrangement period HT1, in the arrangement period HT1, the first via hole h1 corresponds to the first sub-pixel G1 located in the second row and adjacent to the first via hole h1, the second via hole h2 corresponds to the second sub-pixel G2 located in the first row and adjacent to the second via hole h2, the third via hole h3 corresponds to the third sub-pixel R located in the first row and adjacent to the third via hole h3, and the fourth via hole h4 corresponds to the fourth sub-pixel B located in the first row and adjacent to the fourth via hole h4.

For example, in the second direction Y, respective via holes in each row are located on the same straight line, that is, the first via hole h1, the third via hole h3, the second via hole h2, and the fourth via hole h4 in each arrangement period HT1 are located on the same straight line, and the arrangement periods HT1 are also located on the same straight line.

For example, in the second direction Y, a distance between any two adjacent via holes is a first fixed distance d1, that is, as shown in FIG. 6E, in the arrangement period HT1, a distance between the first via hole h1 and the fourth via hole h4 is the first fixed distance d1, a distance between the first via hole h1 and the third via hole h3 is also the first fixed distance d1, a distance between the second via hole h2 and the third via hole h3 is also the first fixed distance d1, and a distance between the second via hole h2 and the fourth via hole h4 is also the first fixed distance d1. It should be noted that "two adjacent via holes" means that there is no via hole between the two adjacent via holes, and the first fixed distance d1 can represent the distance between centers of the two adjacent via holes in the second direction Y.

For example, as shown in FIG. 6E, in the first direction X, respective first via holes h1 and respective second via holes h2 are arranged as a plurality of first via hole columns, respective third via holes h3 and respective fourth via holes h4 are arranged as a plurality of second via hole columns, and in the second direction Y, the first via hole columns and the second via hole columns are alternately arranged, that is, the plurality of first via hole columns may be odd-numbered columns and the plurality of second via hole columns may be even-numbered columns. In each first via column, respective first via holes h1 and respective second via holes h2 are located on the same straight line, and in each second via column, respective third via holes h3 and respective fourth via holes h4 are also located on the same straight line.

For example, in the first direction X, a distance between any adjacent first via hole h1 and second via hole h2 is a second fixed distance d2, a distance between any adjacent third via hole h3 and fourth via hole h4 is a third fixed distance d3, and the second fixed distance d2 and the third fixed distance d3 are equal. It should be note that the second fixed distance d2 may represent a distance between a center of the first via hole h1 and a center of the second via hole h2 that is adjacent to the first via hole h1 in the first direction X, and the third fixed distance d3 may represent a distance between a center of the third via hole h3 and a center of the fourth via hole h4 that is adjacent to the third via hole h3 in the first direction X.

For example, the plurality of repeating units 11 are arranged along the second direction Y to form a plurality of repeating unit groups, and the plurality of repeating unit groups are arranged along the first direction X. As shown in FIG. 6E, in the first direction X, the first connection electrode block, the second connection electrode block, the third connection electrode block, and the fourth connection electrode block are located between two adjacent repeating unit groups, and in the first direction X, at least a portion of the auxiliary electrode block is located on a side of the auxiliary electrode block away from the first drive electrode block and between two adjacent repeating units in the repeating unit group adjacent to the repeating unit group in which the auxiliary electrode block is located. For example, in some embodiments, a P-th repeating unit group is located on a first row and a (P+1)-th repeating unit group is located on a second row. For repeating units located in the (P+1)-th repeating unit group, at least a portion of the auxiliary electrode block Ae is located on a side of the auxiliary electrode block Ae away from the first drive electrode block De1 and between two adjacent repeating units in the repeating unit group (i.e., the P-th repeating unit group) adjacent to the repeating unit group (i.e., the (P+1)-th repeating unit group) in which the auxiliary electrode block Ae is located, for example, as shown in FIG. 6E, at least a portion of the auxiliary electrode block Ae in the repeating unit located in the second row extends to the first row and is located between two adjacent repeating units located in the first row, for example, at least a portion of the auxiliary electrode block Ae in the repeating unit located in the second row is located between the adjacent third sub-pixel R and the fourth sub-pixel B in the first row.

For example, as shown in FIG. 6C, the second light-emitting control transistor of the second light-emitting control circuit 124a of the first sub-pixel G1 includes a second electrode 1241a (e.g., drain electrode) and an active layer 1242a. The drive transistor of the drive circuit of the first sub-pixel G1 includes a gate electrode 1221a (i.e., the control terminal of the drive circuit 122a) and an active layer 1222a. It should be noted that FIG. 6C does not show the gate electrode and the first electrode of the second light-emitting control transistor of the first sub-pixel G1, and the first electrode and the second electrode of the drive transistor of the first sub-pixel G1, etc.

For example, a gate insulation layer is between the active semiconductor layer 310 and the first conductive layer 320, that is, as shown in FIG. 6C, a gate insulation layer 131 is between the gate electrode 1221a of the drive transistor of the first sub-pixel G1 and the active layer 1222a of the drive transistor of the first sub-pixel G1, and the gate insulation layer 131 covers the entire display substrate 100, whereby the gate insulation layer 131 is also between the gate electrode and the active layer of the second light-emitting control transistor. The gate electrode 1221a of the drive transistor of the first sub-pixel G1 is on a side of the gate insulation layer 131 away from the base substrate 10. As shown in FIG. 6C, the first light-emitting control signal line EM1a connected to the first light-emitting control circuit of the first sub-pixel G1 and the second light-emitting control signal line EM2a connected to the second light-emitting control circuit of the first sub-pixel G1 are also disposed on a side of the gate insulation layer 131 away from the base substrate 10.

For example, as shown in FIG. 6C, the orthographic projection of the first connection electrode block Ce1 on the base substrate 10 at least partially overlaps with the orthographic projection of the second light-emitting control signal line EM2a (i.e., the first light-emitting control signal line EM1a connected to the first light-emitting control circuit of the first sub-pixel G1) connected to the second light-emitting control circuit of the pixel circuit of the first sub-pixel G1 on the base substrate 10.

For example, as shown in FIG. 6C, a first insulation layer 132 is further provided on the gate electrode 1221a of the drive transistor of the first sub-pixel G1, and a first electrode CC1a of the third capacitor C2 of the first sub-pixel G1 is provided on a side of the first insulation layer 132 away from the base substrate 10. A second insulation layer 133 is provided on a side of the second electrode CC2a of the third capacitor C2 away from the base substrate 10. The second electrode 1241a of the second light-emitting control transistor of the first sub-pixel G1 is on a side of the second insulation layer 133 away from the base substrate 10, and is electrically connected to the active layer 1242a of the second light-emitting control transistor through a via hole 388a penetrating the second insulation layer 133, the first insulation layer 132, and the gate insulation layer 131. For example, the first insulation layer 132 and the second insulation layer 133 also cover the entire display substrate 100.

For example, a first connection portion 341a of the first sub-pixel G1 is also provided on a side of the second insulation layer 133 away from the base substrate 10. The first connection portion 341a of the first sub-pixel G1 is electrically connected to the gate electrode 1221a of the drive transistor of the first sub-pixel G1 through the via hole 385a penetrating the second insulation layer 133, the first electrode CC1a of the third capacitor C2 the first sub-pixel G1, and the first insulation layer 132. The orthographic projection of the first connection portion 341a on the base substrate 10 at least partially overlaps with the orthographic projection of the gate electrode 1221a of the drive transistor of the first sub-pixel G1 on the base substrate 10, that is, the orthographic projection of the first connection portion 341a on the base substrate 10, the orthographic projection of the gate electrode 1221a of the drive transistor of the first sub-pixel G1 on the base substrate 10, and the orthographic projection of the auxiliary electrode block Ae on the base substrate 10 at least partially overlap.

It should be noted that for the first sub-pixel G1, in the direction perpendicular to the base substrate 10, metal layers, such as the first electrode CC1a of the third capacitor C2 of the first sub-pixel G1, the first connection portion 341a of the first sub-pixel G1, and the like, are further provided between the first electrode CC3a (i.e., the auxiliary electrode block Ae) and the second electrode CC4a (i.e., the gate electrode 1221a of the drive transistor of the first sub-pixel G1) of the first capacitor C11. Therefore, there may also be a parasitic capacitance between the auxiliary electrode block Ae and the first connection portion 341a of the first sub-pixel G1, there may also be a parasitic capacitance between the auxiliary electrode block Ae and the first electrode CC1a of the third capacitor C2 of the first sub-pixel G1, there may also be a parasitic capacitance between the first electrode CC1a of the third capacitor C2 of the first sub-pixel G1 and the first connection portion 341a of the first sub-pixel G1, there may also be a parasitic capacitance between the gate electrode 1221a of the drive transistor of the first sub-pixel G1 and the first connection portion 341a of the first sub-pixel G1, and there may also be a parasitic capacitance between the gate electrode 1221a of the drive transistor of the first sub-pixel G1 and the first electrode CC1a of the third capacitor C2 of the first sub-pixel G1. The positions and sizes of these parasitic capacitances are related to the specific layout structure of the display substrate, and the present disclosure will not describe these parasitic capacitances in detail.

For example, the second electrode 1241a of the second light-emitting control transistor of the first sub-pixel G1 and the first connection portion 341a are both located in the source-drain electrode metal layer 340 of the pixel circuit, the gate electrode 1221a of the drive transistor of the first sub-pixel G1 and the first light-emitting control signal line EM1a/the second light-emitting control signal line EM2a are both located in the first conductive layer 320 of the pixel circuit, the first electrode CC1a of the third capacitor C2 of the first sub-pixel G1 is located in the second conductive layer 330 of the pixel circuit, and the active layer 1242a of the second light-emitting control transistor and the active layer 1222a of the drive transistor of the first sub-pixel G1 are located in the active semiconductor layer 310 of the pixel circuit.

For example, the first connection electrode block Ce1 extends to the source-drain electrode metal layer 340 of the pixel circuit through the first via hole h1, so as to be electrically connected to the second electrode 1241a of the second light-emitting control transistor of the first sub-pixel G1 located in the source-drain electrode metal layer 340 of the pixel circuit.

For example, as shown in FIG. 6C, in the direction perpendicular to the base substrate 10, the first reset power supply signal line Init1b/the second reset power supply signal line Init2b connected to the pixel circuit of the second sub-pixel G2, at least a portion of a second connection portion 342b of the second sub-pixel G2, and a via hole 386b are provided between the first connection electrode block Ce1 and the base substrate 10, and the second connection portion 342b of the second sub-pixel G2 is electrically connected to the first reset power supply signal line Init1b/the second reset power supply signal line Init2b through the via hole 386b.

For example, the first reset power supply signal line Init1b/the second reset power supply signal line Init2b is located in the second conductive layer 330 of the pixel circuit.

For example, as shown in FIG. 6C, in the direction perpendicular to the base substrate 10, the first reset control signal line Rst1a/the second reset control signal line Rst2a connected to the pixel circuit of the second sub-pixel G2, at least a portion of the second connection portion 342b of the second sub-pixel G2, at least a portion of the first connection portion 341b of the second sub-pixel G2, a via hole 387b, a via hole 384b, a second electrode 1291b of the first reset transistor T6 of the second sub-pixel G2 (also the second electrode of the threshold compensation transistor T3 of the second sub-pixel G2), a first electrode 1292b of the first reset transistor T6 of the second sub-pixel G2 (also the first electrode of the second reset transistor T7 of the second sub-pixel G2) are disposed between the first drive electrode block De1 and the base substrate 10, the second connection portion 342b of the second sub-pixel G2 is electrically connected to the first electrode 1292b of the first reset transistor T6 of the second sub-pixel G2 through the via hole 387b, and the first connection portion 341b of the second sub-pixel G2 is electrically connected to the second electrode 1291b of the first reset transistor T6 of the second sub-pixel G2 through the via hole 384b.

For example, as shown in FIG. 6C, the second light-emitting control transistor of the second light-emitting control circuit 124b of the second sub-pixel G2 includes a second electrode 1241b (e.g., drain electrode) and an active layer 1242b. The drive transistor of the drive circuit of the second sub-pixel G2 includes a gate electrode 1221b (i.e., a control terminal of the drive circuit 122b) and an active layer 1222b. It should be noted that FIG. 6C does not show the gate electrode and the first electrode of the second light-emitting control transistor of the second sub-pixel G2, and the first electrode and the second electrode of the drive transistor of the second sub-pixel G2, etc.

For example, a gate insulation layer 131 is also provided between the gate electrode 1221b and the active layer 1222b of the drive transistor of the second sub-pixel G2. A first insulation layer 132 is also provided on the gate electrode 1221b of the drive transistor of the second sub-pixel G2. The first electrode CC1b of the third capacitor C2 of the second sub-pixel G2 is provided on a side of the first insulation layer 132 away from the base substrate 10. The second electrode 1241b of the second light-emitting control transistor of the second sub-pixel G2 is on a side of the second insulation layer 133 away from the base substrate 10, and is electrically connected to the active layer 1242b of the second light-emitting control transistor of the second sub-pixel G2 through a via hole 388b penetrating the second insulation layer 133, the first insulation layer 132, and the gate insulation layer 131.

For example, as shown in FIG. 6C, the first light-emitting control signal line EM1b connected to the first light-emitting control circuit of the second sub-pixel G2 and the second light-emitting control signal line EM2b connected to the second light-emitting control circuit are also provided on a side of the gate insulation layer 131 away from the base substrate 10.

For example, as shown in FIG. 6C, the orthographic projection of the second connection electrode block Ce2 on the base substrate 10 at least partially overlaps with the orthographic projection of the second light-emitting control signal line EM2b connected to the second light-emitting control circuit of the pixel circuit of the second sub-pixel G2 (i.e., the first light-emitting control signal line EM1b connected to the first light-emitting control circuit of the second sub-pixel G2) on the base substrate 10.

For example, as shown in FIG. 6C, the first scanning signal line Ga1b electrically connected to the data writing transistor of the second sub-pixel G2 and the second scanning signal line Ga2b electrically connected to the threshold compensation transistor of the second sub-pixel G2 are also provided on the side of the gate insulation layer 131 away from the base substrate 10.

For example, a first connection portion 341b of the second sub-pixel G2 is further provided on the side of the second insulation layer 133 away from the base substrate 10, and the first connection portion 341b of the second sub-pixel G2 is electrically connected to the gate electrode 1221b of the drive transistor of the second sub-pixel G2 through the via hole 385*b* penetrating the second insulation layer 133, the first electrode CC1*b* of the third capacitor C2 of the second sub-pixel G2, and the first insulation layer 132. The orthographic projection of the first connection portion 341*b* of the second sub-pixel G2 on the base substrate 10 at least partially overlaps with the orthographic projection of the gate electrode 1221*b* of the drive transistor of the second sub-pixel G2 on the base substrate 10, that is, the orthographic projection of the first connection portion 341*b* on the base substrate 10, the orthographic projection of the gate electrode 1221*b* of the drive transistor of the second sub-pixel G2 on the base substrate 10, and the orthographic projection of the second drive electrode block De2 on the base substrate 10 at least partially overlap.

It should be noted that for the second sub-pixel G2, in the direction perpendicular to the base substrate 10, metal layers, such as the first electrode CC1*b* of the third capacitor C2 of the second sub-pixel G2, the first connection portion 341*b* of the second sub-pixel G2, and the like, are also provided between the first electrode CC1*b* (i.e., the second drive electrode block De2) and the second electrode (i.e., the gate electrode 1221*b* of the drive transistor of the second sub-pixel G2) of the second capacitor C12. Therefore, there may also be a parasitic capacitance between the second drive electrode block De2 and the first connection portion 341*b* of the second sub-pixel G2, there may also be a parasitic capacitance between the second drive electrode block De2 and the first electrode CC1*b* of the third capacitor C2 of the second sub-pixel G2, there may also be a parasitic capacitance between the first electrode CC1*b* of the third capacitor C2 of the second sub-pixel G2 and the first connection portion 341*b* of the second sub-pixel G2, there may also be a parasitic capacitance between the gate electrode 1221*b* of the drive transistor of the second sub-pixel G2 and the first connection portion 341*b* of the second sub-pixel G2, and there may also be a parasitic capacitance between the gate electrode 1221*b* of the drive transistor of the second sub-pixel G2 and the first electrode CC1*b* of the third capacitor C2 of the second sub-pixel G2. The positions and sizes of these parasitic capacitances are related to the specific layout structure of the display substrate, and the present disclosure will not describe these parasitic capacitances in detail.

For example, the second electrode 1241*b* of the second light-emitting control transistor of the second sub-pixel G2 and the first connection portion 341*b* are both located in the source-drain electrode metal layer 340 of the pixel circuit, the gate electrode 1221*b* of the drive transistor of the second sub-pixel G2 and the first light-emitting control signal line EM1*b*/the second light-emitting control signal line EM2*b* are located in the first conductive layer 320 of the pixel circuit, the first electrode CC1*b* of the third capacitor C2 of the second sub-pixel G2 is located in the second conductive layer 330 of the pixel circuit, and the active layer 1242*b* of the second light-emitting control transistor and the active layer 1222*b* of the drive transistor of the second sub-pixel G2 are located in the active semiconductor layer 310 of the pixel circuit.

For example, the second connection electrode block Ce2 extends to the source-drain electrode metal layer 340 of the pixel circuit through the second via hole h2, so as to be electrically connected to the second electrode 1241*b*, which is located in the source-drain electrode metal layer 340 of the pixel circuit, of the second light-emitting control transistor of the second sub-pixel G2.

For example, as shown in FIGS. 6B and 6C, a shape of an overlapping portion between the orthographic projection of the first light-emitting voltage application electrode of the second sub-pixel G2 on the base substrate and the orthographic projection of the active semiconductor layer corresponding to the pixel circuit of the second sub-pixel G2 on the base substrate may include a "H" shape, and the active semiconductor layer portion corresponding to the "H" shape includes the active layer of the drive transistor of the pixel circuit of the second sub-pixel G2. In the direction perpendicular to the base substrate, a portion of the active semiconductor layer, corresponding to the pixel circuit of the second sub-pixel G2, overlapping with the first light-emitting voltage application electrode of the second sub-pixel G2 may include the active layer of the drive transistor of the pixel circuit of the second sub-pixel G2. In addition, a portion of the active semiconductor layer, corresponding to the pixel circuit of the second sub-pixel G2, overlapping with the first light-emitting voltage application electrode of the second sub-pixel G2 may further include a drain region of the second light-emitting control transistor T5 of the pixel circuit of the second sub-pixel G2.

For example, as shown in FIGS. 6B and 6C, the orthographic projection of the first light-emitting voltage application electrode of the second sub-pixel G2 on the base substrate overlaps with the orthographic projection of the source-drain electrode metal layer corresponding to the pixel circuit of the second sub-pixel G2 on the base substrate. In the direction perpendicular to the base substrate, a portion of the source-drain metal layer, corresponding to the pixel circuit of the second sub-pixel G2, overlapping with the first light-emitting voltage application electrode of the second sub-pixel G2 includes a portion of the first connection portion (i.e., a portion of the first connection portion overlapping with the gate electrode of the drive transistor of the pixel circuit of the second sub-pixel G2) and a third connection portion (i.e., a drain electrode of the second light-emitting control transistor T5 of the pixel circuit of the second sub-pixel G2), a portion of the first power supply signal line VDD1, and the like.

For example, as shown in FIGS. 6B and 6C, in the direction perpendicular to the base substrate, a portion of the active semiconductor layer, corresponding to the pixel circuit of the second sub-pixel G2, overlapping with the first light-emitting voltage application electrode of the first sub-pixel G1 may include active layers and drain regions of the first reset transistor T6 and the second reset transistor T7 in the reset circuit 129*b* of the pixel circuit of the second sub-pixel G2, a portion of the active layer ("H" shape) of the drive transistor in the pixel circuit of the first sub-pixel G1, and a drain region of the second light-emitting control transistor T5 of the pixel circuit of the first sub-pixel G1.

For example, as shown in FIGS. 6B and 6C, the orthographic projection of the first light-emitting voltage application electrode of the first sub-pixel G1 on the base substrate partially overlaps with the orthographic projection of the source-drain electrode metal layer corresponding to the pixel circuit of the first sub-pixel G1 on the base substrate and the orthographic projection of the source-drain electrode metal layer corresponding to the pixel circuit of the second sub-pixel G2 on the base substrate. For example, in the direction perpendicular to the base substrate, a portion of the source-drain electrode metal layer, corresponding to the pixel circuit of the second sub-pixel G2, overlapping with the first light-emitting voltage application electrode of the first sub-pixel G1 includes a portion of the first connection portion (i.e., a portion of the first connection portion overlapping with the drain region of the threshold compensation transistor), a second connection portion (i.e., a connection portion between the drain electrode of the second reset transistor of the pixel circuit of the second sub-pixel G2 and the first reset power supply signal line), a portion of the first power supply signal line VDD1, and the like. A portion of the source-drain electrode metal layer, corresponding to the pixel circuit of the first sub-pixel G1, overlapping with the first light-emitting voltage application electrode of the first sub-pixel G1 includes a portion of the first connection portion (i.e., the portion of the first connection portion overlapping with the gate electrode of the drive transistor of the pixel circuit of the first sub-pixel G1) and the third connection portion (i.e., the drain electrode of the second light-emitting control transistor of the pixel circuit of the first sub-pixel G1), etc. For example, as shown in FIG. 6D, the second light-emitting control transistor of the second light-emitting control circuit 124d of the fourth sub-pixel B includes a second electrode 1241d (e.g., drain electrode) and an active layer 1242c. The drive transistor of the drive circuit of the third sub-pixel R includes a gate electrode 1221d (i.e., the control terminal of the drive circuit 122d) and an active layer 1222d. It should be noted that FIG. 6D does not show the gate electrode and the first electrode of the second light-emitting control transistor of the fourth sub-pixel B, and the first electrode and the second electrode of the drive transistor of the fourth sub-pixel B, etc.

For example, as shown in FIG. 6D, a gate insulation layer 131 is provided between the gate electrode 1221d and the active layer 1222d of the drive transistor of the fourth sub-pixel B, and a first insulation layer 132 is also provided on the gate electrode 1221d of the drive transistor of the fourth sub-pixel B. The first electrode CC1d of the third capacitor C2 of the fourth sub-pixel B is provided on a side of the first insulation layer 132 away from the base substrate 10. The second electrode 1241d of the second light-emitting control transistor of the fourth sub-pixel B is on a side of the second insulation layer 133 away from the base substrate 10, and is electrically connected to the active layer 1242d of the second light-emitting control transistor of the fourth sub-pixel B through a via hole 388d penetrating the second insulation layer 133, the first insulation layer 132, and the gate insulation layer 131.

For example, as shown in FIG. 6D, a first light-emitting control signal line EM1d connected to the first light-emitting control circuit of the fourth sub-pixel B and a second light-emitting control signal line EM2d connected to the second light-emitting control circuit are also provided on a side of the gate insulation layer 131 away from the base substrate 10. For example, as shown in FIGS. 6B and 6C, for the fourth sub-pixel B located in the second row, the first light-emitting control signal line EM1d and the second light-emitting control signal line EM2d corresponding to the fourth sub-pixel B are the same signal line, and the first light-emitting control signal line EM1d/the second light-emitting control signal line EM2d and the first light-emitting control signal line EM1b/the second light-emitting control signal line EM2b corresponding to the second sub-pixel G2 located in the second row are also the same signal line.

For example, as shown in FIG. 6D, the orthographic projection of the fourth connection electrode block Ce4 on the base substrate 10 at least partially overlaps with the orthographic projection of the second light-emitting control signal line EM2d connected to the second light-emitting control circuit of the pixel circuit of the fourth sub-pixel B (i.e., the first light-emitting control signal line EM1d connected to the first light-emitting control circuit of the fourth sub-pixel B) on the base substrate 10.

For example, as shown in FIG. 6D, a first scanning signal line Ga1d electrically connected to the data writing transistor of the fourth sub-pixel B and a second scanning signal line Ga2d electrically connected to the threshold compensation transistor of the fourth sub-pixel B are also provided on the side of the gate insulation layer 131 away from the base substrate 10. For example, as shown in FIGS. 6B and 6C, for the fourth sub-pixel B located in the second row, the first scanning signal line Ga1d and the second scanning signal line Ga2d corresponding to the fourth sub-pixel B are the same signal line, and the first scanning signal line Ga1d/the second scanning signal line Ga2d and the first scanning signal line Ga1b/second scanning signal line Ga2b corresponding to the second sub-pixel G2 located in the second row are also the same signal line.

For example, a first connection portion 341d of the fourth sub-pixel B is also provided on the side of the second insulation layer 133 away from the base substrate 10, and the first connection portion 341d of the fourth sub-pixel B is electrically connected to the gate electrode 1221d of the drive transistor of the fourth sub-pixel B through a via hole 385d penetrating the second insulation layer 133, the first electrode CC1d of the third capacitor C2 of the fourth sub-pixel B, and the first insulation layer 132. The orthographic projection of the first connection portion 341d of the fourth sub-pixel B on the base substrate 10 at least partially overlaps with the orthographic projection of the gate electrode 1221d of the drive transistor of the fourth sub-pixel B on the base substrate 10, that is, the orthographic projection of the first connection portion 341d on the base substrate 10, the orthographic projection of the gate electrode 1221d of the drive transistor of the fourth sub-pixel B on the base substrate 10, and the orthographic projection of the fourth drive electrode block De4 on the base substrate 10 at least partially overlap.

It should be noted that for the fourth sub-pixel B, in the direction perpendicular to the base substrate 10, metal layers, such as the first electrode CC1d of the third capacitor C2 of the fourth sub-pixel B, the first connection portion 341d of the fourth sub-pixel B, and the like, are also provided between the fourth drive electrode block De4 and the gate electrode 1221d of the drive transistor of the fourth sub-pixel B. Therefore, there may also be a parasitic capacitance between the fourth drive electrode block De4 and the first connection portion 341d of the fourth sub-pixel B, there may also be a parasitic capacitance between the fourth drive electrode block De4 and the first electrode CC1d of the third capacitor C2 of the fourth sub-pixel B, there may also be a parasitic capacitance between the first electrode CC1d of the third capacitor C2 of the fourth sub-pixel B and the first connection portion 341d of the fourth sub-pixel B, there may also be a parasitic capacitance between the gate electrode 1221d of the drive transistor of the fourth sub-pixel B and the first connection portion 341d of the fourth sub-pixel B, and there may also a be parasitic capacitance between the gate electrode 1221d of the drive transistor of the fourth sub-pixel B and the first electrode CC1d of the third capacitor C2 of the fourth sub-pixel B. The positions and sizes of these parasitic capacitances are related to the specific layout structure of the display substrate, and the present disclosure will not describe these parasitic capacitances in detail.

For example, as shown in FIG. 6D, a first reset power supply signal line Init1d/a second reset power supply signal line Init2 connected to the pixel circuit of the fourth sub-pixel B and a via hole 386d are provided on the base substrate 10. At least a portion of a second connection portion 342d of the fourth sub-pixel B is provided between the fourth drive electrode block Ce1 and the base substrate 10 in the direction perpendicular to the base substrate 10, and the second connection portion 342d of the fourth sub-pixel B is electrically connected to the first reset power supply signal line Int1d/the second reset power supply signal line Init2d through the via hole 386d.

For example, as shown in FIG. 6D, in the direction perpendicular to the base substrate 10, a first reset control signal line Rst1d/a second reset control signal line Rst2d connected to the pixel circuit of the fourth sub-pixel B, at least a portion of the second connection portion 342d of the fourth sub-pixel B, a first connection portion 341d of the fourth sub-pixel B, a via hole 387d, a via hole 384d, a second electrode 1291d of the first reset transistor T6 of the fourth sub-pixel B (also a second electrode of the threshold compensation transistor T3 of the fourth sub-pixel B), a first electrode 1292d of the first reset transistor T6 of the fourth sub-pixel B (also a first electrode of the second reset transistor T7 of the fourth sub-pixel B) are provided between the fourth drive electrode block De4 and the base substrate 10, the second connection portion 342d of the fourth sub-pixel B is electrically connected to the first electrode 1292d of the first reset transistor T6 of the fourth sub-pixel B through the via hole 387d, and the first connection portion 341d of the fourth sub-pixel B is electrically connected to the second electrode 1291d of the first reset transistor T6 of the fourth sub-pixel B through the via hole 384d.

For example, the second electrode 1241d of the second light-emitting control transistor of the fourth sub-pixel B and the first connection portion 341d are both located in the source-drain electrode metal layer 340 of the pixel circuit, the gate electrode 1221d of the drive transistor of the fourth sub-pixel B and the first light-emitting control signal line EM1d/the second light-emitting control signal line EM2d are located in the first conductive layer 320 of the pixel circuit of the fourth sub-pixel B, the first electrode CC1d of the third capacitor C2 of the fourth sub-pixel B and the first reset power supply signal line Init1d/the second reset power supply signal line Init2d are located in the second conductive layer 330 of the pixel circuit, and the active layer 1242d of the second light-emitting control transistor and the active layer 1222d of the drive transistor of the fourth sub-pixel B are located in the active semiconductor layer 310 of the pixel circuit.

For example, the fourth connection electrode block Ce4 extends to the source-drain electrode metal layer of the pixel circuit through the fourth via hole h4, so as to be electrically connected to the second electrode 1241d, which is located in the source-drain electrode metal layer of the pixel circuit, of the second light-emitting control transistor of the fourth sub-pixel B.

For example, the connection relationship among respective circuits (e.g., a drive circuit, a first light-emitting control circuit, a second light-emitting control circuit, a storage circuit, a reset circuit, a threshold compensation circuit, a data writing circuit, etc.) of the pixel circuit of the third sub-pixel R and the connection relationship among respective circuits of the pixel circuit of the fourth sub-pixel B are identical to the example as shown in FIG. 3A.

The embodiment of the present disclosure also provides a display substrate. As shown in FIG. 2, the display substrate 100 includes a base substrate 10 and a plurality of repeating units 11 on the base substrate 10, each repeating unit 11 includes a plurality of sub-pixels 12. Each sub-pixel 12 includes a light-emitting element 120 and a pixel circuit 121 for driving the light-emitting element 120 to emit light, and the pixel circuit 121 includes a drive circuit 122.

For example, as shown in FIG. 5A, drive circuits 122 of the plurality of sub-pixels 12 are arranged in an array on the base substrate 10. For example, regions 31 to 40 may be regions where the drive circuits of the respective sub-pixels on the base substrate 10 are located. In the example as shown in FIG. 5A, two rows and five columns of drive circuits are shown. For example, in the example as shown in FIG. 3A, in the repeating unit 11 circled by dotted lines, the drive circuit of the pixel circuit of the first sub-pixel G1 is located in the region 32, the drive circuit of the pixel circuit of the second sub-pixel G2 is located in the region 37, the drive circuit of the pixel circuit of the third sub-pixel R is located in the region 38, and the drive circuit of the pixel circuit of the fourth sub-pixel B is located in the region 36.

It should be noted that in the present disclosure, "row" may represent a row corresponding to areas where respective pixel circuits are located, and "column" may represent a column corresponding to areas where respective pixel circuits are located.

For example, the light-emitting element 120 of each sub-pixel includes a first light-emitting voltage application electrode, a second light-emitting voltage application electrode, and a light-emitting layer between the first light-emitting voltage application electrode and the second light-emitting voltage application electrode. For example, in some embodiments, the first light-emitting voltage application electrode is an anode and the second light-emitting voltage application electrode is a cathode.

For example, as shown in FIGS. 5A and 6A, the plurality of sub-pixels 12 include a first sub-pixel G1 and a second sub-pixel G2. For example, a color of light emitted by the light-emitting element of the first sub-pixel G1 is identical to a color of light emitted by the light-emitting element of the second sub-pixel G2, for example, both the first sub-pixel G1 and the second sub-pixel G2 are green sub-pixels.

For example, as shown in FIG. 6A, the first light-emitting voltage application electrode of the light-emitting element of the first sub-pixel G1 and the first light-emitting voltage application electrode of the light-emitting element of the second sub-pixel G2 are arranged in a first direction X.

For example, as shown in FIG. 6A, the first light-emitting voltage application electrode 1201a of the light-emitting element of the first sub-pixel G1 includes an auxiliary electrode block Ae, a first drive electrode block De1, and a first connection electrode block Ce1, and the auxiliary electrode block Ae, the first drive electrode block De1, and the first connection electrode block Ce1 are electrically connected to each other.

For example, as shown in FIG. 6A, the first light-emitting voltage application electrode 1201b of the light-emitting element of the second sub-pixel G2 includes a second drive electrode block De2 and a second connection electrode block Ce2, and the second drive electrode block De2 is electrically connected to the second connection electrode block Ce2.

For example, an area of the first light-emitting voltage application electrode 1201a of the light-emitting element of the first sub-pixel G1 is different from an area of the first light-emitting voltage application electrode 1201b of the light-emitting element of the second sub-pixel G2, for example, the area of the first light-emitting voltage application electrode 1201a of the light-emitting element of the first sub-pixel G1 is larger than the area of the first light-emitting voltage application electrode 1201b of the light-emitting element of the second sub-pixel G2.

For example, as shown in FIG. 6B, the auxiliary electrode block Ae is located on a side of the control terminal of the drive circuit of the pixel circuit of the first sub-pixel G1 away from the base substrate 10, and the second drive electrode block De2 is located on a side of the control terminal of the drive circuit of the pixel circuit of the second sub-pixel G2 away from the base substrate 10. For example, a shape of the auxiliary electrode block Ae is different from a shape of the second drive electrode block De2, that is, a shape of an anode portion of the first sub-pixel G1 located on a side of the control terminal of the drive circuit of the pixel circuit of the first sub-pixel G1 away from the base substrate 10 is different from a shape of an anode portion of the second sub-pixel G2 located on a side of the control terminal of the drive circuit of the pixel circuit of the second sub-pixel G2 away from the base substrate 10.

For example, as shown in FIG. 3A, the drive circuit 122 of the pixel circuit 121 of each sub-pixel includes a drive transistor T1. The auxiliary electrode block Ae is located on a side of a gate electrode of the drive transistor T1 of the pixel circuit of the first sub-pixel G1 away from the base substrate 10, and the second drive electrode block De2 is located on a side of a gate electrode of the drive transistor T1 of the pixel circuit of the second sub-pixel G2 away from the base substrate 10.

For example, the orthographic projection of the auxiliary electrode block Ae on the base substrate at least partially overlaps with the orthographic projection of the gate electrode of the drive transistor T1 of the pixel circuit of the first sub-pixel G1 on the base substrate, and the orthographic projection of the second drive electrode block De2 on the base substrate at least partially overlaps with the orthographic projection of the gate electrode of the drive transistor T1 of the pixel circuit of the second sub-pixel G2 on the base substrate.

For example, an area of an overlapping portion between the orthographic projection of the auxiliary electrode block Ae on the base substrate and the orthographic projection of the gate electrode of the drive transistor T1 of the pixel circuit of the first sub-pixel G1 on the base substrate is a first area, an area of an overlapping portion between the orthographic projection of the second drive electrode block De2 on the base substrate and the orthographic projection of the gate electrode of the drive transistor T1 of the pixel circuit of the second sub-pixel G2 on the base substrate is a second area, and a ratio of the first area to the second area satisfies the following relation:

$$A\min \leq A1/A2 \leq A\max,$$

where A1 represents the first area, A2 represents the second area, Amin represents a minimum ratio threshold and is 90%, and Amax represents a maximum ratio threshold and is 110%.

For example, as shown in FIGS. 6A and 6B, a shape of the first drive electrode block De1 is different from a shape of the auxiliary electrode block Ae, and a shape of the first drive electrode block De1 is identical to a shape of the second drive electrode block De2. For example, the shape of the first drive electrode block De1 and the shape of the second drive electrode block De2 may both be pentagons, and the shape of the auxiliary electrode block Ae may be a rectangle. However, the present disclosure is not limited to this case. The shape of the first drive electrode block De1 and the shape of the second drive electrode block De2 may also be rectangles or the like, and the shape of the auxiliary electrode block Ae may be a pentagon, a hexagon, an ellipse, or the like.

For example, an area of the orthographic projection of the first drive electrode block De1 on the base substrate 10 is identical to an area of the orthographic projection of the second drive electrode block De2 on the base substrate 10.

For example, as shown in FIGS. 6A and 6B, a shape of the first connection electrode block Ce1 may be identical to a shape of the second connection electrode block Ce2. For example, the shape of the first connection electrode block Ce1 and the shape of the second connection electrode block Ce2 may both be rectangles.

For example, an area of the orthographic projection of the first connection electrode block Ce1 on the base substrate 10 is identical to an area of the orthographic projection of the second connection electrode block Ce2 on the base substrate 10.

It should be noted that in some embodiments of the present disclosure, the shape of the first connection electrode block Ce1 may also be different from the shape of the second connection electrode block Ce2, and/or the area of the orthographic projection of the first connection electrode block Ce1 on the base substrate 10 may also be different from the area of the orthographic projection of the second connection electrode block Ce2 on the base substrate 10.

For example, as shown in FIG. 6B, the control terminal of the drive circuit of the pixel circuit of the first sub-pixel G1 and the control terminal of the drive circuit of the pixel circuit of the second sub-pixel G2 are arranged in the first direction X, that is, the gate electrode of the drive transistor T1 of the pixel circuit of the first sub-pixel G1 and the gate electrode of the drive transistor T1 of the pixel circuit of the second sub-pixel G2 are arranged in the first direction X.

For example, as shown in FIG. 6B, in the first direction X, the first drive electrode block De1 is located on a side of the control terminal of the drive circuit of the pixel circuit of the first sub-pixel G1 close to the control terminal of the drive circuit of the pixel circuit of the second sub-pixel G2. For example, in some examples, as shown in FIG. 6B, in the first direction X, the first drive electrode block De1 is located between the control terminal of the drive circuit of the pixel circuit of the first sub-pixel G1 and the control terminal of the drive circuit of the pixel circuit of the second sub-pixel G2.

For example, as shown in FIG. 6B, in the first direction X, the first connection electrode block Ce1 is located on a side of the first drive electrode block De1 away from the control terminal of the drive circuit of the pixel circuit of the second sub-pixel G2. For example, in the first direction X, the first connection electrode block Ce1 is located between the control terminal of the drive circuit of the pixel circuit of the first sub-pixel G1 and the control terminal of the drive circuit of the pixel circuit of the second sub-pixel G2. That is, in the first direction X, the first connection electrode block Ce1 and the first drive electrode block De1 are both located between the control terminal of the drive circuit of the pixel circuit of the first sub-pixel G1 and the control terminal of the drive circuit of the pixel circuit of the second sub-pixel G2.

For example, in the first direction X, the first connection electrode block Ce1 is located on a side of the first drive electrode block De1 away from the second drive electrode block De2, that is, the first drive electrode block De1 is located between the first connection electrode block Ce1 and the second drive electrode block De2.

For example, in the first direction X, the first connection electrode block Ce1 is located between the first drive electrode block De1 and the auxiliary electrode block Ae, that is, the auxiliary electrode block Ae is located on a side of the first connection electrode block Ce1 away from the first drive electrode block De1.

For example, in the first direction X, the second connection electrode block Ce2 is located on a side of the control terminal of the drive circuit of the pixel circuit of the second sub-pixel G2 away from the control terminal of the drive circuit of the pixel circuit of the first sub-pixel G1.

For example, in the first direction X, the second drive electrode block De2 is located between the second connection electrode block Ce2 and the first drive electrode block De1, that is, the second connection electrode block Ce2 is located on a side of the second drive electrode block De2 away from the first drive electrode block De1.

For example, as shown in FIG. 5A, the plurality of sub-pixels 12 further include a third sub-pixel R and a fourth sub-pixel B. For example, a first light-emitting voltage application electrode of the light-emitting element of the third sub-pixel R and a first light-emitting voltage application electrode of the light-emitting element of the fourth sub-pixel B are arranged in the second direction Y. The first direction X and the second direction Y are perpendicular to each other.

For example, as shown in FIG. 6A, the first light-emitting voltage application electrode of the light-emitting element of the third sub-pixel R includes a third drive electrode block De3 and a third connection electrode block Ce3, and the third drive electrode block De3 and the third connection electrode block Ce3 are electrically connected to each other. For example, an orthographic projection of the third drive electrode block De3 on the base substrate at least partially overlaps with an orthographic projection of the control terminal of the drive circuit of the pixel circuit of the third sub-pixel R on the base substrate.

For example, as shown in FIG. 6A, the first light-emitting voltage application electrode of the light-emitting element of the fourth sub-pixel B includes a fourth drive electrode block De4 and a fourth connection electrode block Ce4, and the fourth drive electrode block De4 and the fourth connection electrode block Ce4 are electrically connected to each other. For example, as shown in FIG. 6B, the fourth drive electrode block De4 is located on a side of the control terminal of the drive circuit of the pixel circuit of the fourth sub-pixel B away from the base substrate 10, for example, an orthographic projection of the fourth drive electrode block De4 on the base substrate at least partially overlaps with an orthographic projection of the control terminal of the drive circuit of the pixel circuit of the fourth sub-pixel B on the base substrate.

For example, in the first direction X, a distance between a center of the control terminal of the drive circuit (i.e., the gate electrode of the drive transistor) of the pixel circuit of the first sub-pixel G1 and a center of the first drive electrode block De1 is greater than a distance between a center of the control terminal of the drive circuit of the pixel circuit of the second sub-pixel G2 and a center of the second drive electrode block De2.

It should be noted that in the present disclosure, "center" may represent a geometric center of a physical shape of an element. When designing the pixel arrangement structure, elements, such as the gate electrode of the drive transistor and the anode of the light-emitting element, are generally designed to have regular shapes, such as a rectangle, a hexagon, a pentagon, a trapezoid, or other shapes. When designing, the center of an element (e.g., the gate electrode of the drive transistor or the anode of the light-emitting element, etc.) may be a geometric center of the above-mentioned regular shape. However, in the actual manufacturing process, shapes of the elements, such as the gate electrode of the drive transistor and the anode of the light-emitting element, which are formed, generally deviates from the regular shapes designed above. For example, respective corners of the above-mentioned regular shapes may be rounded, so the shapes of the elements, such as the gate electrode of the drive transistor, the anode of the light-emitting element, etc., may be fillet shapes. In addition, the shapes of the elements, such as the gate electrode of the drive transistor and the anode of the light-emitting element, which are actually manufactured, may also have other changes with the designed shapes. For example, the shape of a sub-pixel designed as a hexagon may become approximately ellipse shape in an actual manufacturing process. Therefore, the centers of the elements, such as the gate electrode of the drive transistor and the anode of the light-emitting element, may not be the strict geometric centers of the irregular shapes of the formed sub-pixels. In the embodiment of the present disclosure, the center of the element may have a certain offset from the geometric center of the shape of the element. In addition, "center" can also represent the center of gravity of the element.

The embodiment of the present disclosure also provides a display substrate. As shown in FIG. 2, the display substrate 100 includes a base substrate 10 and a plurality of repeating units 11 on the base substrate 10, and each repeating unit 11 includes a plurality of sub-pixels 12. Each sub-pixel 12 includes a light-emitting element 120 and a pixel circuit 121, and the pixel circuit 121 is used for driving the light-emitting element 120 to emit light.

For example, the light-emitting element of each sub-pixel includes a first light-emitting voltage application electrode, a second light-emitting voltage application electrode, and a light-emitting layer between the first light-emitting voltage application electrode and the second light-emitting voltage application electrode.

For example, as shown in FIG. 3A, the pixel circuit 121 of each sub-pixel includes a drive circuit 122, a second light-emitting control circuit 124, and a reset circuit 129.

For example, the second light-emitting control circuit 124 is electrically connected to a second light-emitting control signal line EM2, a second terminal of the drive circuit 122, and the first light-emitting voltage application electrode of the light-emitting element 120, and is configured to achieve to control a connection between the drive circuit 122 and the light-emitting element 120 to be turned on or turned off under control of the second light-emitting control signal provided by the second light-emitting control signal line EM2.

The reset circuit 129 is electrically connected to a control terminal of the drive circuit 122 and a first reset control signal line Rst1, and is configured to reset the control terminal of the drive circuit 122 under control of the first sub-reset control signal provided by the first reset control signal line Rst1.

For example, the second light-emitting control signal line EM2 and the first reset control signal line Rst1 are arranged in the first direction X. As shown in FIG. 4B, for the first sub-pixel G1, the second light-emitting control signal line EM2a connected to the second light-emitting control circuit of the first sub-pixel G1 and a first reset control signal line Rst1a connected to the reset circuit of the first sub-pixel G1 are arranged along the first direction X.

For example, as shown in FIG. 5A, the plurality of sub-pixels 12 include a first sub-pixel G1 and a second sub-pixel G2. For example, a color of light emitted by the light-emitting element of the first sub-pixel G1 is identical to a color of light emitted by the light-emitting element of the second sub-pixel G2, and a shape of the first light-emitting voltage application electrode of the light-emitting element of the first sub-pixel G1 is different from a shape of the first light-emitting voltage application electrode of the light-emitting element of the second sub-pixel G2.

For example, as shown in FIG. 6B, an orthographic projection of the first light-emitting voltage application electrode of the light-emitting element of the first sub-pixel G1 on the base substrate at least partially overlaps with both an orthographic projection of the first reset control signal line Rst1b connected to the reset circuit of the pixel circuit of the second sub-pixel G2 on the base substrate, and an orthographic projection of the second light-emitting control signal line EM2a connected to the second light-emitting control circuit of the pixel circuit of the first sub-pixel G1 on the base substrate. An orthographic projection of the first light-emitting voltage application electrode of the light-emitting element of the second sub-pixel G2 on the base substrate at least partially overlaps with an orthographic projection of the second light-emitting control signal line EM2b connected to the second light-emitting control circuit of the pixel circuit of the second sub-pixel G2 on the base substrate.

For example, as shown in FIG. 3A, the reset circuit 129 is also electrically connected to the first light-emitting voltage application electrode of the light-emitting element and a second reset control signal line Rst2, and is configured to reset the first light-emitting voltage application electrode of the light-emitting element under control of a second sub-reset control signal provided by the second reset control signal line Rst2. For example, in some embodiments, the first reset control signal line Rst1 and the second reset control signal line Rst2 are the same signal line.

For example, as shown in FIG. 3A, the pixel circuit 121 of each sub-pixel further includes a data writing circuit 126, the data writing circuit 126 is electrically connected to the first terminal of the drive circuit 122 and the first scanning signal line Ga1, and the data writing circuit 126 is configured to write a data signal to the control terminal of the drive circuit 122 under control of the scanning signal provided by the first scanning signal line Ga1.

For example, in the first direction X, the first scanning signal line Ga1 is located between the second light-emitting control signal line EM1 and the first reset control signal line Rst1. As shown in FIG. 4B, for the first sub-pixel G1, a first scanning signal line Ga1a connected to the data writing circuit of the first sub-pixel G1 is located between the second light-emitting control signal line EM2a connected to the second light-emitting control circuit of the first sub-pixel G1 and the first reset control signal line Rst1a connected to the reset circuit of the first sub-pixel G1.

For example, as shown in FIG. 6A, the first light-emitting voltage application electrode of the light-emitting element of the first sub-pixel G1 and the first light-emitting voltage application electrode of the light-emitting element of the second sub-pixel G2 are arranged in the first direction X.

For example, as shown in FIG. 6B, in the first direction X, a first scanning signal line Ga1b connected to the data writing circuit of the pixel circuit of the second sub-pixel G2 is located between the first light-emitting voltage application electrode of the light-emitting element of the first sub-pixel G1 and the first light-emitting voltage application electrode of the light-emitting element of the second sub-pixel G2.

For example, the reset circuit 129 of each sub-pixel is also electrically connected to a first reset power supply signal line, and the reset circuit 129 is configured to reset the control terminal of the drive circuit 1222 according to a first reset signal provided by the first reset power supply signal line under control of the first sub-reset control signal provided by the first reset control signal line.

For example, the reset circuit 129 of each sub-pixel is also electrically connected to a second reset power supply signal line, and the reset circuit 129 is configured to reset the first light-emitting voltage application electrode of the light-emitting element according to a second reset signal provided by the second reset power supply signal line under control of the second sub-reset control signal provided by the second reset control signal line. For example, in some embodiments, the first reset power supply signal line and the second reset power supply signal line are the same signal line.

For example, in the first direction X, the first reset power supply signal line is located on a side of the first reset control signal line away from the second light-emitting control signal line, that is, the first reset control signal line is located between the first reset power supply signal line and the second light-emitting control signal line. As shown in FIG. 4E, for the first sub-pixel G1, in the first direction X, the first reset power supply signal line Init1a connected to the reset circuit of the first sub-pixel G1 is located on a side of the first reset control signal line Rst1a connected to the reset circuit of the first sub-pixel G1 away from the second light-emitting control signal line EM2a connected to the second light-emitting control circuit of the first sub-pixel G1, that is, the first reset control signal line Rst1a is located between the first reset power supply signal line Init1a and the second light-emitting control signal line EM2a.

For example, the second light-emitting control signal line, the first reset control signal line, the first scanning signal line, and the first reset power supply signal line all extend in a second direction, and the second direction is perpendicular to the first direction. For example, the second light-emitting control signal line, the first reset control signal line, the first scanning signal line, and the first reset power supply signal line are parallel to each other, for example, substantially parallel. As shown in FIG. 4E, for the first sub-pixel G1, the second light-emitting control signal line EM2a connected to the second light-emitting control circuit of the first sub-pixel G1, the first reset control signal line Rst1a connected to the reset circuit of the first sub-pixel G1, the first scanning signal line Ga1a connected to the data writing circuit of the first sub-pixel G1, and the first reset power supply signal line Init1a connected to the reset circuit of the first sub-pixel G1 all extend in the second direction Y and are substantially parallel to each other.

It should be noted that in the present disclosure, "extent" represents a routing direction of each signal line (e.g., the second light-emitting control signal line, the first reset control signal line, the first scanning signal line, and the first reset power supply signal line) in general. Each signal line may not be a straight line in microscopic view, but may extend along the second direction Y in a wavy shape.

For example, as shown in FIG. 6B, the orthographic projection of the first light-emitting voltage application electrode of the light-emitting element of the first sub-pixel G1 on the base substrate at least partially overlaps with the orthographic projection of the first reset power supply signal line Rst1b connected to the reset circuit of the pixel circuit of the second sub-pixel G2 on the base substrate.

For example, as shown in FIG. 6A, the first light-emitting voltage application electrode of the light-emitting element of the first sub-pixel G1 includes an auxiliary electrode block Ae, a first drive electrode block De1, and a first connection electrode block Ce1, the auxiliary electrode block Ae, the first drive electrode block De1, and the first connection electrode block Ce1 are electrically connected to each other and arranged in the first direction X. The first light-emitting voltage application electrode of the light-emitting element of the second sub-pixel G2 includes a second drive electrode block De2 and a second connection electrode block Ce2, and the second drive electrode block De2 and the second connection electrode block Ce2 are electrically connected to each other and arranged along the first direction X.

For example, in the first direction X, the first connection electrode block Ce1 and the auxiliary electrode block Ae are both located on a side of the first drive electrode block De1 away from the second drive electrode block De2, the first connection electrode block Ce1 is located between the auxiliary electrode Ae and the first drive electrode block De1, and the second connection electrode block Ce2 is located on a side of the second drive electrode block De2 away from the first drive electrode block De1.

For example, as shown in FIG. 6B, the orthographic projection of the first drive electrode block De1 on the base substrate at least partially overlaps with both the orthographic projection of the first reset control signal line Rst1b connected to the reset circuit of the pixel circuit of the second sub-pixel G2 on the base substrate and the orthographic projection of the first reset power supply signal line Init1b connected to the reset circuit of the pixel circuit of the second sub-pixel G2 on the base substrate. The orthographic projection of the first connection electrode block Ce1 on the base substrate at least partially overlaps with the orthographic projection of the second light-emitting control signal line EM1a connected to the second light-emitting control circuit of the pixel circuit of the first sub-pixel G1 on the base substrate. In the first direction, the auxiliary electrode block Ae is located on a side of the second light-emitting control signal line EM1a connected to the second light-emitting control circuit of the pixel circuit of the first sub-pixel G1 away from the first light-emitting voltage application electrode of the light-emitting element of the second sub-pixel G2.

For example, as shown in FIG. 6B, the orthographic projection of the second connection electrode block Ce2 on the base substrate at least partially overlaps with the orthographic projection of the second light-emitting control signal line EM1b connected to the second light-emitting control circuit of the pixel circuit of the second sub-pixel G2 on the base substrate, and in the first direction X, the second drive electrode block De2 is located between the second light-emitting control signal line EM1b connected to the second light-emitting control circuit of the pixel circuit of the second sub-pixel G2 and the first scanning signal line Ga1b connected to the data writing circuit of the pixel circuit of the second sub-pixel G2.

Figure 7:
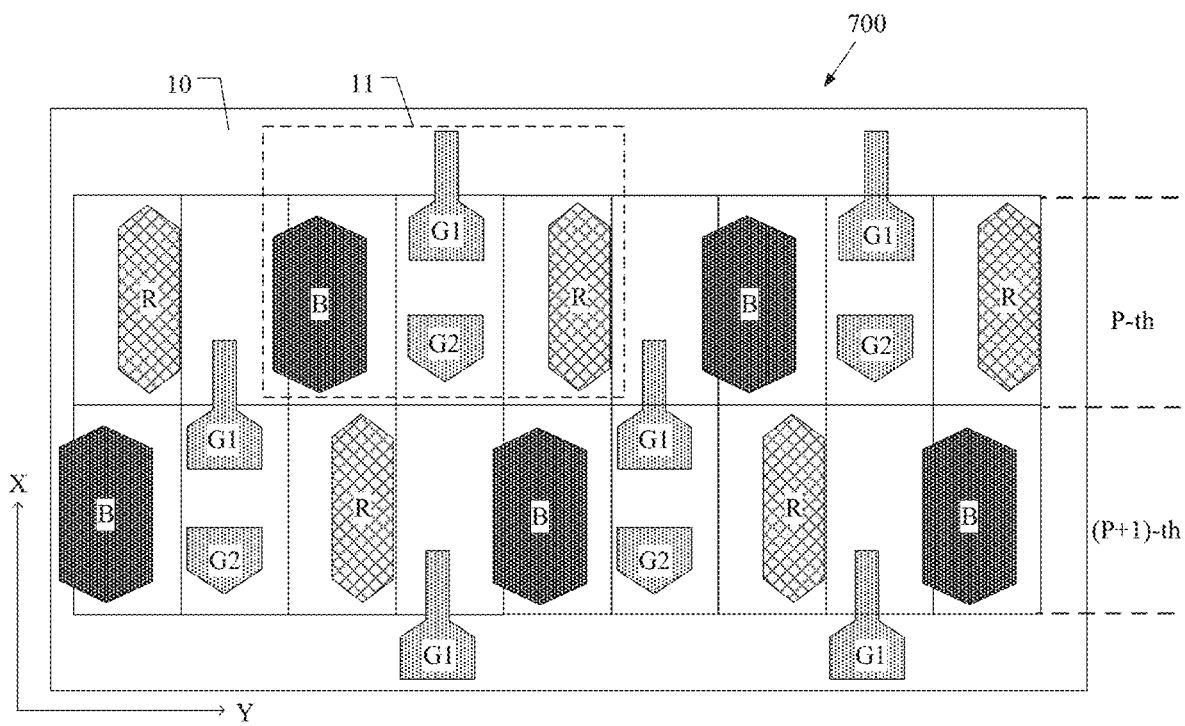
FIG. 7 is a partial structural schematic diagram of a display panel provided by some embodiments of the present disclosure.

The embodiment of the present disclosure also provides a display panel. FIG. 7 is a partial structural diagram of a display panel provided by some embodiments of the present disclosure. For example, as shown in FIG. 7, the display panel 700 includes the display substrate 100 provided by any one of the above embodiments.

For example, as shown in FIG. 7, a plurality of repeating units 11 are arranged along the second direction Y to form a plurality of repeating unit groups. FIG. 7 shows two repeating unit groups, and the two repeating unit groups are respectively a P-th repeating unit group and a (P+1)-th repeating unit group, and the P-th repeating unit group and the (P+1)-th repeating unit group are adjacent two repeating unit groups, for example, P is a positive integer greater than or equal to one. The plurality of repeating unit groups are arranged along the first direction X. That is, the plurality of repeating units 11 in the display substrate 100 are arranged in an array along the first direction X and the second direction Y.

It should be noted that referring to FIGS. 5A and 6E above, the P-th repeating unit group is located in the first row and the (P+1)-th repeating unit group is located in the second row. FIG. 7 does not show connection electrode blocks of the light-emitting elements of respective sub-pixels.

For example, an extension line of a line connecting a center of the first sub-pixel G1 and a center of the second sub-pixel G2 of the repeating unit in the P-th repeating unit group does not coincide with an extension line of a line connecting a center of the first sub-pixel G1 and a center of the second sub-pixel G2 of the repeating unit in the (P+1)-th repeating unit group. For example, the extension line of the line connecting the center of the first sub-pixel G1 and the center of the second sub-pixel G2 of the repeating unit in the P-th repeating unit group passes through a center of an interval between adjacent two repeating units in the (P+1)-th repeating unit group, similarly, the extension line of the line connecting the center of the first sub-pixel G1 and the center of the second sub-pixel G2 of the repeating unit in the (P+1)-th repeating unit group passes through a center of an interval between adjacent two repeating units in the P-th repeating unit group.

For example, the display panel 700 may be a liquid crystal display panel or an organic light-emitting diode (OLED) display panel or the like. For example, in a case where the display panel 700 is a liquid crystal display panel, the display substrate 100 may be an array substrate or a color film substrate. In a case where the display panel 700 is an organic light-emitting diode display panel, the display substrate 100 may be an array substrate.

For example, the display panel 700 may be a rectangular panel, a circular panel, an elliptical panel, a polygonal panel, or the like. In addition, the display panel 700 may be not only a planar panel, but also a curved panel or even a spherical panel.

For example, the display panel 700 may also have a touch function, that is, the display panel 600 may be a touch display panel.

For example, the display panel 700 can be applied to any product or component with a display function, such as a mobile phone, a tablet computer, a television, a display, a notebook computer, a digital photo frame, a navigator, etc.

Figure 8A:
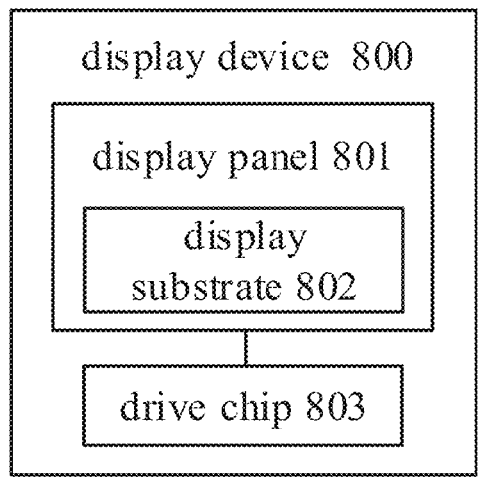
FIG. 8A is a schematic block diagram of a display device provided by some embodiments of the present disclosure.
Figure 8B:
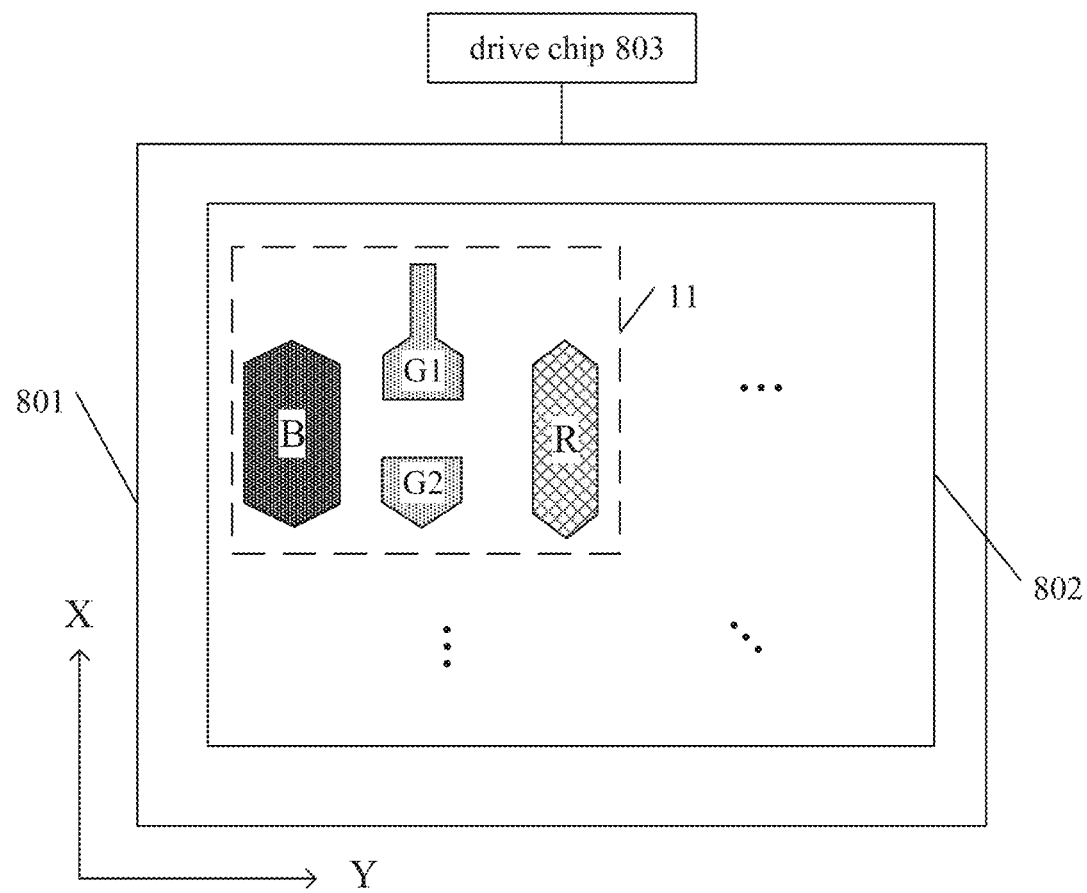
FIG. 8B is a structural schematic diagram of a display device provided by some embodiments of the present disclosure.

The embodiment of the present disclosure also provides a display device, FIG. 8A is a schematic block diagram of a display device provided by some embodiments of the present disclosure, and FIG. 8B is a structural schematic diagram of a display device provided by some embodiments of the present disclosure.

For example, as shown in FIG. 8A, the display device 800 provided by the embodiment of the present disclosure includes a display panel 801, and the display panel 801 includes a display substrate 802, the display panel 801 is the display panel 700 described in any one of the above embodiments, and the display substrate 802 is the display substrate 100 described in any one of the above embodiments.

For example, as shown in FIG. 8A, the display device 800 may further include a drive chip 803, and the drive chip 803 is electrically connected to the display panel 801.

For example, the drive chip 803 is located on a side of the first sub-pixel G1 in each repeating unit 11 away from the second sub-pixel G2. As shown in FIG. 8B, the first sub-pixel G1 and the second sub-pixel G2 in each repeating unit 11 on the display substrate 802 are arranged along the first direction X, in the first direction X, the drive chip 803 is located on a side of the first sub-pixel G1 in each repeating unit 11 away from the second sub-pixel G2. That is, in the first direction X, a distance between the first sub-pixel G1 and the drive chip 803 is smaller than a distance between the second sub-pixel G2 and the drive chip 803. For example, in the example as shown in FIG. 8B, the first sub-pixel G1 is closer to an upper side of the display panel 801 than the second sub-pixel G2, so that the drive chip 803 may be located on the upper side of the display panel 801.

For example, the drive chip 803 may be a semiconductor chip and may include a data driver. The data driver in the drive chip 803 is used to drive a plurality of data lines in the display panel 801. For example, the data driver may provide data signals to the plurality of data lines.

For example, the display device 800 may be any product or component having a display function, such as a mobile phone, a tablet computer, a television, a display, a notebook computer, a digital photo frame, a navigator, etc.

It should be noted that other components of the display device 800 (e.g., a control device, an image data encoding/decoding device, a gate driver, a timing controller, a clock circuit, etc.) should be understood by those of ordinary skill in the art, and are not described in detail herein, nor should they be taken as limitations of the present disclose.

Figure 9:
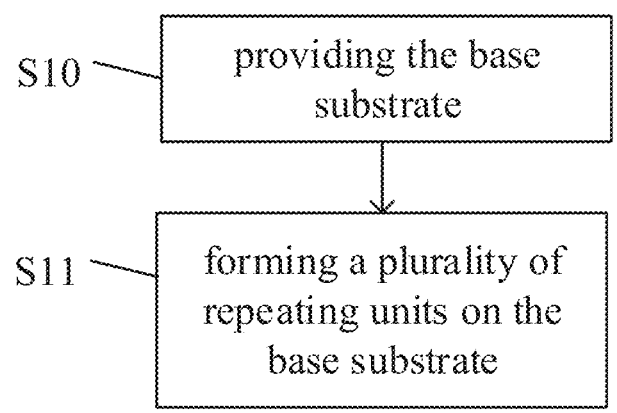
FIG. 9 is a schematic flow chart of a preparation method for preparing a display substrate provided by an embodiment of the present disclosure.

The embodiment of the present disclosure also provides a preparation method for preparing the display substrate according to any one of the above embodiments, and FIG. 9 is a schematic flow chart of a preparation method for preparing the display substrate provided by an embodiment of the present disclosure.

For example, as shown in FIG. 9, the preparation method of the display substrate may include:

S10: providing a base substrate.

S11: forming a plurality of repeating units on the base substrate.

For example, in step S11, each repeating unit includes a plurality of sub-pixels, each sub-pixel includes a pixel circuit and a light-emitting element, the light-emitting element includes a first light-emitting voltage application electrode, a second light-emitting voltage application electrode, and a light-emitting layer between the first light-emitting voltage application electrode and the second light-emitting voltage application electrode, the plurality of sub-pixels include a first sub-pixel and a second sub-pixel, a color of the light emitted by the light-emitting element of the first sub-pixel is identical to a color of the light emitted by the light-emitting element of the second sub-pixel, a shape of the first light-emitting voltage application electrode of the light-emitting element of the first sub-pixel is different from a shape of the first light-emitting voltage application electrode of the light-emitting element of the second sub-pixel, an orthographic projection of the first light-emitting voltage application electrode of the light-emitting element of the first sub-pixel on the base substrate at least partially overlaps with an orthographic projection of the control terminal of the drive circuit of the pixel circuit of the first sub-pixel on the base substrate, and an orthographic projection of the first light-emitting voltage application electrode of the light-emitting element of the second sub-pixel on the base substrate at least partially overlaps with an orthographic projection of the control terminal of the drive circuit of the pixel circuit of the second sub-pixel on the base substrate.

For example, in step S11, in a case where the first light-emitting voltage application electrode of the light-emitting element of the first sub-pixel is formed, a first drive electrode block and an auxiliary electrode block are formed by a single patterning process, and an orthographic projection of the auxiliary electrode block on the base substrate at least partially overlaps with an orthographic projection of the control terminal of the drive circuit of the pixel circuit of the first sub-pixel on the base substrate, for example, the orthographic projection of the control terminal of the drive circuit of the pixel circuit of the first sub-pixel on the base substrate is located within an orthographic projection of the auxiliary electrode block on the base substrate. For example, in the embodiment of the present disclosure, the single patterning process may include photolithography coating, exposure, development, etching, photoresist stripping, and other operations.

It should be noted that in a case where the first light-emitting voltage application electrode includes the first connection electrode block, the first connection electrode block may be formed while the first drive electrode block and the auxiliary electrode block are formed.

For example, in step S11, in a case where the first light-emitting voltage application electrode of the light-emitting element of the second sub-pixel is formed, a second drive electrode block is formed, and an orthographic projection of the second drive electrode block on the base substrate at least partially overlaps with an orthographic projection of the control terminal of the drive circuit of the pixel circuit of the second sub-pixel on the base substrate, for example, the orthographic projection of the control terminal of the drive circuit of the pixel circuit of the second sub-pixel on the base substrate is located within the orthographic projection of the second drive electrode block on the base substrate.

It should be noted that in a case where the second light-emitting voltage application electrode includes the second connection electrode block, the second drive electrode block and the second connection electrode block may be formed by a single patterning process.

It is worth noting that for the detailed description on the repeating unit, reference may be made to the relevant description in the above-mentioned embodiment of the display substrate, and the repetition will not be repeated here.

For the present disclosure, the following points need to be explained:

(1) The drawings of the embodiments of the present disclosure only refer to the structures related to the embodiments of the present disclosure, and other structures may refer to the general design.

(2) For the sake of clarity, in the drawings used to describe embodiments of the present disclosure, the thicknesses and sizes of the layers or structures are exaggerated. It will be understood that in a case where an element, such as a layer, a film, a region, or a substrate, is referred to as being "on" or "under" another element, the element may be "directly" "on" or "under" the other element, or there may be an intermediate element between the element and the another element.

(3) In case of no conflict, the embodiments of the present disclosure and the features in the embodiments can be combined with each other to obtain new embodiments.

What have been described above merely are exemplary embodiments of the present disclosure, and not intended to define the scope of the present disclosure, and the scope of the present disclosure is determined by the appended claims.

What is claimed is:

1. A display substrate, comprising a base substrate, and a plurality of repeating units, an intermediate layer, and a pixel definition layer on the base substrate, wherein each of the plurality of repeating units comprises a plurality of sub-pixels, and each of the plurality of sub-pixels comprises a light-emitting element and a pixel circuit for driving the light-emitting element to emit light;

the light-emitting element comprises a first light-emitting voltage application electrode, a second light-emitting voltage application electrode, and a light-emitting layer between the first light-emitting voltage application electrode and the second light-emitting voltage application electrode;

wherein in a direction perpendicular to a surface of the base substrate, the pixel definition layer is located on a side of the first light-emitting voltage application electrode of the light-emitting element of each of the plurality of sub-pixels away from the base substrate and comprises a plurality of openings;

in the direction perpendicular to the surface of the base substrate, the pixel circuit is located between the intermediate layer and the base substrate, the light-emitting element is located on a side of the intermediate layer away from the base substrate, the intermediate layer comprises a plurality of via holes, and the first light-emitting voltage application electrode of the light-emitting element of each of the plurality of sub-pixels is connected to the pixel circuit of each of the plurality of sub-pixels through a corresponding via hole of the plurality of via holes;

the first light-emitting voltage application electrode of the light-emitting element of each of the plurality of sub-pixels comprises an extension portion extending from an edge of an opening, corresponding to the first light-emitting voltage application electrode of the light-emitting element of each of the plurality of sub-pixels, of the plurality of openings to a via hole, corresponding to the first light-emitting voltage application electrode of the light-emitting element of each of the plurality of sub-pixels, of the plurality of via holes;

the plurality of sub-pixels comprise a first sub-pixel, a second sub-pixel, a third sub-pixel, and a fourth sub-pixel, a color of light emitted by the light-emitting element of the first sub-pixel is identical to a color of light emitted by the light-emitting element of the second sub-pixel, and a shape of the first light-emitting voltage application electrode of the light-emitting element of the first sub-pixel is different from a shape of the first light-emitting voltage application electrode of the light-emitting element of the second sub-pixel;

a shape of the extension portion of the first light-emitting voltage application electrode of the light-emitting element of the first sub-pixel is different from a shape of the extension portion of the first light-emitting voltage application electrode of the light-emitting element of the second sub-pixel, and an area of the extension portion of the first light-emitting voltage application electrode of the light-emitting element of the first sub-pixel is different from an area of the extension portion of the first light-emitting voltage application electrode of the light-emitting element of the second sub-pixel; and an extending direction of the extension portion of the first light-emitting voltage application electrode of the light-emitting element of the first sub-pixel and an extending direction of the extension portion of the first light-emitting voltage application electrode of the light-emitting element of the second sub-pixel both are different from an extending direction of the extension portion of the first light-emitting voltage application electrode of the light-emitting element of the third sub-pixel and an extending direction of the extension portion of the first light-emitting voltage application electrode of the light-emitting element of the fourth sub-pixel.

2. The display substrate according to claim 1, wherein the pixel circuit of each of the plurality of sub-pixels comprises a drive circuit, an orthographic projection of the first light-emitting voltage application electrode of the light-emitting element of the first sub-pixel on the base substrate at least partially overlaps with an orthographic projection of a control terminal of the drive circuit of the pixel circuit of the first sub-pixel on the base substrate; and an orthographic projection of the first light-emitting voltage application electrode of the light-emitting element of the second sub-pixel on the base substrate at least partially overlaps with an orthographic projection of a control terminal of the drive circuit of the pixel circuit of the second sub-pixel on the base substrate.

3. The display substrate according to claim 1, wherein the plurality of openings comprise a first opening corresponding to the first sub-pixel and a second opening corresponding to the second sub-pixel, in the extending direction of the extension portion of the first light-emitting voltage application electrode of the light-emitting element of the first sub-pixel, the first light-emitting voltage application electrode of the light-emitting element of the first sub-pixel comprises a portion, a boundary of which is at least partially roughly parallel to a boundary of the first opening;

in the extending direction of the extension portion of the first light-emitting voltage application electrode of the light-emitting element of the second sub-pixel, the first light-emitting voltage application electrode of the light-emitting element of the second sub-pixel comprises a portion, a boundary of which is at least partially roughly parallel to a boundary of the second opening.

4. The display substrate according to claim 1, wherein an orthographic projection of the first light-emitting voltage application electrode of the light-emitting element of the first sub-pixel in a direction selected from a group consisting of a row direction and a column direction at least partially overlaps with an orthographic projection of the first light-emitting voltage application electrode of the light-emitting element of the third sub-pixel in the direction selected from the group consisting of the row direction and the column direction, and also at least partially overlaps with an orthographic projection of the first light-emitting voltage application electrode of the light-emitting element of the fourth sub-pixel in the direction selected from the group consisting of the row direction and the column direction; and an orthographic projection of the first light-emitting voltage application electrode of the light-emitting element of the second sub-pixel in the direction selected from the group consisting of the row direction and the column direction at least partially overlaps with the orthographic projection of the first light-emitting voltage application electrode of the light-emitting element of the third sub-pixel in the direction selected from the group consisting of the row direction and the column direction, and also at least partially overlaps with the orthographic projection of the first light-emitting voltage application electrode of the light-emitting element of the fourth sub-pixel in the direction selected from the group consisting of the row direction and the column direction.

5. The display substrate according to claim 1, wherein the pixel circuit of each of the plurality of sub-pixels comprises a drive circuit, the pixel circuit of the first sub-pixel further comprises a first parasitic circuit, and the pixel circuit of the second sub-pixel further comprises a second parasitic circuit;

the first parasitic circuit is electrically connected to a control terminal of the drive circuit of the pixel circuit of the first sub-pixel and the first light-emitting voltage application electrode of the light-emitting element of the first sub-pixel, and the first parasitic circuit is configured to control a voltage of the control terminal of the drive circuit of the pixel circuit of the first sub-pixel based on a voltage of the first light-emitting voltage application electrode of the light-emitting element of the first sub-pixel; and the second parasitic circuit is electrically connected to a control terminal of the drive circuit of the pixel circuit of the second sub-pixel and the first light-emitting voltage application electrode of the light-emitting element of the second sub-pixel, and the second parasitic circuit is configured to control a voltage of the control terminal of the drive circuit of the pixel circuit of the second sub-pixel based on a voltage of the first light-emitting voltage application electrode of the light-emitting element of the second sub-pixel.

6. The display substrate according to claim 5, wherein in each repeating unit, the first sub-pixel and the second sub-pixel are arranged in a first direction, the first parasitic circuit comprises a first capacitor, and the first capacitor comprises a first electrode and a second electrode;

the extension portion of the first light-emitting voltage application electrode of the light-emitting element of the first sub-pixel comprises an auxiliary electrode block, and an orthographic projection of the auxiliary electrode block on the base substrate at least partially overlaps with the orthographic projection of the control terminal of the drive circuit of the pixel circuit of the first sub-pixel on the base substrate; and the auxiliary electrode block serves as the first electrode of the first capacitor, and the control terminal of the drive circuit of the first sub-pixel is multiplexed as the second electrode of the first capacitor;

the orthographic projection of the auxiliary electrode block on the base substrate does not overlap with an orthographic projection of the light-emitting layer of the light-emitting element of the first sub-pixel on the base substrate;

the first light-emitting voltage application electrode of the light-emitting element of the first sub-pixel further comprises a first drive electrode block, and the first drive electrode block is electrically connected to the auxiliary electrode block, and an orthographic projection of the first drive electrode block on the base substrate, the orthographic projection of the light-emitting layer of the light-emitting element of the first sub-pixel on the base substrate, and the orthographic projection of the second light-emitting voltage application electrode of the light-emitting element of the first sub-pixel on the base substrate at least partially overlap;

the first direction is parallel to the surface of the base substrate, and in the first direction, the auxiliary electrode block is located on a side of the first drive electrode block away from the light-emitting element of the second sub-pixel.

7. The display substrate according to claim 6, wherein the second parasitic circuit comprises a second capacitor, and the second capacitor comprises a first electrode and a second electrode;

the first light-emitting voltage application electrode of the light-emitting element of the second sub-pixel further comprises a second drive electrode block, and an orthographic projection of the second drive electrode block on the base substrate at least partially overlaps with the orthographic projection of the control terminal of the drive circuit of the pixel circuit of the second sub-pixel on the base substrate;

the orthographic projection of the second drive electrode block on the base substrate, an orthographic projection of the light-emitting layer of the light-emitting element of the second sub-pixel on the base substrate, and an orthographic projection of the second light-emitting voltage application electrode of the light-emitting element of the second sub-pixel on the base substrate at least partially overlap; and the second drive electrode block is multiplexed as the first electrode of the second capacitor, and the control terminal of the drive circuit of the second sub-pixel is multiplexed as the second electrode of the second capacitor.

8. The display substrate according to claim 7, wherein the extension portion of the first light-emitting voltage application electrode of the light-emitting element of the first sub-pixel further comprises a first connection electrode block, in the first direction, the first connection electrode block is located on the side of the first drive electrode block away from the light-emitting element of the second sub-pixel, and the first connection electrode block is located between the auxiliary electrode block and the first drive electrode block, and is electrically connected to both the auxiliary electrode block and the first drive electrode block;

wherein the plurality of via holes comprise a first via hole corresponding to the first light-emitting voltage application electrode of the light-emitting element of the first sub-pixel, and the first connection electrode block extends to the first via hole and is electrically connected to the pixel circuit of the first sub-pixel through the first via hole.

9. The display substrate according to claim 1, wherein the extension portion of the first light-emitting voltage application electrode of the light-emitting element of at least one of the plurality of sub-pixels has a portion that narrows first and then widens in the extending direction thereof.

10. The display substrate according to claim 1, wherein the first light-emitting voltage application electrode of the light-emitting element of the third sub-pixel further comprises a third drive electrode block, and the extension portion of the first light-emitting voltage application electrode of the light-emitting element of the third sub-pixel comprises a third connection electrode block, the third drive electrode block and the third connection electrode block are electrically connected to each other, and the first light-emitting voltage application electrode of the light-emitting element of the fourth sub-pixel further comprises a fourth drive electrode block, and the extension portion of the first light-emitting voltage application electrode of the light-emitting element of the fourth sub-pixel comprises a fourth connection electrode block, the fourth drive electrode block and the fourth connection electrode block are electrically connected to each other; and the plurality of via holes comprise a third via hole corresponding to the first light-emitting voltage application electrode of the light-emitting element of the third sub-pixel and a fourth via hole corresponding to the first light-emitting voltage application electrode of the light-emitting element of the fourth sub-pixel, the third connection electrode block extends to the third via hole and is electrically connected to the pixel circuit of the third sub-pixel through the third via hole, and the fourth connection electrode block extends to the fourth via hole and is electrically connected to the pixel circuit of the fourth sub-pixel through the fourth via hole;

wherein in each repeating unit, the first sub-pixel and the second sub-pixel are arranged in a first direction and the third sub-pixel and the fourth sub-pixel are arranged along a second direction, in each repeating unit, in the first direction, the third connection electrode block is located on a side of the third drive electrode block away from the auxiliary electrode block, and in the second direction, the third connection electrode block is located on a side of the third drive electrode block close to the fourth drive electrode block; and in the first direction, the fourth connection electrode block is located on a side of the fourth drive electrode block away from the auxiliary electrode block, and in the second direction, the fourth connection electrode block is located on a side of the fourth drive electrode block close to the third drive electrode block.

11. The display substrate according to claim 10, wherein the plurality of repeating units are arranged in the second direction to form a plurality of repeating unit groups, and the plurality of repeating unit groups are arranged in the first direction;

in the second direction, the first sub-pixel and the second sub-pixel are located between the third sub-pixel and the fourth sub-pixel, the first direction and the second direction are parallel to the surface of the base substrate, and the first direction is perpendicular to the second direction;

in the first direction, the first connection electrode block, the second connection electrode block, the third connection electrode block, and the fourth connection electrode block are located between two adjacent repeating unit groups; and in the first direction, at least a portion of the auxiliary electrode block is located on a side of the auxiliary electrode block away from the first drive electrode block and is located between two adjacent repeating units in a repeating unit group adjacent to the repeating unit group in which the auxiliary electrode block is located.

12. The display substrate according to claim 1, wherein the pixel circuit of each of the plurality of sub-pixels comprises a drive circuit, drive circuits of the plurality of sub-pixels are arranged in an array on the base substrate;

the extension portion of the first light-emitting voltage application electrode of the light-emitting element of the first sub-pixel comprises an auxiliary electrode block and a first connection electrode block, the first light-emitting voltage application electrode of the light-emitting element of the first sub-pixel further comprises a first drive electrode block, and the first drive electrode block, the auxiliary electrode block, and the first connection electrode block are electrically connected to each other;

the first light-emitting voltage application electrode of the light-emitting element of the second sub-pixel further comprises a second drive electrode block, the extension portion of the first light-emitting voltage application electrode of the light-emitting element of the second sub-pixel comprises a second connection electrode block, and the second drive electrode block is electrically connected to the second connection electrode block;

the auxiliary electrode block is located on a side of a control terminal of the drive circuit of the pixel circuit of the first sub-pixel away from the base substrate; and the second drive electrode block is located on a side of a control terminal of the drive circuit of the pixel circuit of the second sub-pixel away from the base substrate.

13. The display substrate according to claim 12, wherein the control terminal of the drive circuit of the pixel circuit of the first sub-pixel and the control terminal of the drive circuit of the pixel circuit of the second sub-pixel are arranged in a first direction, and in the first direction, the first drive electrode block is located on a side of the control terminal of the drive circuit of the pixel circuit of the first sub-pixel close to the control terminal of the drive circuit of the pixel circuit of the second sub-pixel, and the first connection electrode block is located on a side of the first drive electrode block away from the control terminal of the drive circuit of the pixel circuit of the second sub-pixel;

wherein in the first direction, the second connection electrode block is located on a side of the control terminal of the drive circuit of the pixel circuit of the second sub-pixel away from the control terminal of the drive circuit of the pixel circuit of the first sub-pixel, and the second drive electrode block is located between the second connection electrode block and the first drive electrode block.

14. The display substrate according to claim 12, wherein a distance between a center of the control terminal of the drive circuit of the pixel circuit of the first sub-pixel and a center of the first drive electrode block is greater than a distance between a center of the control terminal of the drive circuit of the pixel circuit of the second sub-pixel and a center of the second drive electrode block.

15. The display substrate according to claim 1, wherein the pixel circuit of each of the plurality of sub-pixels comprises a drive circuit, a second light-emitting control circuit, and a reset circuit, the second light-emitting control circuit is electrically connected to a second light-emitting control signal line, a second terminal of the drive circuit, and the first light-emitting voltage application electrode of the light-emitting element, and is configured to, under control of a second light-emitting control signal provided by the second light-emitting control signal line, turn on or off a connection between the drive circuit and the light-emitting element, the reset circuit is electrically connected to a control terminal of the drive circuit and a first reset control signal line, and is configured to reset the control terminal of the drive circuit under control of a first sub-reset control signal provided by the first reset control signal line, the second light-emitting control signal line and the first reset control signal line are arranged along a first direction, an orthographic projection of the first light-emitting voltage application electrode of the light-emitting element of the first sub-pixel on the base substrate at least partially overlaps with both an orthographic projection of the first reset control signal line connected to the reset circuit of the pixel circuit of the second sub-pixel on the base substrate and an orthographic projection of the second light-emitting control signal line connected to the second light-emitting control circuit of the pixel circuit of the first sub-pixel on the base substrate, and an orthographic projection of the first light-emitting voltage application electrode of the light-emitting element of the second sub-pixel on the base substrate at least partially overlaps with an orthographic projection of the second light-emitting control signal line connected to the second light-emitting control circuit of the pixel circuit of the second sub-pixel on the base substrate.

16. The display substrate according to claim 15, wherein the pixel circuit of each of the plurality of sub-pixels further comprises a data writing circuit, the data writing circuit is electrically connected to a first terminal of the drive circuit and a first scanning signal line, and is configured to write a data signal to the control terminal of the drive circuit under control of a scanning signal provided by the first scanning signal line, in the first direction, the first scanning signal line is located between the second light-emitting control signal line and the first reset control signal line, the first light-emitting voltage application electrode of the light-emitting element of the first sub-pixel and the first light-emitting voltage application electrode of the light-emitting element of the second sub-pixel are arranged along the first direction, and in the first direction, the first scanning signal line connected to the data writing circuit of the pixel circuit of the second sub-pixel is located between the first light-emitting voltage application electrode of the light-emitting element of the first sub-pixel and the first light-emitting voltage application electrode of the light-emitting element of the second sub-pixel.

17. The display substrate according to claim 15, wherein the reset circuit is further electrically connected to a first reset power supply signal line, the reset circuit is configured to reset the control terminal of the drive circuit according to a first reset signal provided by the first reset power supply signal line under control of the first sub-reset control signal provided by the first reset control signal line, in the first direction, the first reset power supply signal line is located on a side of the first reset control signal line away from the second light-emitting control signal line, and the orthographic projection of the first light-emitting voltage application electrode of the light-emitting element of the first sub-pixel on the base substrate further at least partially overlaps with an orthographic projection of the first reset power supply signal line connected to the reset circuit of the pixel circuit of the second sub-pixel on the base substrate;

the first light-emitting voltage application electrode of the light-emitting element of the first sub-pixel further comprises a first drive electrode block, the extension portion of the first light-emitting voltage application electrode of the light-emitting element of the first sub-pixel comprises an auxiliary electrode block and a first connection electrode block, and the first drive electrode block, the auxiliary electrode block, and the first connection electrode block are electrically connected to each other and arranged in the first direction, the first light-emitting voltage application electrode of the light-emitting element of the second sub-pixel further comprises a second drive electrode block, and the extension portion of the first light-emitting voltage application electrode of the light-emitting element of the second sub-pixel comprises a second connection electrode block, and the second drive electrode block and the second connection electrode block are electrically connected and arranged in the first direction, an orthographic projection of the first drive electrode block on the base substrate at least partially overlaps with the orthographic projection of the first reset control signal line connected to the reset circuit of the pixel circuit of the second sub-pixel on the base substrate and the orthographic projection of the first reset power supply signal line connected to the reset circuit of the pixel circuit of the second sub-pixel on the base substrate, an orthographic projection of the first connection electrode block on the base substrate at least partially overlaps with the orthographic projection of the second light-emitting control signal line connected to the second light-emitting control circuit of the pixel circuit of the first sub-pixel on the base substrate, in the first direction, the auxiliary electrode block is located on a side of the second light-emitting control signal line connected to the second light-emitting control circuit of the pixel circuit of the first sub-pixel away from the first light-emitting voltage application electrode of the light-emitting element of the second sub-pixel, an orthographic projection of the second connection electrode block on the base substrate at least partially overlaps with the orthographic projection of the second light-emitting control signal line connected to the second light-emitting control circuit of the pixel circuit of the second sub-pixel on the base substrate, and in the first direction, the second drive electrode block is located between the second light-emitting control signal line connected to the second light-emitting control circuit of the pixel circuit of the second sub-pixel and the first scanning signal line connected to the data writing circuit of the pixel circuit of the second sub-pixel.

18. The display substrate according to claim 1, wherein the first light-emitting voltage application electrode of the light-emitting element of the first sub-pixel further comprises a first drive electrode block, the plurality of via holes comprise a first via hole corresponding to the first light-emitting voltage application electrode of the light-emitting element of the first sub-pixel, the first light-emitting voltage application electrode of the light-emitting element of the second sub-pixel further comprises a second drive electrode block, the plurality of via holes comprise a second via hole corresponding to the first light-emitting voltage application electrode of the light-emitting element of the second sub-pixel, on a surface parallel to the surface of the base substrate, a first straight line passes through the first drive electrode block, the extension portion of the first light-emitting voltage application electrode of the light-emitting element of the first sub-pixel, and the first via hole, and is parallel to a row direction or a column direction, and a second straight line passes through the second drive electrode block, the extension portion of the first light-emitting voltage application electrode of the light-emitting element of the second sub-pixel, and the second via hole, and is parallel to the row direction or the column direction;

the first straight line and the second straight line are parallel or overlap with each other.

19. The display substrate according to claim 1, wherein a farthest side of the extension portion of the first light-emitting voltage application electrode of the light-emitting element of each of the plurality of sub-pixels away from the opening, corresponding to the first light-emitting voltage application electrode of the light-emitting element of each of the plurality of sub-pixels, is a farthest side of the first light-emitting voltage application electrode of the light-emitting element of each of the plurality of sub-pixels away from a center of the opening, corresponding to the first light-emitting voltage application electrode of the light-emitting element of each of the plurality of sub-pixels.

20. A display panel, comprising the display substrate according to claim 1.

* * * * *